US011431106B2

(12) United States Patent
Misaki

(10) Patent No.: US 11,431,106 B2
(45) Date of Patent: Aug. 30, 2022

(54) TFT SUBSTRATE, METHOD FOR MANUFACTURING TFT SUBSTRATE, AND SCANNED ANTENNA

(71) Applicant: SHARP KABUSHIKI KAISHA, Sakai (JP)

(72) Inventor: Katsunori Misaki, Yonago (JP)

(73) Assignee: SHARP KABUSHIKI KAISHA, Sakai (JP)

(*) Notice: Subject to any disclaimer, the term of this patent is extended or adjusted under 35 U.S.C. 154(b) by 226 days.

(21) Appl. No.: 16/891,504

(22) Filed: Jun. 3, 2020

(65) Prior Publication Data

US 2020/0388934 A1 Dec. 10, 2020

Related U.S. Application Data

(60) Provisional application No. 62/856,899, filed on Jun. 4, 2019.

(51) Int. Cl.

*H01Q 21/06* (2006.01)
*H01L 27/12* (2006.01)
*H01L 29/786* (2006.01)

(52) U.S. Cl.

CPC ......... *H01Q 21/064* (2013.01); *H01L 27/124* (2013.01); *H01L 27/1255* (2013.01); *H01L 27/1259* (2013.01); *H01L 29/786* (2013.01)

(58) Field of Classification Search

None

See application file for complete search history.

(56) References Cited

U.S. PATENT DOCUMENTS 7,466,269 B2 12/2008 Haziza
7,847,894 B2 12/2010 Rho
2012/0092577 A1 4/2012 Shi et al.

(Continued)

FOREIGN PATENT DOCUMENTS

JP 2002-217640 A 8/2002
JP 2007-116573 A 5/2007

(Continued)

OTHER PUBLICATIONS

R. A. Stevenson et al., "Rethinking Wireless Communications: Advanced Antenna Design using LCD Technology", SID 2015 DIGEST, pp. 827-830.

(Continued)

*Primary Examiner* — Bo B Jang
(74) *Attorney, Agent, or Firm* — ScienBiziP, P.C.

(57) ABSTRACT

A TFT substrate includes a transmission and/or reception region including a plurality of antenna unit regions, and a non-transmission and/or reception region other than the transmission and/or reception region. The TFT substrate includes a dielectric substrate, and the plurality of antenna unit regions, a plurality of gate bus lines, and a plurality of source bus lines supported on the dielectric substrate. Each of the antenna unit regions includes a TFT and a patch electrode electrically connected to a drain electrode of the TFT. The TFT substrate further includes a first conductive layer including one of a gate electrode or a source electrode of the TFT, a first insulating layer on the first conductive layer, and a plurality of terminal sections provided in the non-transmission and/or reception region.

16 Claims, 46 Drawing Sheets

(56) References Cited

U.S. PATENT DOCUMENTS

| | | | | |
|---|---|---|---|---|
| 2012/0138922 | A1 | 6/2012 | Yamazaki et al. | |
| 2012/0194399 | A1 | 8/2012 | Bily et al. | |
| 2013/0320334 | A1 | 12/2013 | Yamazaki et al. | |
| 2014/0286076 | A1 | 9/2014 | Aoki et al. | |
| 2018/0337446 | A1 | 11/2018 | Nakazawa et al. | |
| 2019/0265527 | A1* | 8/2019 | Misaki | G02F 1/1368 |
| 2019/0288381 | A1* | 9/2019 | Misaki | H01Q 1/24 |
| 2019/0296444 | A1 | 9/2019 | Misaki | |
| 2019/0341691 | A1* | 11/2019 | Misaki | H01L 29/786 |

FOREIGN PATENT DOCUMENTS

| | | | |
|---|---|---|---|
| JP | 2007-295044 | A | 11/2007 |
| JP | 2009-538565 | A | 11/2009 |
| JP | 2010-210713 | A | 9/2010 |
| JP | 2012-134475 | A | 7/2012 |
| JP | 2013-539949 | A | 10/2013 |
| JP | 2014-007399 | A | 1/2014 |
| JP | 2014-209727 | A | 11/2014 |
| WO | 2007/139736 | A2 | 12/2007 |
| WO | 2012/050614 | A1 | 4/2012 |
| WO | 2014/149341 | A1 | 9/2014 |
| WO | 2015/126550 | A1 | 8/2015 |
| WO | 2015/126578 | A1 | 8/2015 |
| WO | 2016/057539 | A1 | 4/2016 |
| WO | 2016/130383 | A1 | 8/2016 |
| WO | 2016/141340 | A1 | 9/2016 |
| WO | 2016/141342 | A1 | 9/2016 |
| WO | 2017/061527 | A1 | 4/2017 |
| WO | 2017/199777 | A1 | 11/2017 |

OTHER PUBLICATIONS

M. Ando et al., "A Radial Line Slot Antenna for 12GHz Satellite TV Reception", IEEE Transactions of Antennas and Propagation, vol. AP-33, No. 12, pp. 1347-1353 (1985).

M. Wittek et al., "Liquid Crystals for Smart Antennas and Other Microwave Applications", SID 2015 DIGESTpp. 824-826.

Kuki, "New Functional Element Using Liquid Crystal" Polymer, vol. 55, August issue, pp. 599-602 (2006) (A concise explanation of the relevance can be found in paragraph [0088] of the specification of the subject application).

Co-pending letter regarding a related co-pending U.S. Appl. No. 15/542,488, filed Jul. 10, 2017.

* cited by examiner

U
101D
17
11
4
1
A
A'
15(15I)
15a(15I)
7C(S1) 7C(S2)
6D
7D(S1) 7D(S2)
11a
10
6S
5
7S(S2)
7S(S1)
3G(3)
3C(3)

PT
101D
17
11
4
1
B
B'
19p1(19)
17p1
15p1(15I)
13p1(13)
11p1
4p1
CH_p1
3p1(3)

SG
101D
17
11
4
1
C
C'
CH_sg1(4sg1)
3sg(3)
7sg(S1)
7sg(S2)

ST
101D
17
11
4
1
D
D'
19sA(19)
17s
11s
CH_s
7sA(S2) 7sA(S1)

TFT SUBSTRATE, METHOD FOR MANUFACTURING TFT SUBSTRATE, AND SCANNED ANTENNA

CROSS-REFERENCE TO RELATED APPLICATIONS

This application claims the benefit of priority to U.S. Provisional Application No. 62/856,899 filed on Jun. 4, 2019. The entire contents of the above-identified application are hereby incorporated by reference.

BACKGROUND

Technical Field

The disclosure relates to a scanning antenna, and more particularly relates to a scanning antenna in which an antenna unit (also referred to as an "element antenna") includes a liquid crystal capacitance (also referred to as a "liquid crystal array antenna"), and a method for manufacturing such a scanning antenna.

Antennas for mobile communication and satellite broadcasting require functions that can change the beam direction (referred to as "beam scanning" or "beam steering"). As an example of an antenna (hereinafter referred to as a "scanning antenna" (scanned antenna) having such functionality, phased array antennas equipped with antenna units are known. However, known phased array antennas are expensive, which is an obstacle for popularization as a consumer product. In particular, as the number of antenna units increases, the cost rises considerably.

Therefore, scanning antennas that utilize the high dielectric anisotropy (birefringence index) of liquid crystal materials (including nematic liquid crystals and polymer dispersed liquid crystals) have been proposed (JP 2007-116573 A, JP 2007-295044 A, JP 2009-538565 A, JP 2013-539949 A, and WO 2015/126550 and R. A. Stevenson et al., "Rethinking Wireless Communications: Advanced Antenna Design using LCD Technology", SID 2015 DIGEST, pp. 827-830). Since the dielectric constant of liquid crystal materials has a frequency dispersion, in the present specification, the dielectric constant in a frequency band with respect to microwaves (also referred to as the "dielectric constant with respect to microwaves") is particularly denoted as "dielectric constant M ($\varepsilon_M$)".

JP 2009-538565 A and R. A. Stevenson et al., "Rethinking Wireless Communications: Advanced Antenna Design using LCD Technology", SID 2015 DIGEST, pp. 827-830 describe how an inexpensive scanning antenna can be obtained by using liquid crystal display (hereinafter referred to as "LCD") device technology.

The present inventors have developed a scanning antenna which can be mass-manufactured by utilizing known manufacturing techniques of LCDs. WO 2017/061527 and WO 2017/199777 by the present inventors disclose a scanning antenna which can be mass-manufactured by utilizing the known manufacturing techniques of LCDs, a TFT substrate used for such a scanning antenna, and a manufacturing method and a driving method of such a scanning antenna. For reference, the entire contents of the disclosures of WO 2017/061527 and WO 2017/199777 are incorporated herein.

SUMMARY

In the course of studying various structures in order to further improve antenna performance and mass productivity of the scanning antennas described in WO 2017/061527 and WO 2017/199777, reliability of the prototyped scanning antennas has not been sufficient in some cases. Details will be described below.

An object of the disclosure is to provide a TFT substrate capable of further improving reliability of the scanning antennas described in WO 2017/061527 and WO 2017/199777, a method for manufacturing a TFT substrate, and a scanning antenna including such a TFT substrate.

According to the embodiments of the disclosure, there are provided solutions according to the following items.

Item 1

A TFT substrate including a transmission/reception region and a non-transmission and/or reception region other than the transmission and/or reception region, the transmission/reception region including a plurality of antenna unit regions, the TFT substrate including:

a dielectric substrate;

the plurality of antenna unit regions, a plurality of gate bus lines, and a plurality of source bus lines supported on the dielectric substrate, each of the plurality of antenna unit regions including a TFT and a patch electrode electrically connected to a drain electrode of the TFT;

a first conductive layer including one of a gate electrode or a source electrode of the TFT;

a first insulating layer on the first conductive layer; and a plurality of terminal sections provided in the non-transmission and/or reception region, each of the plurality of terminal sections including a lower connection section electrically connected to any of the plurality of gate bus lines and the plurality of source bus lines, the lower connection section being included in the first conductive layer, and a wiring line section extending from the lower connection section and at least reaching an edge of the dielectric substrate when viewed from a normal direction of the dielectric substrate, wherein the first conductive layer includes a lower conductive layer containing at least one selected from the group consisting of Ti, Ta, W, MoNb, Nb, Ni, In—Sn—O based oxide, In—Zn—O based oxide, and In—Ga—Zn—O based oxide, and an upper conductive layer disposed on the lower conductive layer and containing at least one element selected from the group consisting of Cu, Al, Ag and Au, the wiring line section includes a first region including a first edge side conforming to the edge of the dielectric substrate when viewed from the normal direction of the dielectric substrate, the first region including the lower conductive layer and not including the upper conductive layer, and the first insulating layer includes a first notched portion overlapping at least a portion of the first region when viewed from the normal direction of the dielectric substrate.

Item 2

The TFT substrate according to item 1, wherein each of the plurality of terminal sections further includes a second insulating layer on the first insulating layer, and the second insulating layer includes a second notched portion overlapping the first notched portion when viewed from the normal direction of the dielectric substrate.

Item 3

The TFT substrate according to item 1, wherein each of the plurality of terminal sections further includes a second insulating layer on the first insulating layer, and the second insulating layer is formed to cover the lower conductive layer exposed from the first insulating layer within the first notched portion.

Item 4

The TFT substrate according to item 2, wherein each of the plurality of terminal sections further includes a third insulating layer on the second insulating layer, and the third insulating layer includes a third notched portion overlapping the second notched portion when viewed from the normal direction of the dielectric substrate.

Item 5

The TFT substrate according to any one of items 2 to 4, further including:

a second conductive layer formed between the first insulating layer and the second insulating layer, the second conductive layer including the other of the gate electrode or the source electrode of the TFT; and a third conductive layer formed on the second insulating layer, the third conductive layer including the patch electrode.

Item 6

The TFT substrate according to item 5, further including:

a fourth conductive layer formed between the second insulating layer and the third insulating layer, the fourth conductive layer including a transparent conductive layer.

Item 7

The TFT substrate according to item 5 or 6, wherein the upper conductive layer is formed of a material the same as the second conductive layer or the third conductive layer.

Item 8

The TFT substrate according to any one of items 1 to 7, wherein the plurality of terminal sections includes a gate terminal section and a source terminal section, the gate terminal section including the lower connection section electrically connected to any of the plurality of gate bus lines, the source terminal section including the lower connection section electrically connected to any of the plurality of source bus lines, and the first conductive layer includes the lower connection section of the gate terminal section and the lower connection section of the source terminal section.

Item 9

The TFT substrate according to any one of items 1 to 8, wherein the first conductive layer includes the source electrode of the TFT.

Item 10

A manufacturing method of a TFT substrate, the TFT substrate according to any one of items 1 to 9, the manufacturing method including:

a step A of forming a lower conductive film on a mother dielectric substrate, the lower conductive film containing at least one selected from the group consisting of Ti, Ta, N, MoNb, Nb, Ni, In—Sn—O based oxide, In—Zn—O based oxide, and In—Ga—Zn—O based oxide;

a step B of, after the step A, forming an upper conductive film on the lower conductive film, the upper conductive film containing at least one element selected from the group consisting of Cu, Al, Ag, and Au;

a step C of, after the step B, patterning the lower conductive film and the upper conductive film to form the lower connection sections each of which is included in each of the plurality of terminal sections, a short circuit line electrically connecting the lower connection sections to each other, and a wiring formed between the lower connection sections and the short circuit wiring line;

a step D of, after the step C, forming a first insulating film to cover at least all of the lower connection sections and a portion of the wiring;

a step E of, after the step D, forming a first opening in the first insulating film, the first opening at least reaching the wiring;

a step F of, after the step E, forming a second conductive film on the first insulating film and within the first opening;

a step G of, after the step F, patterning the second conductive film and the upper conductive film to remove the upper conductive film exposed from the first insulating film within the first opening; and a step H of, after the step G, cutting the mother dielectric substrate along a line passing through the first opening when viewed from a normal direction of the mother dielectric substrate.

Item 11

The manufacturing method according to item 10, wherein the step G includes a step of patterning the second conductive film and upper conductive film using the same photomask.

Item 12

The manufacturing method according to item 10 or 11, wherein the step G includes a step of patterning the second conductive film to form the other of the gate electrode or the source electrode of the TFT.

Item 13

The manufacturing method according to any one of items 10 to 12, wherein the step G includes a step of patterning the second conductive film to form the patch electrode.

Item 14

The manufacturing method according to any one of items 10 to 13, wherein each of the plurality of terminal sections includes a second opening formed in the first insulating layer and at least reaching the lower connection section, an upper connection section formed on the first insulating layer and within the second opening, the upper connection section being electrically connected to the lower connection section, and the step G includes a step of patterning the second conductive film to form the upper connection section.

Item 15

The manufacturing method according to item 10 depending on item 6, wherein the step G includes a step of patterning the second conductive film to form the fourth conductive layer.

Item 16

A scanning antenna including:

the TFT substrate according to any one of items 1 to 9;

a slot substrate disposed to face the TFT substrate;

a liquid crystal layer provided between the TFT substrate and the slot substrate; and a reflective conductive plate disposed to face a surface of the slot substrate on a side opposite to the liquid crystal layer with a dielectric layer interposed between the reflective conductive plate and the surface, wherein the slot substrate includes another dielectric substrate and a slot electrode formed on a surface of the another dielectric substrate on a side of the liquid crystal layer, and the slot electrode includes a plurality of slots, each of the plurality of slots being arranged corresponding to the patch electrode of each of the plurality of antenna unit regions of the TFT substrate.

According to an embodiment of the disclosure, it is possible to provide a TFT substrate with improved reliability, a method for manufacturing a TFT substrate, and a scanning antenna including such a TFT substrate.

BRIEF DESCRIPTION OF DRAWINGS

The disclosure will be described with reference to the accompanying drawings, wherein like numbers reference like elements.

DESCRIPTION OF EMBODIMENTS

Figure 1:
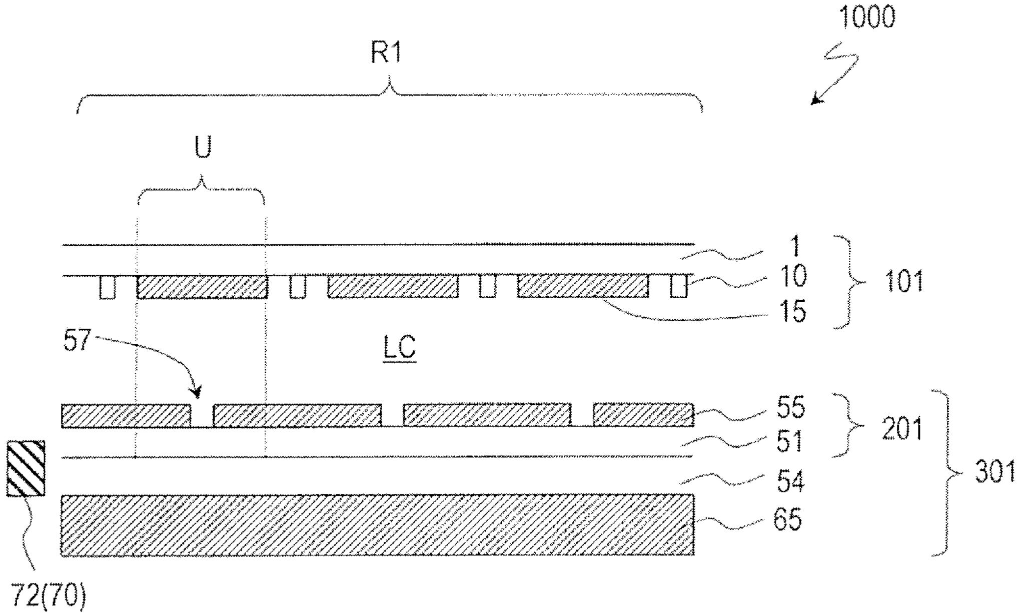
FIG. 1 is a cross-sectional view schematically illustrating a portion of a scanning antenna 1000 described in WO 2017/061527.

Hereinafter, a scanning antenna, a method for manufacturing the scanning antenna, and a TFT substrate used for the scanning antenna according to embodiments of the disclosure will be described with reference to the drawings. Note that the disclosure is not limited to the embodiments illustrated below. The embodiments of the disclosure are not limited to the drawings. For example, a thickness of a layer in a cross-sectional view, sizes of a conductive portion and an opening in a plan view, and the like are exemplary. In the cross-sectional view, for simplicity, an inorganic insulating layer (for example, a gate insulating layer 4, a first insulating layer 11, and a second insulating layer 17) may be represented as a flattened layer, but in general, a layer formed by a thin film deposition method (for example, CVD, sputtering, or vacuum vapor deposition technique) has a surface that reflects steps of an underlayer.

Basic Structure of Scanning Antenna

By controlling the voltage applied to each liquid crystal layer of each antenna unit corresponding to the pixels of the LCD panel and changing the effective dielectric constant M ($\varepsilon_M$) of the liquid crystal layer for each antenna unit, a scanning antenna equipped with an antenna unit that uses the anisotropy (birefringence index) of a large dielectric constant M ($\varepsilon_M$) of a liquid crystal material forms a two-dimensional pattern by antenna units with different electrostatic capacitances (corresponding to displaying of an image by an LCD). An electromagnetic wave (for example, a microwave) emitted from an antenna or received by an antenna is given a phase difference depending on the electrostatic capacitance of each antenna unit and gains a strong directivity in a particular direction depending on the two-dimensional pattern formed by the antenna units having different electrostatic capacitances (beam scanning). For example, an electromagnetic wave emitted from an antenna is obtained by integrating, with consideration for the phase difference provided by each antenna unit, spherical waves obtained as a result of input electromagnetic waves entering each antenna unit and being scattered by each antenna unit. It can be considered that each antenna unit functions as a "phase shifter." For a description of the basic structure and operating principles of a scanning antenna that uses a liquid crystal material, refer to JP 2007-116573 A, JP 2007-295044 A, JP 2009-538565 A, and JP 2013-539949 A as well as R. A. Stevenson et al., "Rethinking Wireless Communications: Advanced Antenna Design using LCD Technology", SID 2015 DIGEST, pp. 827-830 and M. ANDO et al., "A Radial Line Slot Antenna for 12 GHz Satellite TV Reception", IEEE Transactions of Antennas and Propagation, Vol. AP-33, No. 12, pp. 1347-1353 (1985). M. ANDO et al., "A Radial Line Slot Antenna for 12 GHz Satellite TV Reception", IEEE Transactions of Antennas and Propagation, Vol. AP-33, No. 12, pp. 1347-1353 (1985) discloses the basic structure of a scanning antenna in which spiral slots are arranged. For reference, the entire contents of the disclosures of JP 2007-116573 A, JP 2007-295044 A, JP 2009-538565 A, and JP 2013-539949 A as well as R. A. Stevenson et al., "Rethinking Wireless Communications: Advanced Antenna Design using LCD Technology", SID 2015 DIGEST, pp. 827-830 and M. ANDO et al., "A Radial Line Slot Antenna for 12 GHz Satellite TV Reception", IEEE Transactions of Antennas and Propagation, Vol. AP-33, No. 12, pp. 1347-1353 (1985) are incorporated herein.

Note that although the antenna units in the scanning antenna are similar to pixels in an LCD panel, the structure of the antenna units is different from the structure of pixels in an LCD panel, and the arrangement of the plurality of antenna units is also different from the arrangement of pixels in an LCD panel. A basic structure of the scanning antenna will be described with reference to FIG. 1, which illustrates a scanning antenna 1000 described in WO 2017/061527. The scanning antenna 1000 is a radial in-line slot antenna in which slots are concentrically arranged. However, the scanning antenna according to embodiments of the disclosure is not limited thereto. For example, the slots may be arranged in any known arrangement. In particular, with respect to the slot and/or antenna unit arrangements, the entire disclosure of WO 2015/126550 is incorporated herein by reference.

FIG. 1 is a cross-sectional view schematically illustrating a portion of the scanning antenna 1000, and schematically illustrates a part of the cross section along the radial direction from a power feed pin 72 (refer to FIG. 2B) provided at or near the center of the concentrically arranged slots.

The scanning antenna 1000 includes a TFT substrate 101, a slot substrate 201, a liquid crystal layer LC provided therebetween, and a reflective conductive plate 65 opposing the slot substrate 201 with an air layer 54 interposed between the slot substrate 201 and the reflective conductive plate 65. The scanning antenna 1000 transmits and/or receives microwaves to and/or from a side closer to the TFT substrate 101.

The TFT substrate 101 includes a dielectric substrate 1 such as a glass substrate, a plurality of patch electrodes 15 and a plurality of TFTs 10 formed on the dielectric substrate 1. Each patch electrode 15 is connected to a corresponding TFT 10. Each TFT 10 is connected to a gate bus line and a source bus line.

The slot substrate 201 includes a dielectric substrate 51 such as a glass substrate and a slot electrode 55 formed on a side of the dielectric substrate 51 closer to the liquid crystal layer LC. The slot electrode 55 includes a plurality of slots 57.

The reflective conductive plate 65 is disposed opposing the slot substrate 201 with the air layer 54 interposed between the reflective conductive plate 65 and the slot substrate 201. In place of the air layer 54, a layer formed of a dielectric (e.g., a fluorine resin such as PTFE) having a small dielectric constant M for microwaves can be used. The slot electrode 55, the reflective conductive plate 65, and the dielectric substrate 51 and the air layer 54 therebetween function as a waveguide 301.

The patch electrode 15, the portion of the slot electrode 55 including the slot 57, and the liquid crystal layer LC therebetween constitute an antenna unit U. In each antenna unit U, one patch electrode 15 opposes a portion of the slot electrode 55 including one slot 57 with the liquid crystal layer LC interposed therebetween, thereby constituting liquid crystal capacitance. The structure in which the patch electrode 15 and the slot electrode 55 oppose each other with the liquid crystal layer LC interposed therebetween is similar to the structure in which the pixel electrode and the counter electrode in an LCD panel oppose each other with the liquid crystal layer interposed therebetween. That is, the antenna unit U of the scanning antenna 1000 and the pixel in an LCD panel have a similar configuration. The antenna unit has a configuration similar to that of the pixel in an LCD panel in that the antenna unit has an auxiliary capacitance electrically connected in parallel with the liquid crystal capacitance. However, the scanning antenna 1000 has many differences from the LCD panel. First, the performance required for the dielectric substrates 1 and 51 of the scanning antenna 1000 is different from the performance required for the substrate of the LCD panel.

Generally, transparent substrates that are transparent to visible light are used for LCD panels. For example, glass substrates or plastic substrates are used. In reflective LCD panels, since the substrate on the back side does not need transparency, a semiconductor substrate may be used in some cases. In contrast to this, it is preferable for the dielectric substrates 1 and 51 used for the antennas to have small dielectric losses with respect to microwaves (where the dielectric tangent with respect to microwaves is denoted as tan $\delta_M$). The tan $\delta_M$ of each of the dielectric substrates 1 and 51 is preferably approximately less than or equal to 0.03, and more preferably less than or equal to 0.01. Specifically, a glass substrate or a plastic substrate can be used. Glass substrates are superior to plastic substrates with respect to dimensional stability and heat resistance, and are suitable for forming circuit elements such as TFTs, a wiring line, and electrodes using LCD technology. For example, in a case where the materials forming the waveguide are air and glass, as the dielectric loss of glass is greater, from the viewpoint that thinner glass can reduce the waveguide loss, it is preferable for the thickness to be less than or equal to 400 μm, and more preferably less than or equal to 300 μm. There is no particular lower limit, provided that the glass can be handled such that it does not break in the manufacturing process.

The conductive material used for the electrode is also different. In many cases, an ITO film is used as a transparent conductive film for pixel electrodes and counter electrodes of LCD panels. However, ITO has a large tan $\delta_M$ with respect to microwaves, and as such cannot be used as the conductive layer in an antenna. The slot electrode 55 functions as a wall for the waveguide 301 together with the reflective conductive plate 65. Accordingly, to suppress the transmission of microwaves in the wall of the waveguide 301, it is preferable that the thickness of the wall of the waveguide 301, that is, the thickness of the metal layer (Cu layer or Al layer) be large. It is known that in a case where the thickness of the metal layer is three times the skin depth, electromagnetic waves are attenuated to 1/20 (−26 dB), and in a case where the thickness is five times the skin depth, electromagnetic waves are attenuated to about 1/150 (−43 dB). Accordingly, in a case where the thickness of the metal layer is five times the skin depth, the transmittance of electromagnetic waves can be reduced to 1%. For example, for a microwave of 10 GHz, in a case where a Cu layer having a thickness of greater than or equal to 3.3 μm and an Al layer having a thickness of greater than or equal to 4.0 μm are used, microwaves can be reduced to 1/150. In addition, for a microwave of 30 GHz, in a case where a Cu layer having a thickness of greater than or equal to 1.9 μm and an Al layer having a thickness of greater than or equal to 2.3 μm are used, microwaves can be reduced to 1/150. In this way, the slot electrode 55 is preferably formed of a relatively thick Cu layer or Al layer. There is no particular upper limit for the thickness of the Cu layer or the Al layer, and the thicknesses can be set appropriately in consideration of the time and cost of film formation. The usage of a Cu layer provides the advantage of being thinner than the case of using an Al layer. Relatively thick Cu layers or Al layers can be formed not only by the thin film deposition method used in LCD manufacturing processes, but also by other methods such as bonding Cu foil or Al foil to the substrate. The thickness of the metal layer, for example, ranges from 2 μm to 30 μm. In a case where the thin film deposition methods are used, the thickness of the metal layer is preferably less than or equal to 5 μm. Note that aluminum plates, copper plates, or the like having a thickness of several mm can be used as the reflective conductive plate 65, for example.

Since the patch electrode 15 does not configure the waveguide 301 like the slot electrode 55, a Cu layer or an Al layer can be used that has a smaller thickness than that of the slot electrode 55. However, to avoid losses caused by heat when the oscillation of free electrons near the slot 57 of the slot electrode 55 induces the oscillation of the free electrons in the patch electrode 15, it is preferable that the resistance be low. From the viewpoint of mass manufacture, it is preferable to use an Al layer rather than a Cu layer, and the thickness of the Al layer is preferably greater than or equal to 0.3 μm and less than or equal to 2 μm, for example.

The arrangement pitch of the antenna units U is considerably different from that of the pixel pitch. For example, considering an antenna for microwaves of 12 GHz (Ku band), the wavelength λ is 25 mm, for example. Then, as described in JP 2013-539949 A, since the pitch of the antenna unit U is less than or equal to λ/4 and/or less than or equal to λ/5, the pitch becomes less than or equal to 6.25 mm and/or less than or equal to 5 mm. This is ten times greater than the pitch of pixels in an LCD panel. Accordingly, the length and width of the antenna unit U are also roughly ten times greater than the pixel length and width of the LCD panel.

Of course, the array of the antenna units U may be different from the array of the pixels in the LCD panel. Herein, although an example is illustrated in which the antenna units U are arrayed in concentric circles (for example, refer to JP 2002-217640 A), the present disclosure is not limited thereto, and the antenna units may be arrayed in a spiral shape as described in M. ANDO et al., "A Radial Line Slot Antenna for 12 GHz Satellite TV Reception", IEEE Transactions of Antennas and Propagation, Vol. AP-33, No. 12, pp. 1347-1353 (1985), for example. Furthermore, the antenna units may be arrayed in a matrix as described in JP 2013-539949 A.

The properties required for the liquid crystal material of the liquid crystal layer LC of the scanning antenna 1000 are different from the properties required for the liquid crystal material of the LCD panel. In the LCD panel, a change in refractive index of the liquid crystal layer of the pixels allows a phase difference to be provided to the polarized visible light (wavelength from 380 nm to 830 nm) such that the polarization state is changed (for example, allowing the polarization axis direction of linearly polarized light to be rotated or the degree of circular polarization of circularly polarized light to be changed), whereby display is performed. In contrast, in the scanning antenna 1000, the phase of the microwave excited (re-radiated) from each patch electrode is changed by changing the electrostatic capacitance value of the liquid crystal capacitance of the antenna unit U. Accordingly, the liquid crystal layer preferably has a large anisotropy ($\Delta\varepsilon_M$) of the dielectric constant M ($\varepsilon_M$) with respect to microwaves, and tan $\delta_M$ is preferably small. For example, the $\Delta\varepsilon_M$ of greater than or equal to 4 and tan $\delta_M$ of less than or equal to 0.02 (values of 19 GHz in both cases) described in SID 2015 DIGEST pp. 824-826 written by M. Witteck et al, can be suitably used. In addition, a liquid crystal material having a ΔεM of 0.4 or greater and a tan IM of 0.04 or less as described by Kuki in the August issue of Kobunshi, Vol. 55, pp. 599-602 (2006) can be used.

In general, the dielectric constant of a liquid crystal material has a frequency dispersion, but the dielectric anisotropy $\Delta\varepsilon_M$ with respect to microwaves has a positive correlation with the refractive index anisotropy Δn with respect to visible light. Accordingly, it can be said that a material having a large refractive index anisotropy $\Delta_n$ with respect to visible light is preferable as a liquid crystal material for an antenna unit for microwaves. The refractive index anisotropy $\Delta_n$ of the liquid crystal material for LCDs is evaluated by the refractive index anisotropy for light having a wavelength of 550 nm. Here again, when $\Delta_n$ (birefringence index) is used as an index for light having a wavelength of 550 nm, a nematic liquid crystal having a $\Delta_n$ of greater than or equal to 0.3, preferably greater than or equal to 0.4, can be used for an antenna unit for microwaves. The value $\Delta_n$ has no particular upper limit. However, since liquid crystal materials having a large Δn tend to have a strong polarity, there is a possibility that reliability may decrease. The thickness of the liquid crystal layer is, for example, from 1 μm to 500 μm.

Hereinafter, the structure of the scanning antenna will be described in more detail.

Figure 2A:
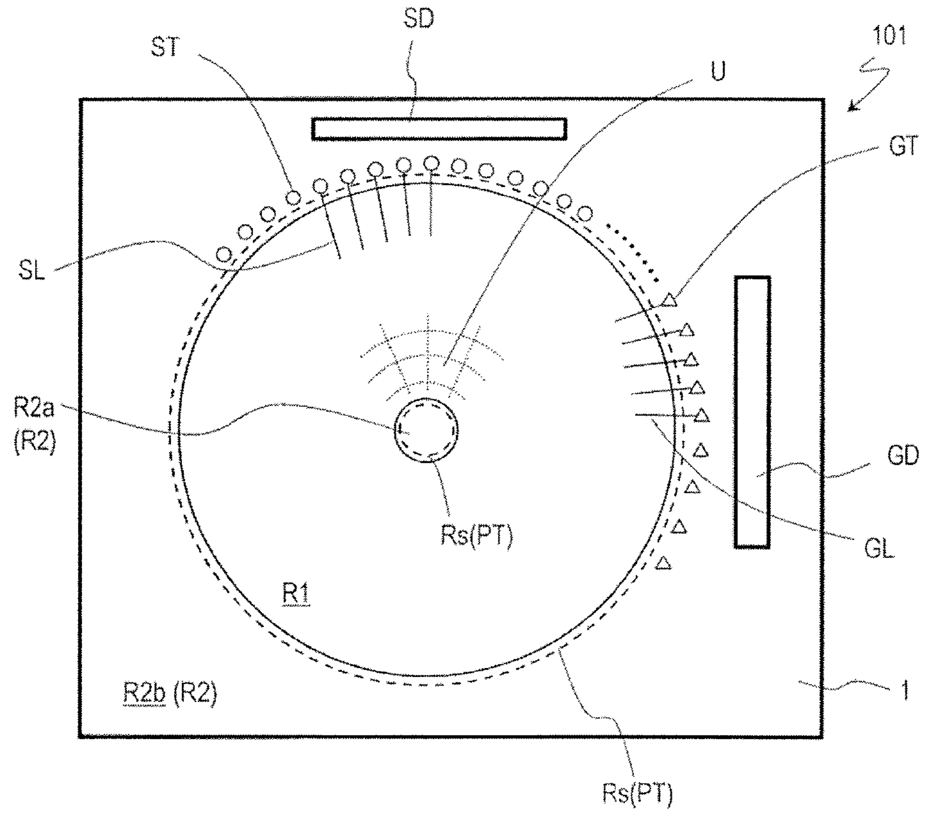
FIGS. 2A and 2B are schematic plan views illustrating a TFT substrate 101 and a slot substrate 201 included in the scanning antenna 1000, respectively.
Figure 2B:
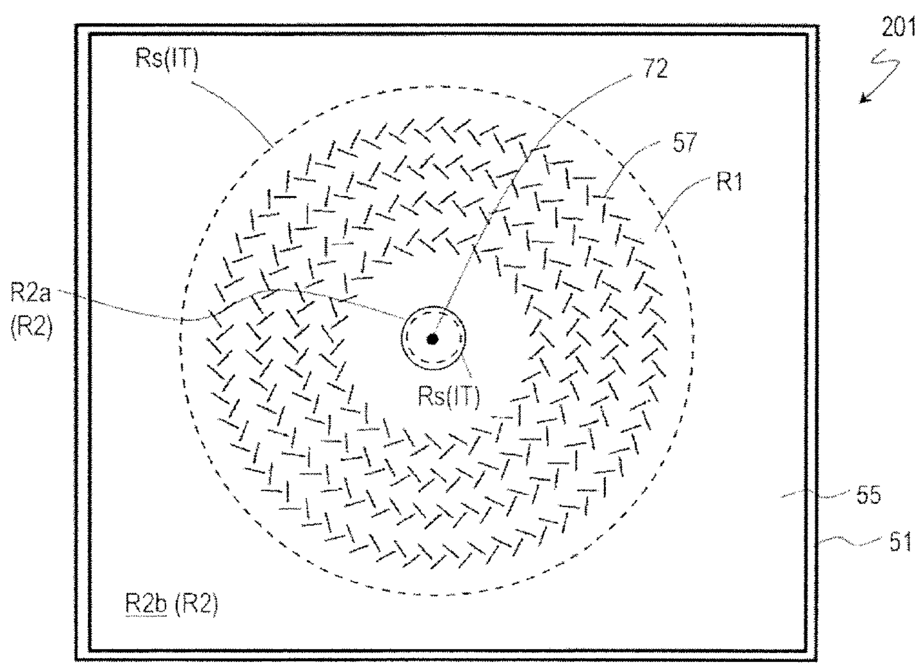

First, a description is given with reference to FIG. 1 and FIGS. 2A and 2B. FIG. 1 is a schematic partial cross-sectional view of the scanning antenna 1000 near the center thereof as described above in detail, and FIGS. 2A and 2B are schematic plan views illustrating the TFT substrate 101 and the slot substrate 201 included in the scanning antenna 1000, respectively.

The scanning antenna 1000 includes a plurality of the antenna units U arranged two-dimensionally. In the scanning antenna 1000 exemplified here, the plurality of antenna units U are arranged concentrically. In the following description, the region of the TFT substrate 101 and the region of the slot substrate 201 corresponding to the antenna unit U will be referred to as "antenna unit region," and be denoted with the same reference numeral U as the antenna unit. In addition, as illustrated in FIGS. 2A and B, in the TFT substrate 101 and the slot substrate 201, a region defined by the plurality of antenna unit regions that are two-dimensionally arranged is referred to as a "transmission and/or reception region R1," and a region other than the transmission and/or reception region R1 is referred to as a "non-transmission and/or reception region R2." A terminal section, a driving circuit, and the like are provided in the non-transmission and/or reception region R2.

FIG. 2A is a schematic plan view illustrating the TFT substrate 101 included in the scanning antenna 1000.

In the illustrated example, the transmission and/or reception region R1 has a donut-shape when viewed from a normal direction of the TFT substrate 101. The non-transmission and/or reception region R2 includes a first non-transmission and/or reception region R2*a* located at the center of the transmission and/or reception region R1 and a second non-transmission and/or reception region R2*b* located at a peripheral portion of the transmission and/or reception region R1. An outer diameter of the transmission and/or reception region R1, for example, is from 200 mm to 1500 mm and is configured according to communication traffic volume or other factors.

A plurality of gate bus lines GL and a plurality of source bus lines SL supported by the dielectric substrate 1 are provided in the transmission and/or reception region R1 of the TFT substrate 101, and the antenna unit regions U are defined by these wiring lines. The antenna unit regions U are, for example, arranged concentrically in the transmission and/or reception region R1. Each of the antenna unit regions U includes a TFT and a patch electrode electrically connected to the TFT. The source electrode of the TFT is electrically connected to the source bus line SL, and the gate electrode is electrically connected to the gate bus line GL. In addition, the drain electrode is electrically connected to the patch electrode.

In the non-transmission and/or reception region R2 (R2*a*, R2*b*), a seal region Rs is disposed surrounding the transmission and/or reception region R1. A sealing member (not illustrated) is applied to the seal region Rs. The sealing member bonds the TFT substrate 101 and the slot substrate 201 to each other, and also encloses liquid crystals between these substrates 101 and 201.

A gate terminal section GT, the gate driver GD, a source terminal section ST, and the source driver SD are provided outside the seal region Rs in the non-transmission and/or reception region R2. Each of the gate bus lines GL is connected to the gate driver GD with the gate terminal section GT interposed therebetween. Each of the source bus lines SL is connected to the source driver SD with the source terminal section ST therebetween. Note that, in this example, although the source driver SD and the gate driver GD are formed on the dielectric substrate 1, one or both of these drivers may be provided on another dielectric substrate.

Also, a plurality of transfer terminal sections PT are provided in the non-transmission and/or reception region R2. The transfer terminal section PT is electrically connected to the slot electrode 55 (FIG. 2B) of the slot substrate 201. In the present specification, the connection section between the transfer terminal sections PT and the slot electrode 55 is referred to as a "transfer section." As illustrated in the drawings, the transfer terminal sections PT (transfer section) may be disposed in the seal region Rs. In this case, a resin containing conductive particles may be used as the sealing member. In this way, liquid crystals are sealed between the TFT substrate 101 and the slot substrate 201, and an electrical connection can be secured between the transfer terminal sections PT and the slot electrode 55 of the slot substrate 201. In this example, although a transfer terminal section PT is disposed in both the first non-transmission and/or reception region R2*a* and the second non-transmission and/or reception region R2*b*, the transfer terminal sections PT may be disposed in only one of the first non-transmission and/or reception region R2*a* and the second non-transmission and/or reception region R2*b*.

Note that the transfer terminal sections PT (transfer sections) need not be disposed in the seal region Rs. For example, the transfer terminal section PT may be disposed outside the seal region Rs in the non-transmission and/or reception region R2. Of course, the transfer section may be disposed both within the seal region Rs and outside the seal region Rs.

FIG. 2B is a schematic plan view illustrating the slot substrate 201 in the scanning antenna 1000, and illustrates the surface of the slot substrate 201 closer to the liquid crystal layer LC.

In the slot substrate 201, the slot electrode 55 is formed on the dielectric substrate 51 extending across the transmission and/or reception region R1 and the non-transmission and/or reception region R2.

In the transmission and/or reception region R1 of the slot substrate 201, the plurality of slots 57 are formed in the slot electrode 55. The slots 57 are formed corresponding to the antenna unit regions U on the TFT substrate 101. For the plurality of slots 57 in the illustrated example, a pair of the slots 57 extending in directions substantially orthogonal to each other are concentrically arranged so that a radial in-line slot antenna is configured. Since the scanning antenna 1000 includes slots that are substantially orthogonal to each other, the scanning antenna 1000 can transmit and/or receive circularly polarized waves.

A plurality of terminal sections IT of the slot electrode 55 are provided in the non-transmission and/or reception region R2. The terminal section IT is electrically connected to the transfer terminal section PT (FIG. 2A) of the TFT substrate 101. In this example, the terminal sections IT are disposed within the seal region Rs and are electrically connected to corresponding transfer terminal sections PT using a sealing member containing conductive particles.

In addition, the power feed pin 72 is disposed on a back face side of the slot substrate 201 in the first non-transmission and/or reception region R2*a*. The power feed pin 72 allows microwaves to be inserted into the waveguide 301 constituted by the slot electrode 55, the reflective conductive plate 65, and the dielectric substrate 51. The power feed pin 72 is connected to a power feed device 70. Power feeding is performed from the center of the concentric circle in which the slots 57 are arranged. The power feed method may be either a direct coupling power feed method or an electromagnetic coupling method, and a known power feed structure can be utilized.

In FIGS. 2A and 2B, an example is illustrated in which the seal region Rs is provided so as to surround a relatively narrow region including the transmission and/or reception region R1, but the arrangement of the seal region Rs is not limited to this. In particular, the seal region Rs provided outside the transmission and/or reception region R1 may be provided at or near the side of the dielectric substrate 1 and/or the dielectric substrate 51, for example, so as to maintain a certain distance or more from the transmission and/or reception region R1. Of course, the terminal section and the driving circuit, for example, that are provided in the non-transmission and/or reception region R2 may be formed outside the region surrounded by the seal region Rs (that is, the side where the liquid crystal layer is not present). By forming the seal region Rs at a position separated from the transmission and/or reception region R1 by a certain distance or more, it is possible to prevent the antenna characteristics from deteriorating due to the influence of impurities (in particular, ionic impurities) contained in the sealing member (in particular, a curable resin).

TFT Substrate 101R of Reference Example 1

Referring to FIGS. 3A to 3D and FIGS. 4A to 4D, a TFT substrate of Reference Example 1 and a possible problem of the TFT substrate of Reference Example 1 will be described.

FIGS. 3A to 3D are plan views schematically illustrating a mother TFT substrate 100R used to fabricate a TFT substrate 101R of Reference Example 1. Referring to FIGS. 3A to 3D, a structure and manufacturing method of the TFT substrate 101R of Reference Example 1 will be described. The TFT substrate 101R of Reference Example 1 is obtained by cutting (dividing) the mother TFT substrate 100R along a cutting line CP. In other words, the mother TFT substrate 100R includes a mother dielectric substrate (e.g., a mother glass substrate) and components of the TFT substrate 101R of Reference Example 1 supported on the mother dielectric substrate. An edge of the dielectric substrate 1 and an edge of the TFT substrate 101R of Reference Example 1 are defined by the cutting line CP. In the following description, regions of the mother TFT substrate corresponding to the "antenna unit region U" and the "transmission and/or reception region R1" of the TFT substrate are referred to as an "antenna unit region U" and a "transmission and/or reception region R1", respectively, and a region other than the transmission and/or reception region R1 of the mother TFT substrate is referred to as a "non-transmission and/or reception region R2". In addition, components common to the TFT substrate included in the mother TFT substrate may be denoted by the same reference numerals.

Figures 3A, 3B, 3C, 3D:
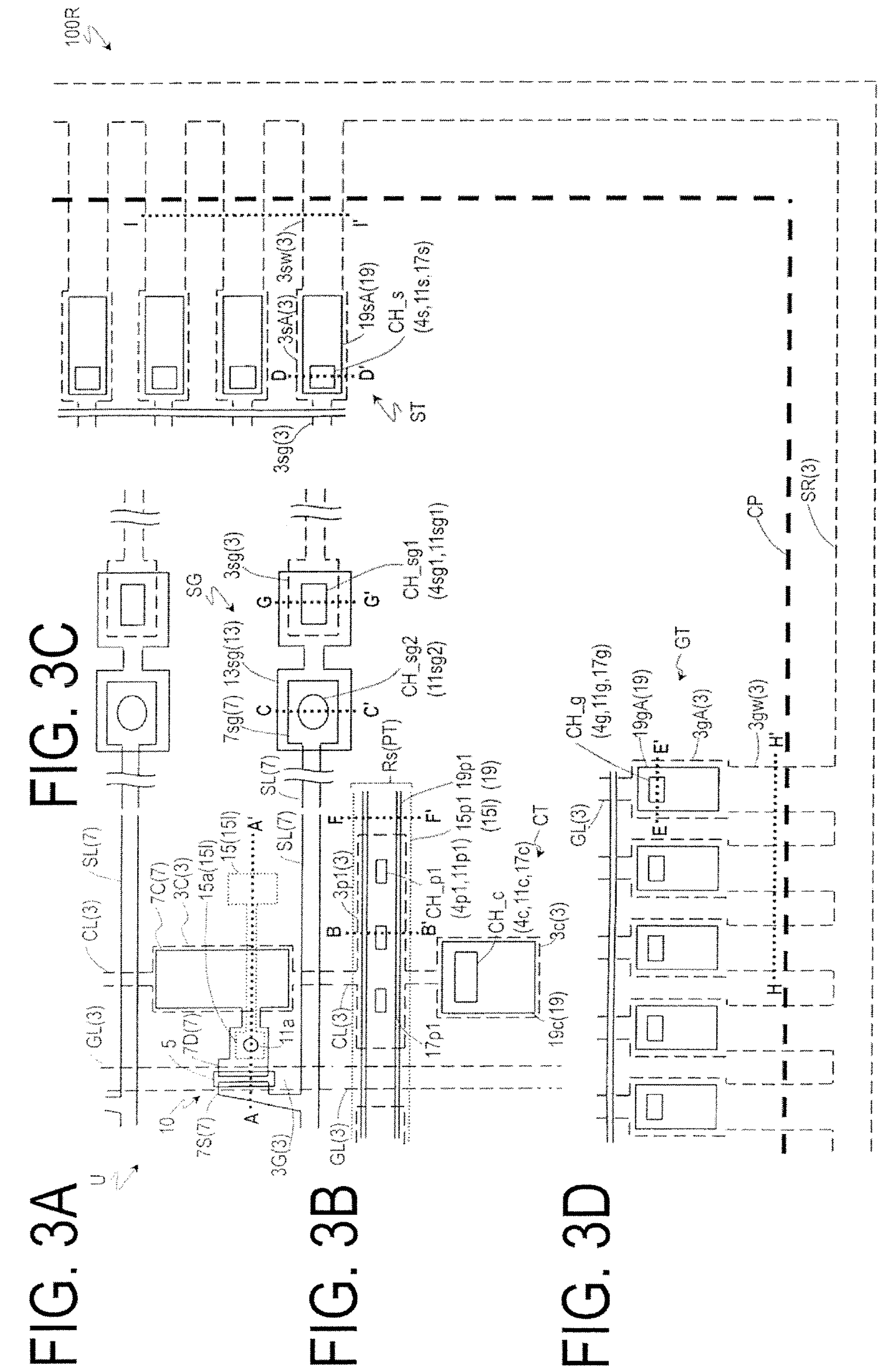
FIGS. 3A to 3D are plan views schematically illustrating a mother TFT substrate 100R used to fabricate a TFT substrate 101R of Reference Example 1.

FIG. 3A illustrates the antenna unit region U in the transmission and/or reception region R1, FIG. 3B illustrates a transfer section PT and a CS terminal section CT provided in the non-transmission and/or reception region R2, and FIG. 3C illustrates a source-gate connection section SG provided in the non-transmission and/or reception region R2. FIG. 3D illustrates the gate terminal section GT and the source terminal section ST provided in the non-transmission and/or reception region R2.

Figure 4A:
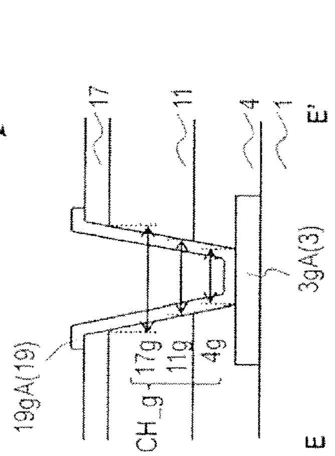
FIGS. 4A to 4D are schematic cross-sectional views of the TFT substrate 101R of Reference Example 1.
Figure 4B:
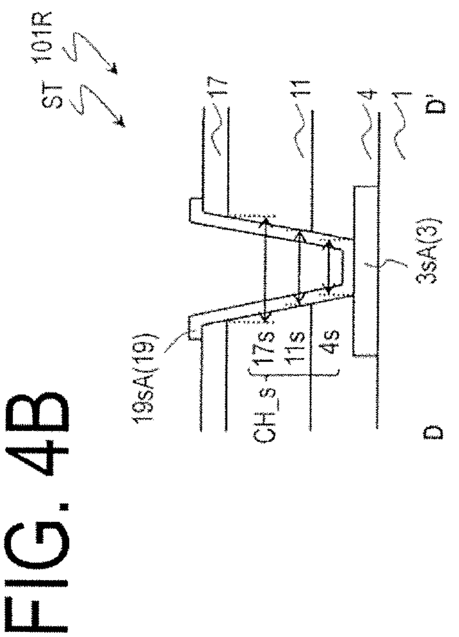
Figure 4C:
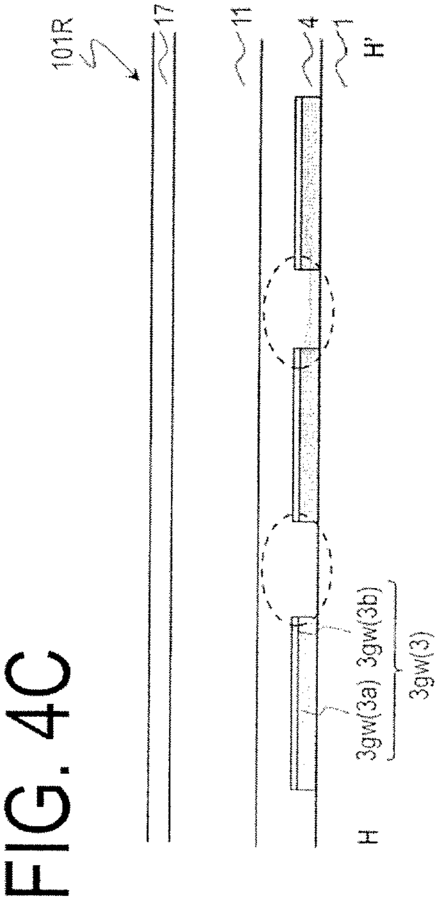
Figure 4D:
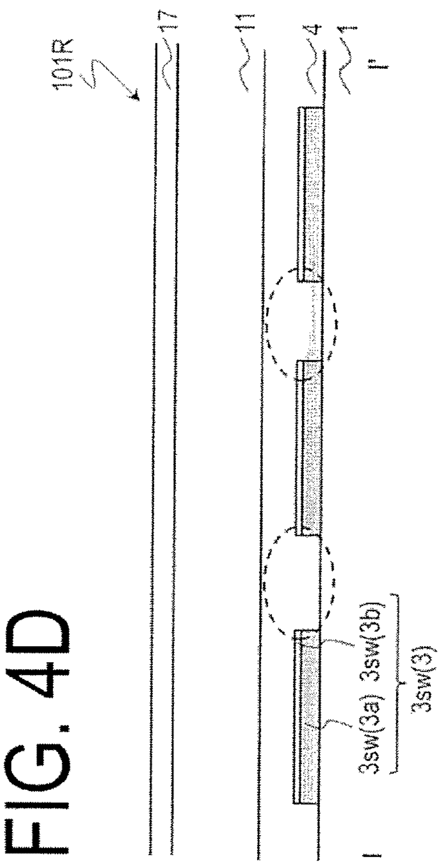

FIGS. 4A to 4D are schematic cross-sectional views of the TFT substrate 101R of Reference Example 1. FIG. 4A illustrates a cross section of the gate terminal section GT corresponding to a line E-E' in FIG. 3D, FIG. 4B illustrates a cross section of the source terminal section ST corresponding to a line D-D' in FIG. 3D, FIG. 4C illustrates a cross section near the cutting line CP corresponding to a line H-H' in FIG. 3D, and FIG. 4D illustrates a cross section near the cutting line CP corresponding to a line I-I' in FIG. 3D. Note that the structures of the other cross-sections are the same as the TFT substrate 101A according to the embodiment of the disclosure described below, and thus, description thereof is omitted here.

The TFT substrate 101R of Reference Example 1 includes the transmission and/or reception region R1 in which a plurality of antenna unit regions U are arranged, and the non-transmission and/or reception region R2 provided with the terminal sections and the like. The non-transmission and/or reception region R2 includes the seal region Rs provided surrounding the transmission and/or reception region R1. The seal region Rs is located between a terminal section region in which the terminal section is disposed and the transmission and/or reception region R1, for example. In this example, the transfer section PT is located in the seal region Rs. In this example, the transfer section PT extends along the seal region Rs to surround the transmission and/or reception region R1. Note that a transfer terminal section may be provided separately from the seal region Rs, or both a transfer section provided in the seal region Rs and a transfer terminal section provided outside the seal region Rs may be included.

A structure of the gate terminal section GT will be described with reference to FIG. 3D and FIG. 4A. The gate terminal section GT is provided for each gate bus line GL, in general.

As illustrated in FIG. 3D and FIG. 4A, the gate terminal section GT includes a gate terminal lower connection section 3gA (also simply referred to as a "lower connection section 3*g*A" or a "connection section 3*g*A") and a gate terminal wiring line section 3*gw* (also simply referred to as a "wiring line section 3*gw*") that extends from the lower connection section 3*g*A and at least reaches the edge of the dielectric substrate 1 when viewed from the normal direction of the dielectric substrate 1. The gate terminal section GT further includes an opening 4*g* formed in the gate insulating layer 4, an opening 11*g* formed in the first insulating layer 11, an opening 17*g* formed in the second insulating layer 17, and a gate terminal upper connection section 19*g*A (also simply referred to as an "upper connection section 19*g*A").

The lower connection section 3*g*A is electrically connected to the corresponding gate bus line GL. In this example, the lower connection section 3*g*A extends from the corresponding gate bus line GL and is formed integrally with the corresponding gate bus line GL. The lower connection section 3*g*A and the wiring line section 3*gw* are included in the gate metal layer 3 that includes the gate electrode 3G and the gate bus line GL of the TFT 10.

The gate insulating layer 4 is formed on the gate metal layer 3. The opening 4*g* formed in the gate insulating layer 4 at least reaches the lower connection section 3*g*A.

The first insulating layer 11 is formed on the gate insulating layer 4. The opening 11*g* formed in the first insulating layer 11 overlaps the opening 4*g* formed in the gate insulating layer 4 when viewed from the normal direction of the dielectric substrate 1.

The second insulating layer 17 is formed on the first insulating layer 11. The opening 17*g* formed in the second insulating layer 17 overlaps the opening 11*g* formed in the first insulating layer 11 when viewed from the normal direction of the dielectric substrate 1. The opening 4*g* formed in the gate insulating layer 4, the opening 11*g* formed in the first insulating layer 11, and the opening 17*g* formed in the second insulating layer 17 constitute a contact hole CH_g.

The upper connection section 19*g*A is included in an upper connection layer 19 formed on the second insulating layer 17. The upper connection section 19*g*A is formed on the second insulating layer 17 and within the contact hole CH_g, and is electrically connected to the lower connection section 3*g*A within the contact hole CH_g. For example, the upper connection section 19*g*A is in contact with the lower connection section 3*g*A within the opening 4*g* formed in the gate insulating layer 4.

The wiring line section 3*gw* of the gate terminal section GT of the mother TFT substrate 100R is electrically connected to a short circuit wiring line (also called a "short ring" or "short circuit member") SR. Specifically, the connection sections 3*g*A of the respective gate terminal sections GT are electrically connected to each other. This can suppress generation of ESD (electrostatic discharge) and the like in a manufacturing process. As described above, the TFT substrate 101R is fabricated by cutting the mother TFT substrate 100R along the cutting line CP. By doing so, the connection sections 3*g*A of the respective gate terminal sections GT are separated from the short circuit wiring line SR and are electrically independent from each other. Since the short circuit wiring line SR is disposed outside the cutting line CP, the short circuit wiring line SR is not included in the resulting TFT substrate 101R.

The short circuit wiring line SR is included in a conductive layer the same as the conductive layer (here, the gate metal layer 3) including the wiring line section 3*gw*, for example. Here, the short circuit wiring line SR extends from the wiring line section 3*gw* and is integrally formed with the wiring line section 3*gw*. The wiring line section 3*gw* includes a low resistance metal layer 3*a*. In this example, as illustrated in FIG. 4C, the wiring line section 3*gw* has a layered structure including an Al layer 3*a* and a MoN layer 3*b* on the Al layer 3*a*. Specifically, although the illustration may be omitted in other sections for simplicity, the gate metal layer 3 has such a layered structure. The "low resistance metal layer" herein is a metal layer containing at least one element selected from the group consisting of copper (Cu), aluminum (Al), silver (Ag), and gold (Au). The "low resistance metal layer" may have a layered structure.

As illustrated in FIG. 3D, since the cutting line CP passes over the wiring line section 3*gw*, when the mother TFT substrate 100R is cut along the cutting line CP, the wiring line section 3*gw* is cut through. A cutting surface has a structure similar to that shown in FIG. 4C. As illustrated in FIG. 4C, the low resistance metal layer 3*a* formed from a metal material that is relatively soft (highly ductile) is exposed on the cutting surface. After cutting the mother substrate along the cutting line CP, an end surface treatment (for example, round chamfering) is performed on the cutting surface as necessary. In the process after the cutting (for example, in the end surface treatment process), when the low resistance metal layer 3*a* exposed on the cutting surface is contacted, the metal material that constitutes the low resistance metal layer 3*a* may extend to short the adjacent wiring line sections 3*gw* (for example, locations indicated by a dashed line ellipse in FIG. 4C). Specifically, problems may arise in which the connection sections 3*g*A connected to different gate bus lines are shorted.

According to the TFT substrate and the method for manufacturing the TFT substrate in the embodiment of the disclosure described below, the occurrence of the problems described above is suppressed.

In the above description, the gate terminal section GT arranged correspondingly to each of the gate bus lines GL is described, but a similar problem may arise with the source terminal section ST disposed correspondingly to the source bus line.

As illustrated in FIG. 3C, the TFT substrate 101R of Reference Example 1 includes a source-gate connection section SG corresponding to each of the source bus lines SL, and the source-gate connection section SG electrically connects each source bus line SL to a connection wiring line formed in the gate metal layer 3. This allows the source terminal section ST to have a structure similar to that of the gate terminal section as illustrated in FIG. 3D and FIG. 4B.

The structure of the source terminal section ST will be described with reference to FIG. 3D and FIG. 4B. The source terminal section ST is provided for each source bus line SL, in general.

As illustrated in FIG. 3D and FIG. 4B, the source terminal section ST includes a source terminal lower connection section 3*s*A (also simply referred to as a "lower connection section 3*s*A" or a "connection section 3*s*A"), and a source terminal wiring line section 3*sw* (also simply referred to as a "wiring line section 3*sw*") that extends from the lower connection section 3*s*A and at least reaches the edge of the dielectric substrate 1 when viewed from the normal direction of the dielectric substrate 1. The source terminal section ST further includes an opening 4*s* formed in the gate insulating layer 4, an opening 11*s* formed in the first insulating layer 11, an opening 17*s* formed in the second insulating layer 17, and a source terminal upper connection section 19*s*A (also simply referred to as an "upper connection section 19*s*A").

The lower connection section 3*s*A is electrically connected to the corresponding source bus line SL. In this example, the lower connection section 3*s*A extends from a source lower connection wiring line 3*sg* electrically connected to the source bus line SL by the source-gate connection section SG and is formed integrally with the source lower connection wiring line 3*sg*. The lower connection section 3*s*A and the wiring line section 3*sw* are included in the gate metal layer 3.

The opening 4*s* formed in the gate insulating layer 4 at least reaches the lower connection section 3*s*A.

The opening 11*s* formed in the first insulating layer 11 overlaps the opening 4*s* formed in the gate insulating layer 4 when viewed from the normal direction of the dielectric substrate 1.

The opening 17*s* formed in the second insulating layer 17 overlaps the opening 11*s* formed in the first insulating layer 11 when viewed from the normal direction of the dielectric substrate 1. The opening 4*s* formed in the gate insulating layer 4, the opening 11*s* formed in the first insulating layer 11, and the opening 17*s* formed in the second insulating layer 17 constitute the contact hole CH_s.

The upper connection section 19*s*A is included in the upper connection layer 19. The upper connection section 19*s*A is formed on the second insulating layer 17 and within the contact hole CH_s, and is electrically connected to the lower connection section 3*s*A within the contact hole CH_s. For example, the upper connection section 19*s*A is in contact with the lower connection section 3*s*A within the opening 4*s* formed in the gate insulating layer 4.

The wiring line section 3*sw* of the source terminal section ST is also electrically connected to the short circuit wiring (short ring) SR in the same manner as the wiring line section 3*gw* of the gate terminal section GT. Specifically, the connection sections 3*s*A of the respective source terminal sections ST are electrically connected to each other. This can suppress generation of ESD (electrostatic discharge) and the like in the manufacturing process. When fabricating the TFT substrate 101R, the mother TFT substrate 100R is cut along the cutting line CP. By doing so, the connection sections 3*s*A of the respective source terminal sections ST are separated from the short circuit wiring line SR and are electrically independent from each other.

As illustrated in FIG. 3D, since the cutting line CP passes over the wiring line section 3*sw*, when the mother TFT substrate 100R is cut along the cutting line CP, the wiring line section 3*sw* is cut through. A cutting surface has a structure similar to that shown in FIG. 4D. As illustrated in FIG. 4D, the low resistance metal layer 3*a* formed from a metal material that is relatively soft (highly ductile) is exposed on the cutting surface. In the process after the cutting (for example, in the end surface treatment process), when the low resistance metal layer 3*a* exposed on the cutting surface is contacted, the metal material that constitutes the low resistance metal layer 3*a* may extend to short the adjacent wiring line sections 3*sw* (for example, locations indicated by a dashed line ellipse in FIG. 4D). Specifically, problems may arise in which the connection sections 3*s*A connected to different source bus lines are shorted.

The above-described problem occurrence is not limited to the TFT substrate 101R of Reference Example 1 described above. If the wiring line section of the gate terminal section or the source terminal section of the mother TFT substrate includes a low resistance metal layer (for example, a metal layer containing Al or Cu) on the cutting line CP, the problems described above may arise. For example, in a case that the wiring line section of the gate terminal section or the source terminal section is included in the gate metal layer, the problems described above can arise if the gate metal layer includes at least the low resistance metal layer. In a case also that the gate metal layer has a layered structure that further includes, besides the low resistance metal layer, a conductive layer other than the low resistance metal layer over and/or under the low resistance metal layer, the problems described above can arise. The wiring line section of the gate terminal section and/or the source terminal section may be included in, for example, a conductive layer including the source electrode of the TFT (i.e., the source metal layer). In this case, if the source metal layer includes at least the low resistance metal layer, the problems described above can arise. The wiring line section of the gate terminal section and the wiring line section of the source terminal section may be included in different conductive layers.

Embodiment 1-1

According to the embodiment of the disclosure, the occurrence of such problems is suppressed and a TFT substrate improved in reliability can be obtained.

A structure of the TFT substrate 101A according to Embodiment 1-1 of the disclosure will be described with reference to FIG. 5A to FIG. 8D. Differences from the TFT substrate 101R of Reference Example 1 will be mainly described.

FIGS. 5A to 5D are plan views schematically illustrating a mother TFT substrate 100A used to fabricate the TFT substrate 101A. Referring to FIGS. 5A to 5D, a structure and manufacturing method of the TFT substrate 101A will be described. The TFT substrate 101A is obtained by cutting (dividing) the mother TFT substrate 100A along the cutting line CP. In other words, the mother TFT substrate 100A includes a mother dielectric substrate (e.g., a mother glass substrate) and components of the TFT substrate 101A supported on the mother dielectric substrate. An edge of the dielectric substrate 1 and an edge of the TFT substrate 101A are defined by the cutting line CP.

Figures 5A, 5B, 5C, 5D:
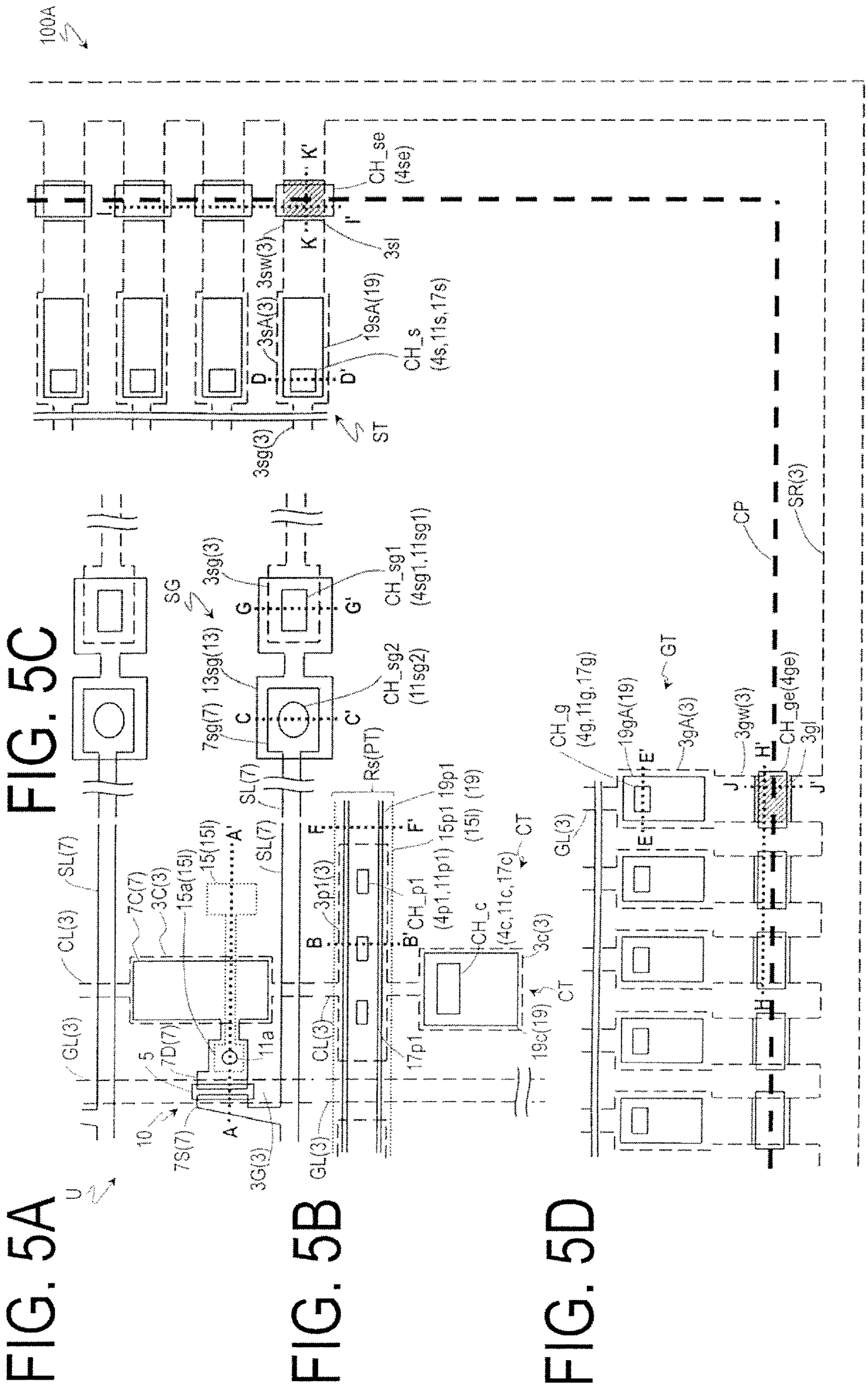
FIGS. 5A to 5D are plan views schematically illustrating a mother TFT substrate 100A used to fabricate a TFT substrate 101A according to Embodiment 1-1 of the disclosure.

FIG. 5A illustrates the antenna unit region U in the transmission and/or reception region R1, FIG. 5B illustrates the transfer section PT, and the CS terminal section CT provided in the non-transmission and/or reception region R2, and FIG. 5C illustrates the source-gate connection section SG provided in the non-transmission and/or reception region R2. FIG. 5D illustrates the gate terminal section GT and the source terminal section ST provided in the non-transmission and/or reception region R2.

Figures 6A, 6B, 6C, 6D:
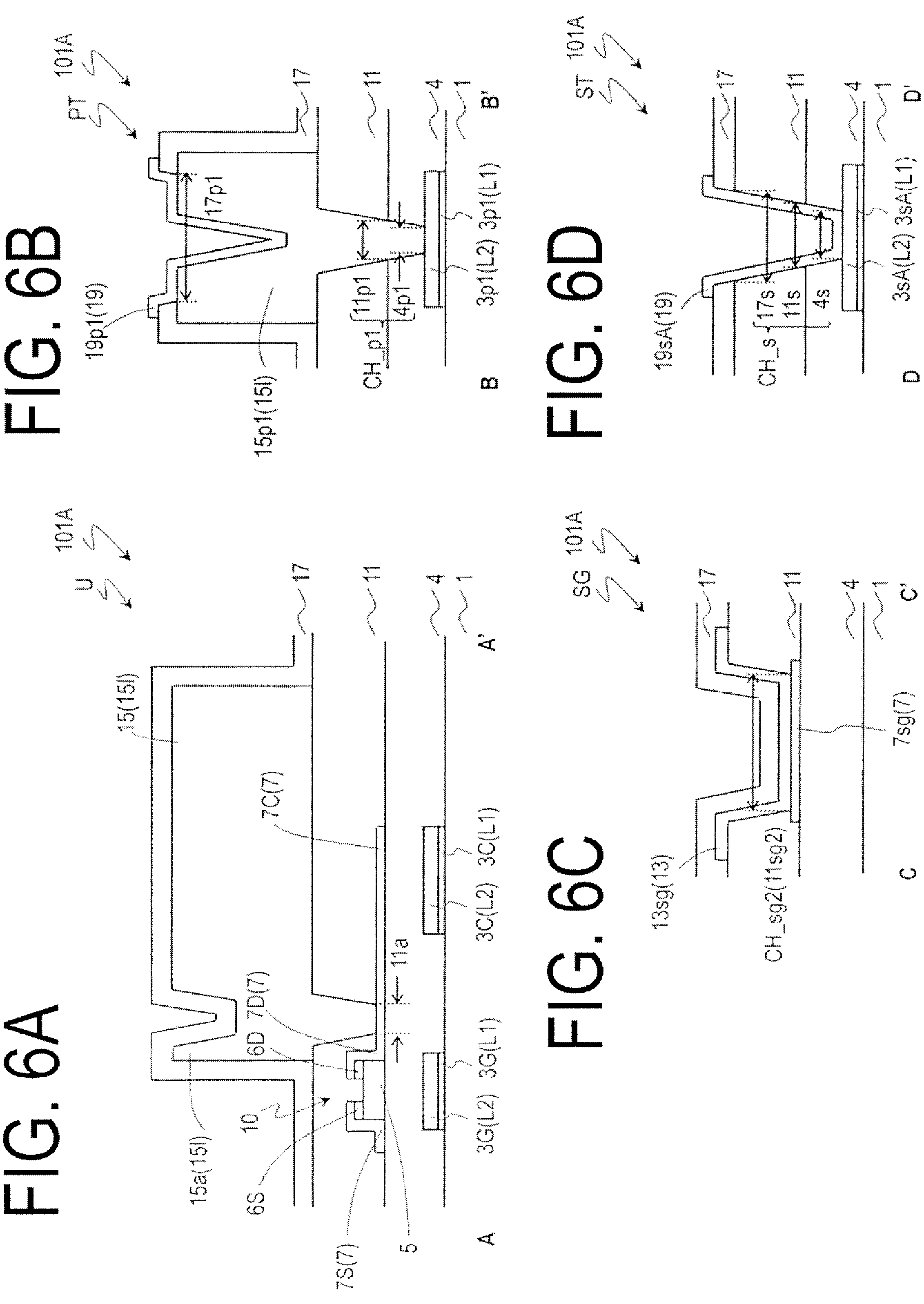
FIGS. 6A to 6D are schematic cross-sectional views of the TFT substrate 101A.
Figure 7A:
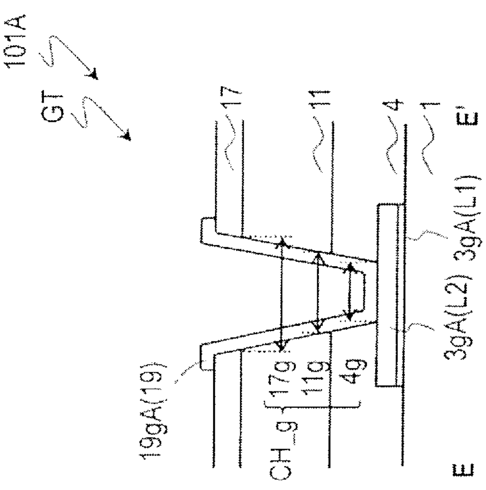
FIGS. 7A to 7C are schematic cross-sectional views of the TFT substrate 101A.
Figure 7B:
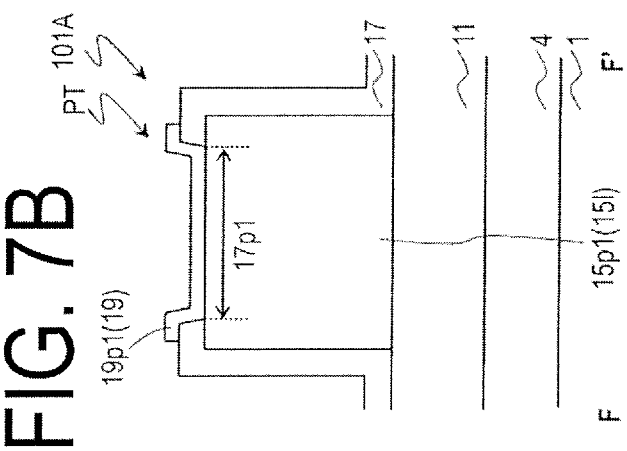
Figure 7C:
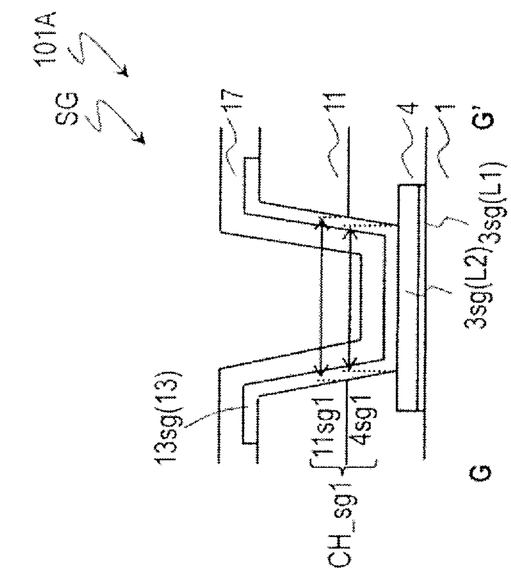
Figure 8A:
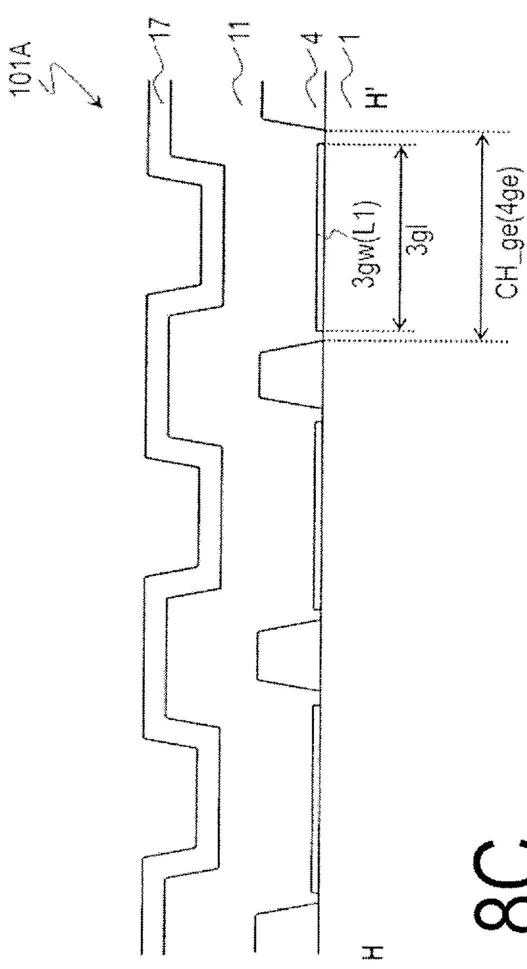
FIGS. 8A and 8C are schematic cross-sectional views of the TFT substrate 101A.
Figure 8B:
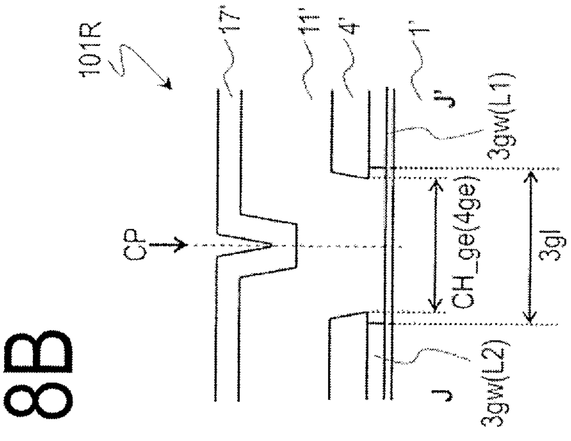
FIGS. 8B and 8D are schematic cross-sectional views of the mother TFT substrate 100A.
Figure 8C:
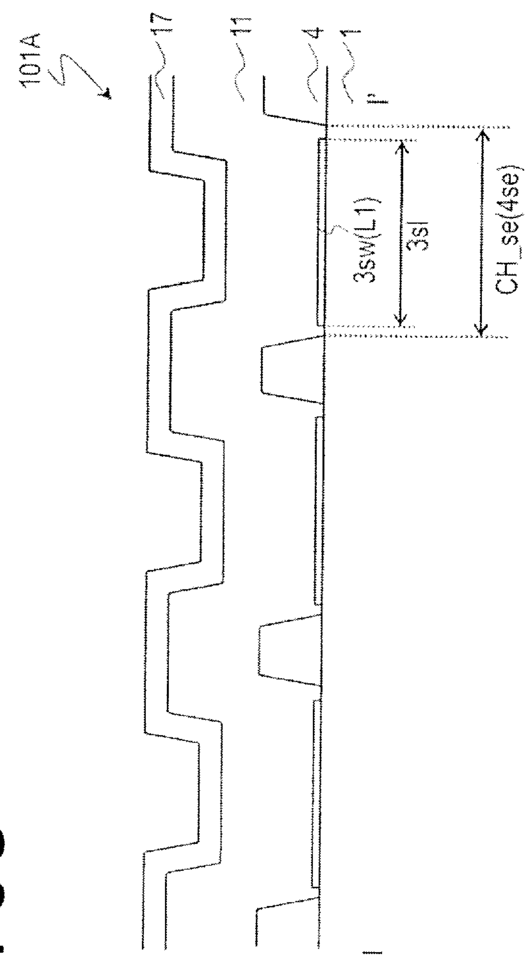
Figure 8D:
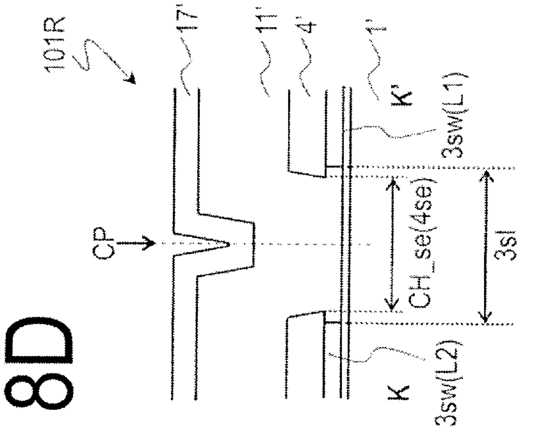

FIGS. 6A to 6D, FIGS. 7A to 7C, and FIGS. 8A and 8C are schematic cross-sectional views of the TFT substrate 101A. FIG. 6A illustrates a cross section of the antenna unit region U corresponding to a line A-A' in FIG. 5A, FIG. 6B illustrates a cross section of the transfer section PT corresponding to a line B-B' in FIG. 5B, FIG. 6C illustrates a cross section of the source-gate connection section SG corresponding to a line C-C' in FIG. 5C, FIG. 6D illustrates a cross section of the source terminal section ST corresponding to a line D-D' in FIG. 5D, FIG. 7A illustrates a cross section of gate terminal section GT corresponding to a line E-E' in FIG. 5D, FIG. 7B illustrates a cross section of the transfer section PT corresponding to a line F-F' in FIG. 5B, FIG. 7C illustrates a cross section of the source-gate connection section SG corresponding to a line G-G' in FIG. 5C, FIG. 8A illustrates a cross section near the cutting line CP corresponding to a line H-H' in FIG. 5D, and FIG. 8C illustrates a cross section near the cutting line CP corresponding to a line I-I' in FIG. 5D. FIGS. 8B and 8D are schematic cross sectional views of the mother TFT substrate 100A. FIG. 8D illustrates a cross section near the cutting line CP along a line J-J' in FIG. 5D, and FIG. 8D illustrates a cross section near the cutting line CP along a line K-K' in FIG. 5D.

Gate Terminal Section GT

Referring to FIG. 5D, FIG. 7A, and FIGS. 8A and 8B, a structure and manufacturing method of the gate terminal section GT included in the TFT substrate 101A will be described. Differences from the gate terminal section GT of the TFT substrate 101R of Reference Example 1 will be mainly described. Note that a mother dielectric substrate 1', a gate insulating film 4', a first insulating film 11', and a second insulating film 17' included in the mother TFT substrate 100A illustrated in FIG. 8B are cut along the cutting line CP to obtain the dielectric substrate 1, the gate insulating layer 4, the first insulating layer 11, and the second insulating layer 17.

The gate terminal section GT includes the lower connection section 3gA and the wiring line section 3gw that extends from the lower connection section 3gA and at least reaches the edge of the dielectric substrate 1 when viewed from the normal direction of the dielectric substrate 1. The lower connection section 3gA is electrically connected to the corresponding gate bus line GL. The lower connection section 3gA and the wiring line section 3gw are included in the gate metal layer 3 that includes the gate electrode 3G and the gate bus line GL of the TFT 10. The gate metal layer 3 includes a first conductive layer L1 that contains, for example, Ti, and a second conductive layer L2 that is disposed on the first conductive layer L1 and contains, for example, Cu or Al. Here, the first conductive layer L1 is formed from a lower ductile conductive material such as Ti and does not include a low resistance metal layer. The second conductive layer L2 is a low resistance metal layer.

Here, a structure of the gate terminal section GT of the mother TFT substrate 100A for fabricating the gate terminal section GT of the TFT substrate 101A will be described before describing the detailed structure of the gate terminal section GT of the TFT substrate 101A.

The lower connection section 3gA of each gate terminal section GT of the mother TFT substrate 100A is electrically connected to the short circuit wiring line SR via the wiring line section 3gw (also referred to as the "wiring line 3gw"). Specifically, in the mother TFT substrate 100A, the wiring line section 3gw is formed between the lower connection section 3gA included in each gate terminal section GT and the short circuit wiring line SR. The wiring line section 3gw includes a region (also referred to as a "first region") 3g1 that includes the first conductive layer L1 and does not include the second conductive layer L2. For example, the first region 3g1 included in the wiring line section 3gw of the right-most gate terminal section GT illustrated in FIG. 5D is hatched. The first region 3g1 is provided in a region including at least the cutting line CP of the wiring line section 3gw. In other words, the second conductive layer L2 is not formed on the cutting line CP. The gate insulating layer 4 on the gate metal layer 3, when viewed from the normal direction of the mother dielectric substrate, includes an opening 4ge overlapping at least a portion of the first region 3g1 (the region including at least the cutting line CP). Specifically, when viewed from the normal direction of the mother dielectric substrate, the gate insulating layer 4 is formed not to overlap at least a portion of the first region 3g1 (the region including at least the cutting line CP). The opening 4ge at least reaches the first conductive layer L1 in the first region 3g1. The opening 4ge may be referred to as a contact hole CH_ge. The contact hole CH_ge is covered with the first insulating layer 11 and the second insulating layer 17.

The TFT substrate 101A is obtained by dividing the mother TFT substrate 100A having such a structure along the cutting line CP. As illustrated in FIG. 5D, the cutting line CP is located over the first region 3g1 of the wiring line section 3gw. When cutting the wiring line section 3gw, the first region 3g1 of the wiring line section 3gw is cut. Since the second conductive layer L2 is not formed over the cutting line CP, the second conductive layer L2 that is highly ductile is not exposed and only the first conductive layer L1 that is lowly ductile is exposed on the cutting surface, similarly to the cross section illustrated in FIG. 8A. Since the first conductive layer L1 is lowly ductile and highly brittle, shorting between adjacent wiring line sections 3gw is suppressed. This suppresses the occurrence of such problems that the connection sections connected to different gate bus lines are shorted. The TFT substrate 101A is excellent in reliability.

The structure of the gate terminal section GT of the TFT substrate 101A fabricated by the method described above will be described.

An edge of the dielectric substrate 1 and an edge of the TFT substrate 101A are defined by the cutting line CP. The cutting line CP is located to divide the first region 3g1 of the wiring line section 3gw of the mother TFT substrate 100A. The wiring line section 3gw (first region 3g1) of the mother TFT substrate 100A is divided along the cutting line CP to obtain the wiring line section 3gw (first region 3g1) included in the gate terminal section GT of the TFT substrate 101A. A portion of the wiring line section 3gw of the mother TFT substrate 100A between the lower connection section 3gA and the cutting line CP is the wiring line section 3gw of the TFT substrate 101A. The edge of the wiring line section 3gw (the edge of the first region 3g1) included in the gate terminal section GT of the TFT substrate 101A is defined by the cutting line CP, and thus, substantially conforms to the edge of the dielectric substrate 1. This can be said as follows. The first region 3g1 of the wiring line section 3gw included in the gate terminal section GT of the TFT substrate 101A has an edge side (also referred to as a "first edge side") substantially conforms to the edge of the dielectric substrate 1. Here, the edges of the substrate, the insulating layer, the conductive layer, and the like substantially conforming means that these edges are defined by the same cutting position, tolerating errors caused by the process of cutting the mother substrate. Examples of the error caused by the process of cutting the mother substrate may include a case that the conductive layer (for example, the conductive layer that constitutes the wiring line section) or the insulating layer deviates from the dielectric substrate, or a case that a portion of the conductive layer or a portion of the insulating layer is peeled from the dielectric substrate.

As illustrated in FIG. 5D, the opening 4ge (contact hole CH_ge) of the mother TFT substrate 100A is divided along the cutting line CP, and thus, the gate insulating layer 4 included in the TFT substrate 101A has a notched portion 4ge (notched portion CH_ge) that is a portion obtained by cutting away the edge of the TFT substrate 101A. For the sake of easy understanding, the notched portion 4ge and the notched portion CH_ge included in the TFT substrate 101A are denoted by the same reference numerals as the openings 4ge and the contact holes CH_ge included in the mother TFT substrate 100A. For simplicity, the notched portion 4ge included in the TFT substrate 101A may also be referred to as the "opening 4ge", and the notched portion CH_ge included in the TFT substrate 101A may also be referred to as the "contact hole CH_ge". Hereinafter, the same applies. The gate insulating layer 4 of the TFT substrate 101A, when viewed from the normal direction of the dielectric substrate 1, includes the notched portion 4*ge* overlapping at least a portion of the first region 3*g*1 (a region including at least the edge defined by the cutting line CP).

The above description of the gate terminal section GT also applies to the source terminal section ST described below.

The first conductive layer L1 may be a conductive layer that contains at least one selected from the group consisting of Ti, Ta, W, MoNb, Nb, Ni, In—Sn—O based oxide, In—Zn—O based oxide, and In—Ga—Zn—O based oxide. Such a first conductive layer L1 is lowly ductile and highly brittle. The first conductive layer L1 does not include a low resistance metal layer. The second conductive layer L2 may contain at least one element selected from the group consisting of Cu, Al, Ag, and Au. Specifically, the second conductive layer L2 is a low resistance metal layer. In a case like this, the occurrence of such problems that the connection sections connected to different gate bus lines are shorted is suppressed. Moreover, in the mother TFT substrate, the connection sections 3*g*A of the respective gate terminal sections GT are electrically connected to each other through the first conductive layer L1, suppressing generation of ESD (electrostatic discharge) and the like in the manufacturing process. This allows the TFT substrate excellent in reliability to be obtained.

The gate insulating layer 4 having the opening 4*ge* allows the TFT substrate 101A improved in reliability to be obtained while suppressing an increase in manufacturing cost (for example, the number of photomasks), as is described later in the method for manufacturing the TFT substrate 101A.

Source Terminal Section ST

Referring to FIG. 5D, FIG. 6D, and FIGS. 8B and 8C, a structure and manufacturing method of the source terminal section ST included in the TFT substrate 101A will be described. The source terminal section ST has a structure similar to the gate terminal section GT, and is fabricated by a manufacturing method similar to the gate terminal section GT. Differences from the source terminal section ST of the TFT substrate 101R of Reference Example 1 will be mainly described.

The source terminal section ST includes the lower connection section 3*s*A and the wiring line section 3*sw* that extends from the lower connection section 3*s*A and at least reaches the edge of the dielectric substrate 1 when viewed from the normal direction of the dielectric substrate 1. The lower connection section 3*s*A is electrically connected to the corresponding source bus line SL. The lower connection section 3*s*A and the wiring line section 3*sw* are included in the gate metal layer 3.

A structure of the mother TFT substrate 100A will be described. The wiring line section 3*sw* includes a region (also referred to as a "first region") 3*s*1 that includes the first conductive layer L1 and does not include the second conductive layer L2. For example, the first region 3*s*1 included in the wiring line section 3*sw* of the lowermost source terminal section ST illustrated in FIG. 5D is hatched. The first region 3*s*1 is provided in a region including at least the cutting line CP of the wiring line section 3*sw*. The gate insulating layer 4 on the gate metal layer 3, when viewed from the normal direction of the mother dielectric substrate (the dielectric substrate 1), includes an opening 4*se* overlapping at least a portion of the first region 3*s*1 (the region including at least the cutting line CP). The opening 4*se* at least reaches the first conductive layer L1 in the first region 3*s*1. The opening 4*se* may be referred to as a contact hole CH_se. The contact hole CH_se is covered with the first insulating layer 11 and the second insulating layer 17.

The TFT substrate 101A is obtained by dividing the mother TFT substrate 100A having such a structure along the cutting line CP. As illustrated in FIG. 5D, the cutting line CP is located over the first region 3*s*1 of the wiring line section 3*sw*. When cutting the wiring line section 3*sw*, the first region 3*s*1 of the wiring line section 3*sw* is cut. Since the second conductive layer L2 is not formed over the cutting line CP, the second conductive layer L2 that is highly ductile is not exposed and only the first conductive layer L1 that is lowly ductile is exposed on the cutting surface, similarly to the cross section illustrated in FIG. 8B. Since the first conductive layer L1 is lowly ductile and highly brittle, shorting between adjacent wiring line sections 3*sw* is suppressed. This suppresses the occurrence of such problems that the connection sections connected to different source bus lines are shorted. The TFT substrate 101A is excellent in reliability.

An edge of the dielectric substrate 1 and an edge of the TFT substrate 101A are defined by the cutting line CP. The cutting line CP is located to divide the first region 3*s*1 of the wiring line section 3*sw* of the mother TFT substrate 100A. The wiring line section 3*sw* (first region 3*s*1) of the mother TFT substrate 100A is divided along the cutting line CP to obtain the wiring line section 3*sw* (first region 3*s*1) included in the source terminal section ST of the TFT substrate 101A. The edge of the wiring line section 3*sw* (the edge of the first region 3*s*1) included in the source terminal section ST of the TFT substrate 101A is defined by the cutting line CP, and thus, substantially conforms to the edge of the dielectric substrate 1. The first region 3*s*1 of the wiring line section 3*sw* included in the source terminal section ST of the TFT substrate 101A has an edge side (also referred to as a "first edge side") substantially conforms to the edge of the dielectric substrate 1. The gate insulating layer 4 of the TFT substrate 101A, when viewed from the normal direction of the dielectric substrate 1, includes a notched portion (opening) 4*se* overlapping at least a portion of the first region 3*s*1 (a region including at least the edge defined by the cutting line CP).

The gate insulating layer 4 having the opening 4*se* allows the TFT substrate 101A improved in reliability to be obtained while suppressing an increase in manufacturing cost, as is described later in the method for manufacturing the TFT substrate 101A.

A structure of the TFT substrate 101A other than those of the gate terminal section GT and the source terminal section ST will be described below. Here, the embodiments of the disclosure are not limited to those illustrated.

Antenna Unit Region U

As illustrated in FIG. 5A and FIG. 6A, each antenna unit region U in the TFT substrate 101A includes the TFT 10 and the patch electrode 15 electrically connected to the drain electrode 7D of the TFT 10.

The TFT substrate 101A includes the gate metal layer 3 supported by the dielectric substrate 1, the gate insulating layer 4 formed on the gate metal layer 3, the source metal layer 7 formed on the gate insulating layer 4, the first insulating layer 11 formed on the source metal layer 7, a patch metal layer 151 formed on the first insulating layer 11, the second insulating layer 17 formed on the patch metal layer 151, and the upper connection layer 19 formed on the second insulating layer 17, as illustrated in FIG. 5A to FIG. 8D. The TFT substrate 101A further includes a lower connection layer 13 formed between the first insulating layer 11 and the patch metal layer 151.

The TFT 10 includes the gate electrode 3G, the island-shaped semiconductor layer 5, the contact layers 6S and 6D, the gate insulating layer 4 disposed between the gate electrode 3G and the semiconductor layer 5, and the source electrode 7S and the drain electrode 7D. In this example, the TFT 10 is a channel etch type TFT having a bottom gate structure.

The gate electrode 3G is electrically connected to the gate bus line GL, and supplied with a scanning signal voltage via the gate bus line GL. The source electrode 7S is electrically connected to the source bus line SL, and is supplied with a data signal voltage via the source bus line SL. In this example, the gate electrode 3G and the gate bus line GL are formed of the same conductive film (gate conductive film). Here, the source electrode 7S, the drain electrode 7D, and the source bus line SL are formed of the same conductive film (source conductive film). The gate conductive film and the source conductive film include, for example, metal films. A layer formed using the gate conductive film may be referred to as a "gate metal layers" and a layer formed using the source conductive film may be referred to as a "source metal layer." Similarly, a layer formed of a patch conductive film and including the patch electrode 15 may be referred to as a "patch metal layer."

The structure of the TFT substrate 101A in the antenna unit region U will be described in detail.

The gate metal layer 3 includes the gate electrode 3G of the TFT 10 and the gate bus line GL.

The gate insulating layer 4 is formed to cover the gate electrode 3G and the gate bus line GL.

The source metal layer 7 includes the source electrode 7S and drain electrode 7D of the TFT 10, and the source bus line SL.

The first insulating layer 11 is formed to cover the TFT 10. The first insulating layer 11 includes an opening 11*a* that at least reaches the drain electrode 7D or a portion extending from the drain electrode 7D.

The patch metal layer 151 includes the patch electrode 15 and a connection section 15*a*. The connection section 15*a* is electrically connected to the drain electrode 7D or the portion extending from the drain electrode 79 within the opening 11*a*. Here, the connection section 15*a* is in contact with the portion extending from the drain electrode 7D within the opening 11*a*, for example. The patch electrode 15 and the drain electrode 7D are electrically connected to each other via the connection section 15*a*.

The second insulating layer 17 is formed to cover the patch electrode 15 and the connection section 15*a*.

The patch metal layer 151 has a layered structure including a low resistance metal layer and a high melting-point metal containing layer under the low resistance metal layer. The patch metal layer 151 may further include a high melting-point metal containing layer over the low resistance metal layer. The low resistance metal layer of the patch metal layer 151 may be referred to as a "main layer", and the high melting-point metal containing layers under and over the low resistance metal layer may be referred to as a "lower layer" and an "upper layer", respectively.

The upper connection layer 19 includes, for example, a transparent conductive layer (for example, ITO layer). The upper connection layer 19 may be formed of only a transparent conductive layer, for example. Alternatively, the upper connection layer 19 may include a first upper connection layer including a transparent conductive layer and a second upper connection layer formed under the first upper connection layer. The second upper connection layer is formed of one layer or two or more layers selected from the group consisting of a Ti layer, a MoNbNi layer, a MoNb layer, a MoW layer, a W layer and a Ta layer, for example.

Here, each antenna unit region includes an auxiliary capacitance electrically connected in parallel with the liquid crystal capacitance. In this example, the auxiliary capacitance is constituted by an upper auxiliary capacitance electrode (also referred to as an "auxiliary capacitance electrode" in some cases) 7C electrically connected to the drain electrode 7D, the gate insulating layer 4, and an lower auxiliary capacitance electrode (also referred to as an "auxiliary capacitance counter electrode" in some cases) 3C opposite to the upper auxiliary capacitance electrode 7C with the gate insulating layer 4 interposed therebetween. The lower auxiliary capacitance electrode 3C is included in the gate metal layer 3 and the upper auxiliary capacitance electrode 7C is included in the source metal layer 7. The gate metal layer 3 further includes a CS bus line (auxiliary capacitance line) CL connected to the lower auxiliary capacitance electrode 3C. The CS bus line CL extends substantially in parallel with the gate bus line GL, for example. In this example, the lower auxiliary capacitance electrode 3C is formed integrally with the CS bus line CL. A width of the lower auxiliary capacitance electrode 3C may be larger than a width of the CS bus line CL. In this example, the upper auxiliary capacitance electrode 7C extends from the drain electrode 7D. A width of the upper auxiliary capacitance electrode 7C may be larger than a width of a portion extending from the drain electrode 7D except for the upper auxiliary capacitance electrode 7C. Note that an arrangement relationship between the auxiliary capacitance and the patch electrode 15 is not limited to the example illustrated in the drawing.

Source-Gate Connection Section SG

The TFT substrate 101A includes the source-gate connection section SG in the non-transmission and/or reception region R2 as illustrated in FIG. 5C. The source-gate connection section SG is provided for each source bus line SL, in general. The source-gate connection section SG electrically connects each source bus line SL to a connection wiring line formed in the gate metal layer 3.

As illustrated in FIG. 5C, FIG. 6C, and FIG. 7C, the source-gate connection section SG includes the source lower connection wiring line 3*sg*, an opening 4*sg*1 formed in the gate insulating layer 4, a source bus line connection section 7*sg*, an opening 11*sg*1 and opening 11*sg*2 formed in the first insulating layer 11, and a source bus line upper connection section 13*sg*.

The source lower connection wiring line 3*sg* is included in the gate metal layer 3. The source lower connection wiring line 3*sg* is electrically separate from the gate bus line GL.

The opening 4*sg*1 formed in the gate insulating layer 4 at least reaches the source lower connection wiring line 3*sg*.

The source bus line connection section 7*sg* is included in the source metal layer 7 and electrically connected to the source bus line SL. In this example, the source bus line connection section 7*sg* extends from the source bus line SL and is formed integrally with the source bus line SL. A width of the source bus line connection section 7*sg* may be larger than a width of the source bus line SL.

The opening 11*sg*1 formed in the first insulating layer 11 overlaps the opening 4*sg*1 formed in the gate insulating layer 4 when viewed from the normal direction of the dielectric substrate 1. The opening 4*sg*1 formed in the gate insulating layer 4 and the opening 11*sg*1 formed in the first insulating layer 11 constitute a contact hole CH_sg1.

The opening 11*sg*2 formed in the first insulating layer 11 at least reaches the source bus line connection section 7*sg*. The opening 11*sg*2 may be referred to as a contact hole CH_sg2.

The source bus line upper connection section 13*sg* (also simply referred to as an "upper connection section 13*sg*") is included in the lower connection layer 13. The lower connection layer 13 includes, for example, a transparent conductive layer (for example, ITO layer). The upper connection section 13*sg* is formed on the first insulating layer 11, within the contact hole CH_sg1, and within the contact hole CH_sg2, is connected to the source lower connection wiring line 3*sg* within the contact hole CH_sg1, and is connected to the source bus line connection section 7*sg* within the contact hole CH_sg2. For example, here, the upper connection section 13*sg* is in contact with the source lower connection wiring line 3*sg* within the opening 4*sg*1 formed in the gate insulating layer 4, and in contact with the source bus line connection section 7*sg* within the opening 11*sg*2 formed in the first insulating layer 11.

A portion of the source lower connection wiring line 3*sg* exposed by the opening 4*sg*1 is preferably covered by the upper connection section 13*sg*. A portion of the source bus line connection section 7*sg* exposed by the opening 11*sg*2 is preferably covered by the upper connection section 13*sg*.

In the illustrated example, the contact hole CH_sg2 is formed at a position away from the contact hole CH_sg1. The present embodiment is not limited to the illustrated example, and the contact hole CH_sg1 and the contact hole CH_sg2 may be contiguous to each other (that is, may be formed as a single contact hole). The contact hole CH_sg1 and the contact hole CH_sg2 may be formed as a single contact hole in the same process. Specifically, a single contact hole that at least reaches the source lower connection wiring line 3*sg* and source bus line connection section 7*sg* may be formed in the gate insulating layer 4 and first insulating layer 11 to form the upper connection section 13*sg* within this contact hole and on the first insulating layer 11. At this time, the upper connection section 13*sg* is preferably formed to cover a portion of the source lower connection wiring line 3*sg* and source bus line connection section 7*sg* exposed by the contact hole.

As described above, the lower connection section of the source terminal section ST can be formed of the gate metal layer 3 by providing the source-gate connection section SG. The source terminal section ST and the gate terminal section GT which include the lower connection section formed of the gate metal layer 3 are excellent in reliability. Hereinafter, the source terminal section ST is described below, but the same applies to the gate terminal section GT.

In the terminal section, particularly, the terminal section provided outside the seal region Rs (opposite to the liquid crystal layer), corrosion may occur due to atmospheric moisture (which may contain impurities). The atmospheric moisture intrudes from the contact hole at least reaching the lower connection section and at least reaches the lower connection section so that corrosion may occur in the lower connection section. From the viewpoint of suppressing the corrosion occurring, the contact hole that at least reaches the lower connection section is preferably deep. In other words, the thickness of the insulating layer where the opening constituting the contact hole is formed is preferably large.

In a process of fabricating a TFT substrate including a glass substrate as a dielectric substrate, broken pieces or chips (cullets) of the glass substrate may cause scratches or disconnection in the lower connection section of the terminal section. For example, a plurality of TFT substrates are fabricated from one mother substrate. The cullet is generated in cutting the mother substrate or in forming scribe lines in the mother substrate, for example. From the viewpoint of preventing the scratches and disconnection in the lower connection section of the terminal section, the contact hole that at least reaches the lower connection section is preferably deep. In other words, the thickness of the insulating layer where the opening constituting the contact hole is formed is preferably large.

In the source terminal section ST of the TFT substrate 101A, since the lower connection section 3*s*A is included in the gate metal layer 3, the contact hole CH_s that at least reaches the lower connection section 3*s*A includes the opening 4*s* formed in the gate insulating layer 4, the opening 11*s* formed in the first insulating layer 11, and the opening 17*s* formed in the second insulating layer 17. A depth of the contact hole CH_s is a sum of a thickness of the gate insulating layer 4, a thickness of the first insulating layer 11, and a thickness of the second insulating layer 17. In contrast, in a case where the lower connection section is included in the source metal layer 7, for example, the contact hole that at least reaches the lower connection section includes only an opening formed in the first insulating layer 11 and an opening formed in the second insulating layer 17, and a depth of the contact hole is a sum of the thickness of the first insulating layer 11 and the thickness of the second insulating layer 17 and is smaller than the depth of the contact hole CH_s. Here, the depth of the contact hole and the thickness of the insulating layer are respectively a depth and a thickness in the normal direction of the dielectric substrate 1. The same holds for other contact holes and insulating layers unless otherwise specifically described. In this way, the source terminal section ST of the TFT substrate 101A includes the lower connection section 3*s*A included in the gate metal layer 3, and therefore, has excellent reliability as compared with the case that the lower connection section is included in the source metal layer 7, for example.

The opening 4*s* formed in the gate insulating layer 4 is formed to expose only a portion of the lower connection section 3*s*A. The opening 4*s* formed in the gate insulating layer 4 is inside the lower connection section 3*s*A when viewed from the normal direction of the dielectric substrate 1. Therefore, the entire region within the opening 4*s* has a layered structure including the lower connection section 3*s*A and the upper connection section 19*s*A on the dielectric substrate 1. In the source terminal section ST, an entire of a region not including the lower connection section 3*s*A has a layered structure including the gate insulating layer 4, the first insulating layer 11, and the second insulating layer 17. With this configuration, the source terminal section ST of the TFT substrate 101A has excellent reliability. From the viewpoint of obtaining the excellent reliability, the sum of the thicknesses of the gate insulating layer 4, the thickness of the first insulating layer 11, and the thickness of the second insulating layer 17 is preferably large.

A portion of the lower connection section 3*s*A exposed by the opening 4*s* is preferably covered by the upper connection section 19*s*A.

In a case where a thickness of the upper connection section of the terminal section is large (that is, a thickness of the upper connection layer 19 is large), corrosion of the lower connection section is suppressed. In order to effectively suppress the corrosion of the lower connection section, the upper connection layer 19 may have the layered structure including the first upper connection layer including the transparent conductive layer (for example, ITO layer), and the second upper connection layer formed under the first upper connection layer and formed of one layer or two or more layers selected from the group consisting of a Ti layer, a MoNbNi layer, a MoNb layer, a MoW layer, a W layer and a Ta layer, as described above. In order to effectively suppress the corrosion of the lower connection section, the thickness of the second upper connection layer may be over 100 nm, for example.

CS Terminal Section CT

The TFT substrate 101R includes the CS terminal section CT in the non-transmission and/or reception region R2 as illustrated in FIG. 5B. The CS terminal section CT here has the same structure as the source terminal section ST and gate terminal section GT as illustrated in FIG. 5B. The CS terminal section CT may be provided corresponding to each CS bus line CL, for example. Typically, the numbers of CS terminal sections CT and transfer terminal sections are adequately configured in consideration of uniformity of voltages of the CS electrode and the slot electrode. For example, in a case where each CS bus line is supplied with the same voltage as the slot voltage, the TFT substrate 101A may include at least one CS terminal section CT. However, in order to decrease a wiring line resistance, the TFT substrate 101A preferably includes a plurality of CS terminal sections CT. Note that the slot voltage is a ground potential, for example.

As illustrated in FIG. 3B, the CS terminal section CT includes a CS terminal lower connection section 3*c* (also simply referred to as a "lower connection section 3*c*"), an opening 4*c* formed in the gate insulating layer 4, an opening 11*c* formed in the first insulating layer 11, an opening 17*c* formed in the second insulating layer 17, and a CS terminal upper connection section 19*c* (also simply referred to as an "upper connection section 19*c*").

The lower connection section 3*c* is included in the gate metal layer 3. The lower connection section 3*c* is electrically connected to the CS bus line CL. In this example, the lower connection section 3*c* extends from the CS bus line CL and is formed integrally with the CS bus line CL.

The opening 4*c* formed in the gate insulating layer 4 at least reaches the lower connection section 3*c*.

The opening 11*c* formed in the first insulating layer 11 overlaps the opening 4*c* formed in the gate insulating layer 4 when viewed from the normal direction of the dielectric substrate 1.

The opening 17*c* formed in the second insulating layer 17 overlaps the opening 11*c* formed in the first insulating layer 11 when viewed from the normal direction of the dielectric substrate 1. The opening 4*c* formed in the gate insulating layer 4, the opening 11*c* formed in the first insulating layer 11, and the opening 17*c* formed in the second insulating layer 17 constitute the contact hole CH_c.

The upper connection section 19*c* is included in the upper connection layer 19. The upper connection section 19*c* is formed on the second insulating layer 17 and within the contact hole CH_c, and is connected to the lower connection section 3*c* within the contact hole CH_c. For example, the upper connection section 19*c* is in contact with the lower connection section 3*c* within the opening 4*c* formed in the gate insulating layer 4.

An entire of the upper connection section 19*c* may overlap the lower connection section 3*c* when viewed from the normal direction of the dielectric substrate 1.

In this example, the CS terminal section CT does not include the conductive portion included in the source metal layer 7, the conductive portion included in the lower connection layer 13, and the conductive portion included in the patch metal layer 151.

The CS terminal section CT, which includes the lower connection section 3*c* included in the gate metal layer 3, has excellent reliability similar to the source terminal section ST.

Transfer Section PT

The TFT substrate 101A includes the transfer section PT in the seal region Rs (that is, the transfer section PT is provided in a seal portion surrounding the liquid crystal layer) as illustrated in FIG. 5B.

The transfer section PT includes a transfer lower connection section 3*p*1 (also simply referred to as a "lower connection section 3*p*1"), an opening 4*p*1 formed in the gate insulating layer 4, an opening 11*p*1 formed in the first insulating layer 11, a transfer conductive portion 15*p*1 (also simply referred to as a "conductive portion 15*p*1"), an opening 17*p*1 formed in the second insulating layer 17, and a transfer upper connection section 19*p*1 (also simply referred to as the "upper connection section 19*p*1"), as illustrated in FIG. 5B, FIG. 6B, and FIG. 7B.

The lower connection section 3*p*1 is included in the gate metal layer 3. That is, the lower connection section 3*p*1 is formed of the same conductive film as that of the gate bus line GL. The lower connection section 3*p*1 is electrically separate from the gate bus line GL. For example, in a case where the CS bus line CL is supplied with the same voltage as the slot voltage, the lower connection section 3*p*1 is electrically connected to, for example, the CS bus line CL. As is illustrated, the lower connection section 3*p*1 may extend from the CS bus line. However, the lower connection section 3*p*1 is not limited to the illustrated example and may be electrically separate from the CS bus line.

The opening 4*p*1 formed in the gate insulating layer 4 at least reaches the lower connection section 3*p*1.

The opening 11*p*1 formed in the first insulating layer 11 overlaps the opening 4*p*1 formed in the gate insulating layer 4 when viewed from the normal direction of the dielectric substrate 1. The opening 4*p*1 formed in the gate insulating layer 4 and the opening 11*p*1 formed in the first insulating layer 11 constitute a contact hole CH_p1.

The conductive portion 15*p*1 is included in the patch metal layer 151. The conductive portion 15*p*1 is formed on the first insulating layer 11 and within the contact hole CH_p1, and is electrically connected to the lower connection section 3*p*1 within the contact hole CH_p1. Here, the conductive portion 15*p*1 is in contact with the lower connection section 3*p*1 within the opening 4*p*1.

The opening (contact hole) 17*p*1 formed in the second insulating layer 17 at least reaches the second conductive portion 15*p*1.

The upper connection section 19*p*1 is included in the upper connection layer 19. The upper connection section 19*p*1 is formed on the second insulating layer 17 and within the opening 17*p*1, and is electrically connected to the conductive portion 15*p*1 within the opening 17*p*1. Here, the upper connection section 19*p*1 is in contact with the conductive portion 15*p*1 within the opening 17*p*1. The upper connection section 19*p*1 is connected to the transfer terminal connection section on the slot substrate side by, for example, a sealing member including conductive particles.

In this example, the transfer section PT does not include the conductive portion included in the source metal layer 7.

The transfer section PT includes the conductive portion 15*p*1 between the lower connection section 3*p*1 and the upper connection section 19*p*1. This allows the transfer section PT to have an advantage that an electric resistance between the lower connection section 3*p*1 and the upper connection section 19*p*1 is low.

An entire of the upper connection section 19*p*1 may overlap the conductive portion 15*p*1 when viewed from the normal direction of the dielectric substrate 1.

In this example, the lower connection section 3*p*1 is disposed between two gate bus lines GL adjacent to each other. Two lower connection sections 3*p*1 disposed with the gate bus line GL being interposed therebetween may be electrically connected to each other via a conductive connection section (not illustrated). The conductive connection section may be formed of the same conductive film as that of the source bus line, for example.

Here, a plurality of contact holes CH_p1 are provided so that the lower connection section 3*p*1 is connected to the upper connection section 19*p*1 with the conductive portion 15*p*1 interposed therebetween, but one or more contact holes CH_p1 may be provided to one lower connection section 3*p*1. One contact hole may be provided to one lower connection section 3*p*1. The number of contact holes or the shapes thereof are not limited to the illustrated example.

Here, the upper connection section 19*p*1 is connected to the conductive portion 15*p*1 through one opening 17*p*1, but one or more openings 17*p*1 may be provided to one upper connection section 19*p*1. A plurality of openings may be provided to one upper connection section 19*p*1. The number of openings or the shapes thereof are not limited to the illustrated example.

Manufacturing Method of TFT Substrate 101R of Reference Example 1

A method for manufacturing the TFT substrate 101R of Reference Example 1 will be described with reference to FIG. 9A to FIG. 16C.

FIGS. 9A to 9F, FIGS. 10A to 10F, FIGS. 11A to 11D, FIGS. 12A to 12D, FIGS. 13A to 13C, FIGS. 14A to 14C, FIGS. 15A to 15C, and FIGS. 16A to 16C are schematic cross-sectional views for describing the method for manufacturing the TFT substrate 101R of Reference Example 1. These figures illustrate a cross section taken along a line A-A' illustrated in FIG. 3A, a cross section taken along line B-B' illustrated in FIG. 3B, a cross section along the line C-C' illustrated in FIG. 3C, a cross section taken along a line D-D' illustrated in FIG. 3D, a cross section taken along line F-F' illustrated in FIG. 3B, a cross section taken along a line G-G' illustrated in FIG. 3C, and a cross section taken along a line H-H' illustrated in FIG. 3D.

Figures 9A, 9B, 9C, 9D, 9E, 9F:
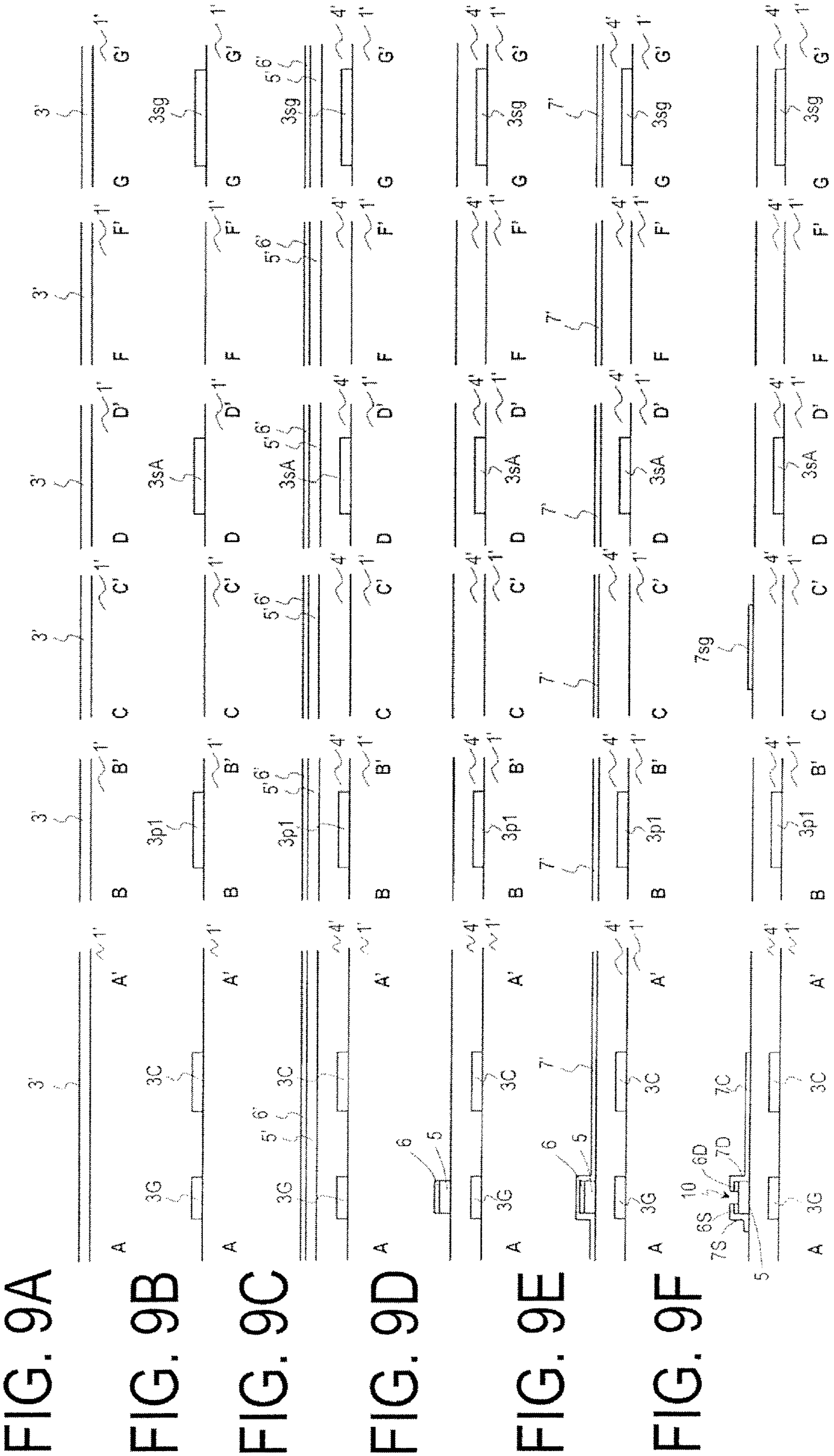
FIGS. 9A to 9F are schematic cross-sectional views for describing a method for manufacturing the TFT substrate 101R of Reference Example 1.
Figures 10A, 10B, 10C, 10D, 10E, 10F:
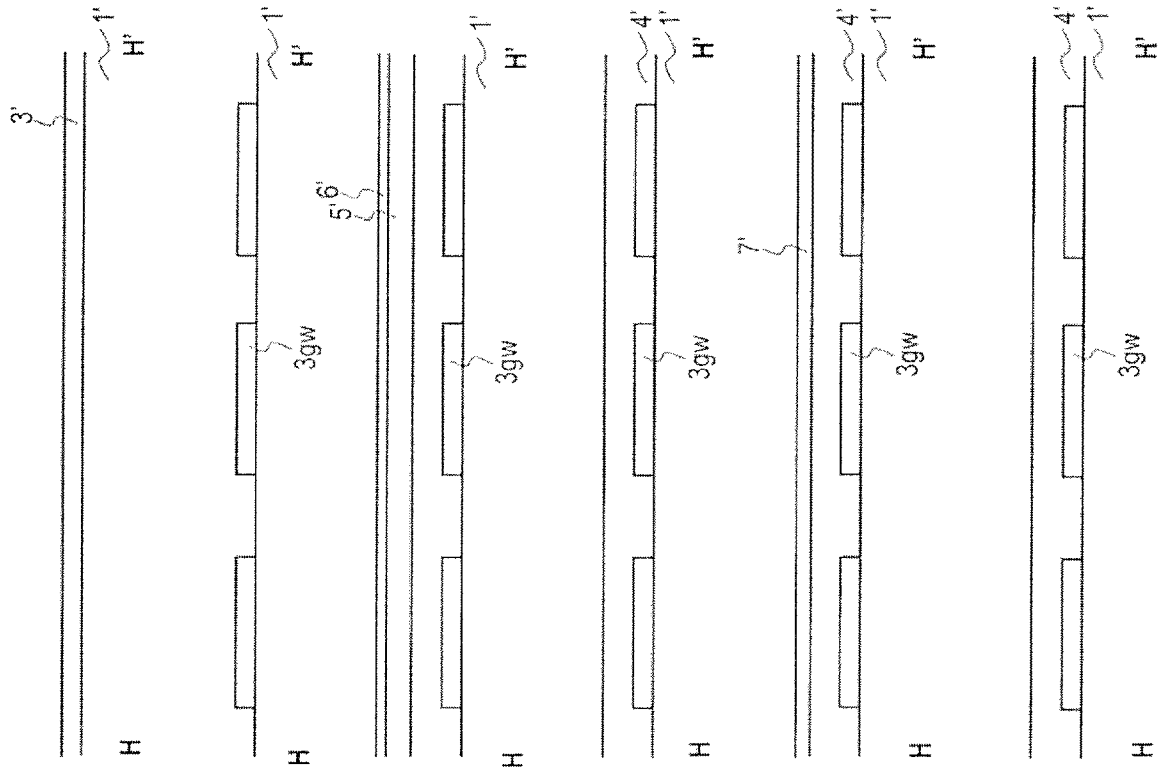
FIGS. 10A to 10F are schematic cross-sectional views for describing the method for manufacturing the TFT substrate 101R of Reference Example 1.

First, as illustrated in FIG. 9A and FIG. 10A, a gate conductive film 3' is formed on the mother dielectric substrate 1' (here, a mother glass substrate 1') by sputtering or the like. Here, as the gate conductive film 3', a layered film (MoN/Al) is formed by layering an Al film (having a thickness of 150 nm, for example) and a MoN film (having a thickness of 100 nm, for example) in this order. The mother glass substrate 1' has a larger size (planar shape) than the dielectric substrate 1 of the TFT substrate 101R finally fabricated.

Next, the gate conductive film 3' is patterned to obtain the gate metal layer 3 including the gate electrode 3G, the gate bus line GL, the CS bus line CL, the lower auxiliary capacitance electrode 3C, the source lower connection wiring line 3*sg*, the lower connection sections 3*p*1, 3*g*A, 3*c*, and 3*s*A, and the wiring line sections 3*gw* and 3*sw* as illustrated in FIG. 9B and FIG. 10B. The gate metal layer 3 further includes the short circuit wiring line SR that electrically connects the respective lower connection sections 3*g*A (3*s*A) via the wiring line sections 3*gw* (3*sw*). Here, patterning of the gate conductive film 3' is performed by wet etching.

After that, as illustrated in FIG. 9C and FIG. 10C, the gate insulating film 4', an intrinsic amorphous silicon film 5', and an $n^+$ type amorphous silicon film 6' are formed in this order to cover the gate metal layer 3. Here, as the gate insulating film 4', a silicon nitride ($Si_xN_y$) film having a thickness of 350 nm, for example, is formed. The intrinsic amorphous silicon film 5' having a thickness of 120 nm, for example, and the $n^+$ type amorphous silicon film 6' having a thickness of 30 nm, for example, are formed. The gate insulating film 4' is formed, for example, on substantially an entire surface of the mother dielectric substrate 1', but may be formed at least in a region (a region inside the cutting line CP) that is at least to be the TFT substrate 101R. The gate insulating film 4' is formed to cover at least all of the lower connection section 3*g*A (3*s*A) and a portion of the wiring line section 3*gw* (3*sw*).

Next, the intrinsic amorphous silicon film 5' and the $n^+$ type amorphous silicon film 6' are patterned to obtain the island-shaped semiconductor layer 5 and the contact layer 6 as illustrated in FIG. 9D and FIG. 10D. Note that the semiconductor film used for the semiconductor layer 5 is not limited to an amorphous silicon film. For example, an oxide semiconductor layer may be formed as the semiconductor layer 5. In this case, it is not necessary to provide a contact layer between the semiconductor layer 5, and the source electrode and drain electrode.

Next, a source conductive film 7' is formed on the gate insulating film 4' and on the contact layer 6 as illustrated in FIG. 9E and FIG. 10E. Here, as the source conductive film 7', a layered film (MoN/Al/MoN) is formed by layering MoN (having a thickness of 50 nm, for example), Al (having a thickness of 150 nm, for example), and MoN (having a thickness of 100 nm, for example) in this order.

Next, the source conductive film 7' is patterned to form the source metal layer 7 including the source electrode 7S and the drain electrode 7D, the source bus line SL, the upper auxiliary capacitance electrode 7C, and the source bus line connection section 7*sg* as illustrated in FIG. 9F and FIG. 10F. At this time, the contact layer 6 is also etched, and the source contact layer 6S and the drain contact layer 69 separated from each other are formed. Here, patterning of the source conductive film 7' is performed by wet etching. For example, an aqueous solution containing phosphoric acid, nitric acid, and acetic acid is used to simultaneously pattern the MoN film and the Al film by wet etching. In this manner, the TFT 10 is obtained.

Here, in the source-gate connection section formation region, the source metal layer 7 is formed such that at least a portion of the source lower connection wiring line 3*sg* does not overlap the source bus line connection section 7*sg*. Each terminal section formation region does not include the conductive portion included in the source metal layer 7.

Figures 11A, 11B, 11C, 11D:
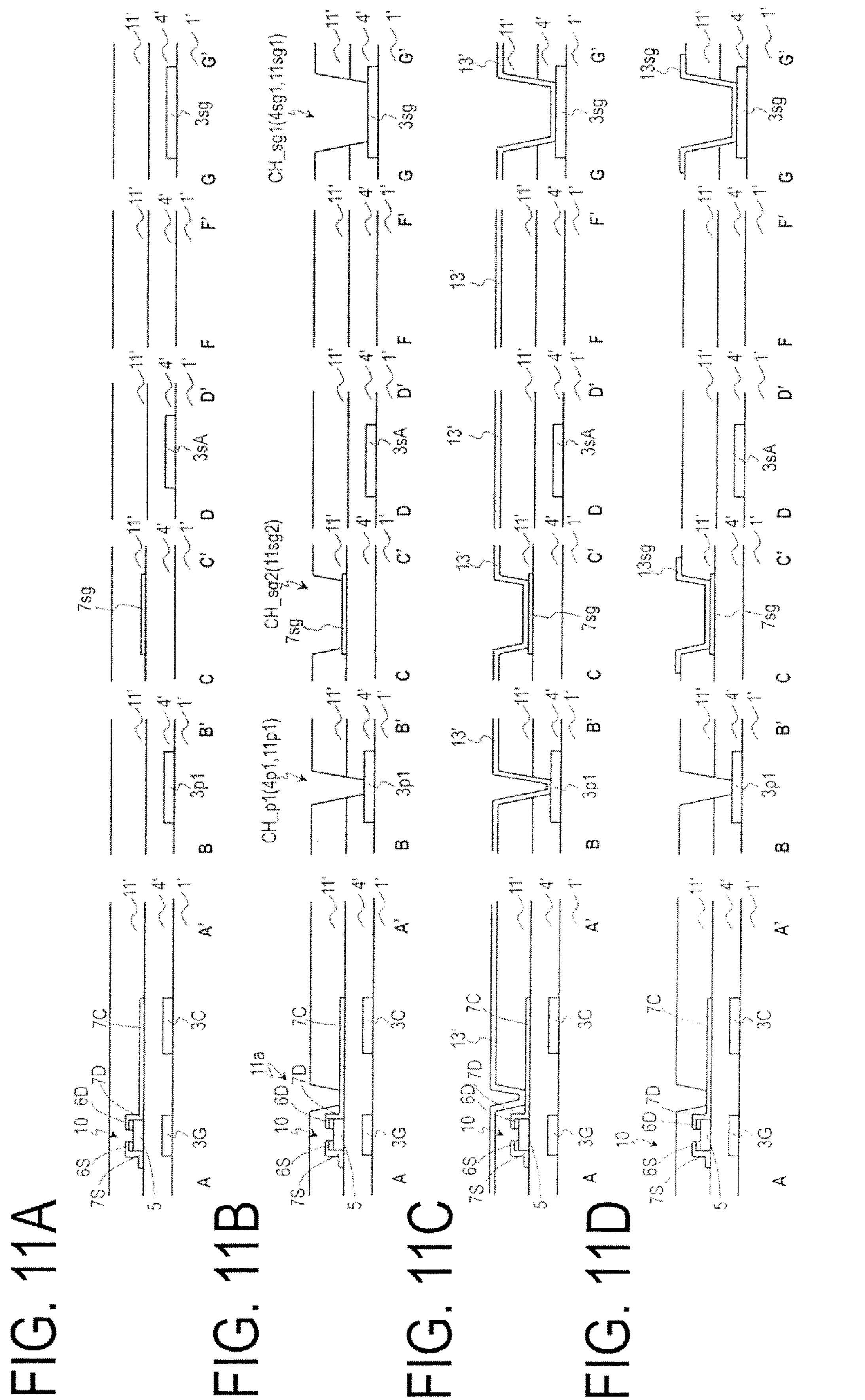
FIGS. 11A to 11D are schematic cross-sectional views for describing the method for manufacturing the TFT substrate 101R of Reference Example 1.
Figures 12A, 12B, 12C, 12D:
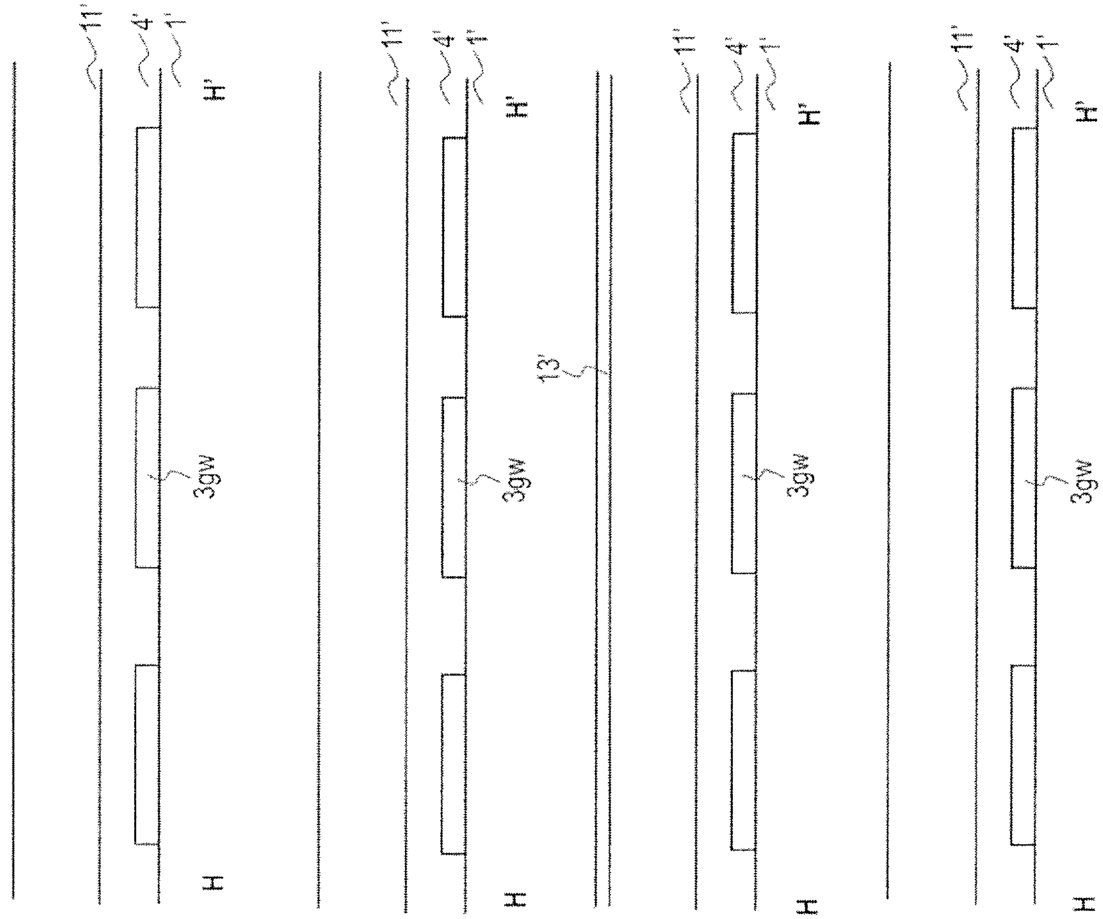
FIGS. 12A to 12D are schematic cross-sectional views for the method for manufacturing the TFT substrate 101R of Reference Example 1.

Next, as illustrated in FIG. 11A and FIG. 12A, the first insulating film 11' is formed to cover the TFT 10 and the source metal layer 7. In this example, the first insulating film 11' is formed to be in contact with the channel region of the semiconductor layer 5. Here, as the first insulating film 11', a silicon nitride ($Si_xN_y$) film having a thickness of 330 nm, for example, is formed.

Next, the first insulating film 11' and the gate insulating film 4' are etched through a known photolithography process to form an opening in the first insulating film 11' and the gate insulating film 4' as illustrated in FIG. 11B and FIG. 12B. Specifically, formed are the opening 11*a* that at least reaches an extending section of the drain electrode 7D in an antenna unit formation region, the contact hole CH_sg1 that at least reaches the source lower connection wiring line 3*sg* and the opening 11*sg*2 (contact hole CH_sg2) that at least reaches the source bus line connection section 7*sg* in the source-gate connection section formation region, and the contact hole CH_p1 that at least reaches the lower connection section 3*p*1 in a transfer section formation region.

In this etching process, the source metal layer 7 is used as an etch stop to etch the first insulating film 11' and the gate insulating film 4'. For example, in the source-gate connection section formation region, the first insulating film 11' and the gate insulating film 4' are collectively etched in a contact hole CH_sg formation region, and the source bus line connection section 7*sg* functions as an etch stop to etch only the first insulating film 11' in an opening 11*sg*2 formation region. This allows the contact hole CH_sg and the opening 11*sg*2 to be obtained. The contact hole CH_sg includes the opening 4*sg*1 that is formed in the gate insulating film 4' and at least reaches the source lower connection wiring line 3*sg*, and the opening 11*sg*1 that is formed in the first insulating film 11' and overlaps the opening 4*sg*1. Here, since at least a portion of the source lower connection wiring line 3*sg* is formed not to overlap the source bus line connection section 7*sg*, the contact hole CH_sg including the opening 4*sg*1 and the opening 11*sg*1 is formed. A side surface of the opening 4*sg*1 and a side surface of the opening 11*sg*1 may be aligned on a side surface of the contact hole CH_sg.

The first insulating film 11' and the gate insulating film 4' are collectively etched using the same etchant, for example. Here, the first insulating film 11' and the gate insulating film 4' are etched by dry etching using a fluorine gas. The first insulating film 11' and the gate insulating film 4' may be etched using different etchants.

Among the contact holes formed in this process, in the contact hole including the opening formed in the first insulating film 11' and the opening formed in the gate insulating film 4', a side surface of the opening formed in the first insulating film 11' and a side surface of the opening formed in the gate insulating film 4' may be aligned.

In the transfer section formation region, since the conductive portion included in the source metal layer 7 is not formed, the first insulating film 11' and the gate insulating film 4' are collectively etched to form the contact hole CH_p1. The contact hole CH_p1 includes the opening 4*p*1 that is formed in the gate insulating film 4' and at least reaches the lower connection section 3*p*1, and the opening 11*p*1 that is formed in the first insulating film 11' and overlaps the opening 4*p*1. A side surface of the opening 4*p*1 and a side surface of the opening 11*p*1 may be aligned on a side surface of the contact hole CH_p1.

Next, as illustrated in FIG. 11C and FIG. 12C, a lower connection conductive film 13' is formed on the first insulating film 11', within the opening 11*a*, within the contact hole CH_sg, within the opening 11*sg*2, and within the contact hole CH_p1 by sputtering, for example. The lower connection conductive film 13' includes a transparent conductive film, for example. Here, an ITO film having a thickness of, for example, 70 nm is used as the lower connection conductive film 13'.

Next, the lower connection conductive film 13' is patterned to form the lower connection layer 13 as illustrated in FIGS. 110 and 120. Specifically, formed in the source-gate connection section formation region is the upper connection section 13*sg* that is in contact with the source lower connection wiring line 3*sg* within the contact hole CH_sg and is in contact with the source bus line connection section 7*sg* within the opening 11*sg*2. Here, the upper connection section 13*sg* is formed to cover a portion of the source lower connection wiring line 3*sg* exposed by the opening 4*sg*1 and cover a portion of the source bus line connection section 7*sg* exposed by the opening 11*sg*2. The lower connection conductive film 13' is patterned using, for example, oxalic acid.

Figure 13A:
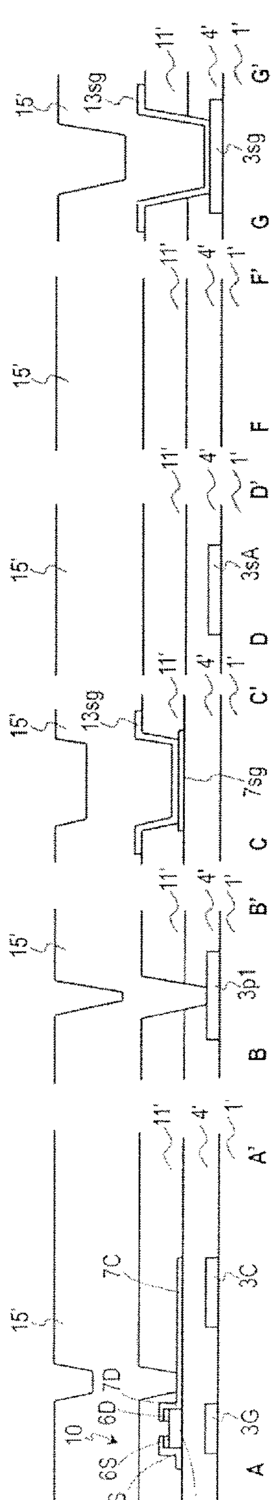
FIGS. 13A to 13C are schematic cross-sectional views for describing the method for manufacturing the TFT substrate 101R of Reference Example 1.
Figure 14A:
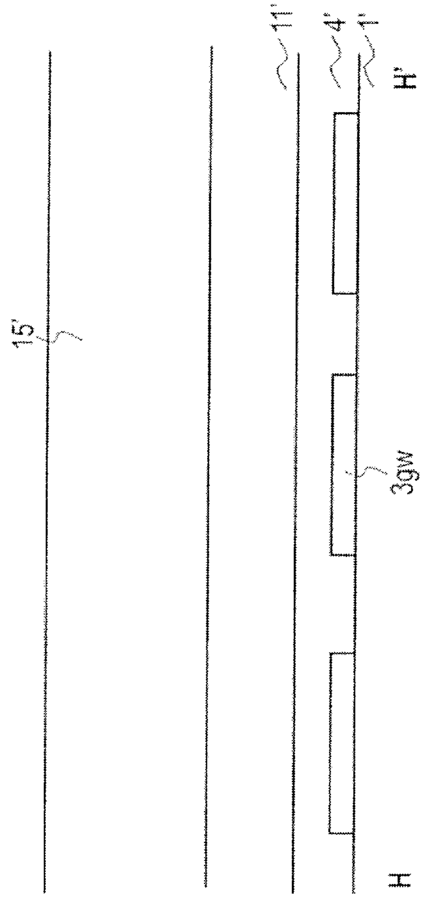
FIGS. 14A to 14C are schematic cross-sectional views for describing the method for manufacturing the TFT substrate 101R of Reference Example 1.

Subsequently, as illustrated in FIG. 13A and FIG. 14A, a patch conductive film 15' is formed on the first insulating film 11' and on the lower connection layer 13. Here, as the patch conductive film 15', a layered film (Cu/Ti) is used which includes a Ti film (having a thickness of 20 nm, for example) and a Cu film (having a thickness of 500 nm, for example) in this order. Alternatively, as the patch conductive film 15', a layered film (MoN/Al/MoN) may be used which is formed by layering a MoN layer (having a thickness of 50 nm, for example), an Al layer (having a thickness of 1000 nm, for example), and a MoN layer (having a thickness of 50 nm, for example) in this order.

Figure 13B:
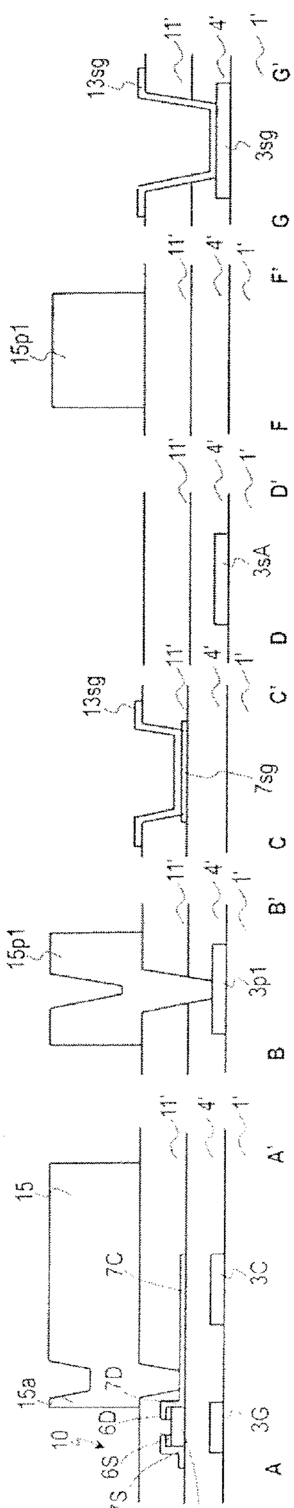
Figure 14B:
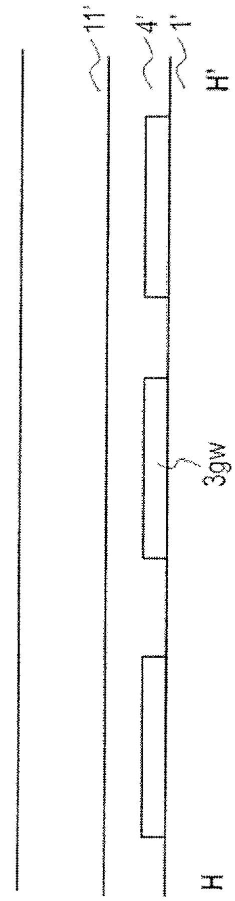

Next, the patch conductive film 15' is patterned to form the patch metal layer 151 as illustrated in FIG. 13B and FIG. 14B. Specifically, the patch metal layer 151 is obtained which includes the patch electrode 15 and the connection section 15*a* in the antenna unit region formation region, and the conductive portion 15*p*1 in the transfer section formation region. The connection section 15*a* in the antenna unit formation region is formed to be connected to the extending section of the drain electrode 7D within the opening 11*a*. The conductive portion 15*p*1 in the transfer section formation region is formed to be connected to the lower connection section 3*p*1 within the contact hole CH_p1. To pattern the patch conductive film 15', an acid mixed aqueous solution can be used as an etching solution, for example.

The patch conductive film 15' in the source-gate connection section formation region is removed in the process of patterning the patch conductive film 15'. Since the upper connection section 13*sg* is formed within the contact hole CH_sg and within the opening 11*sg*2, damage by etching to the source lower connection wiring line 3*sg* and/or source bus line connection section 7*sg* is reduced in the process of patterning the patch conductive film 15'.

Here, a portion of the source lower connection wiring line 3*sg* exposed by the contact hole CH_sg is covered by the upper connection section 13*sg*, and a portion of the source bus line connection section 7*sg* exposed by the opening 11*sg*2 is covered by the upper connection section 13*sg*. This effectively reduces the etching damage to the source bus line connection section 7*sg* and/or source lower connection wiring line 3*sg*.

Figure 13C:
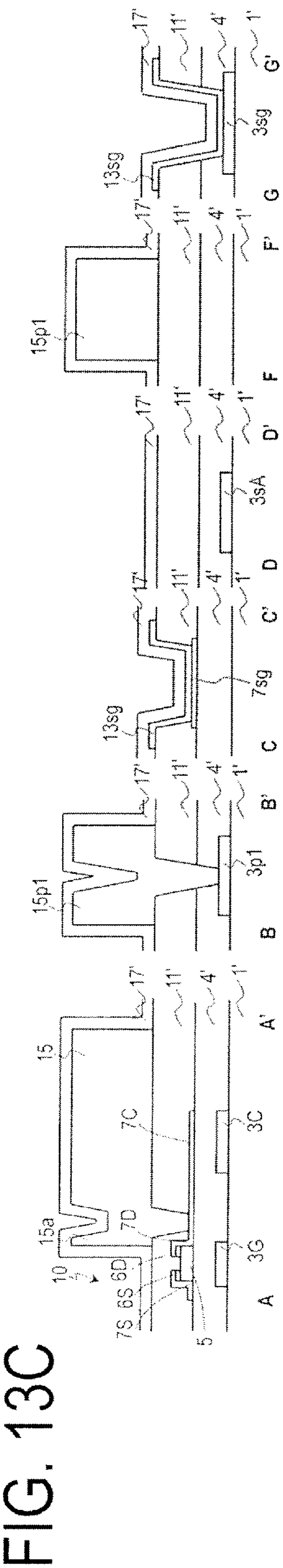
Figure 14C:
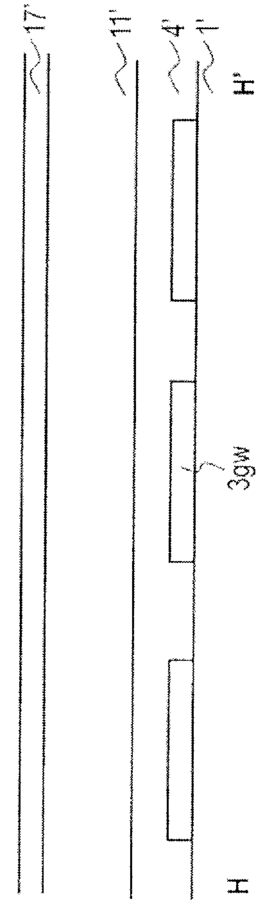

Next, as illustrated in FIGS. 13C and 14C, the second insulating film 17' is formed on the patch metal layer 151, on the lower connection layer 13, and on the first insulating film 11'. Here, as the second insulating film 17', a silicon nitride ($Si_xN_y$) film having a thickness of 100 nm, for example, is formed.

Figures 15A, 15B, 15C:
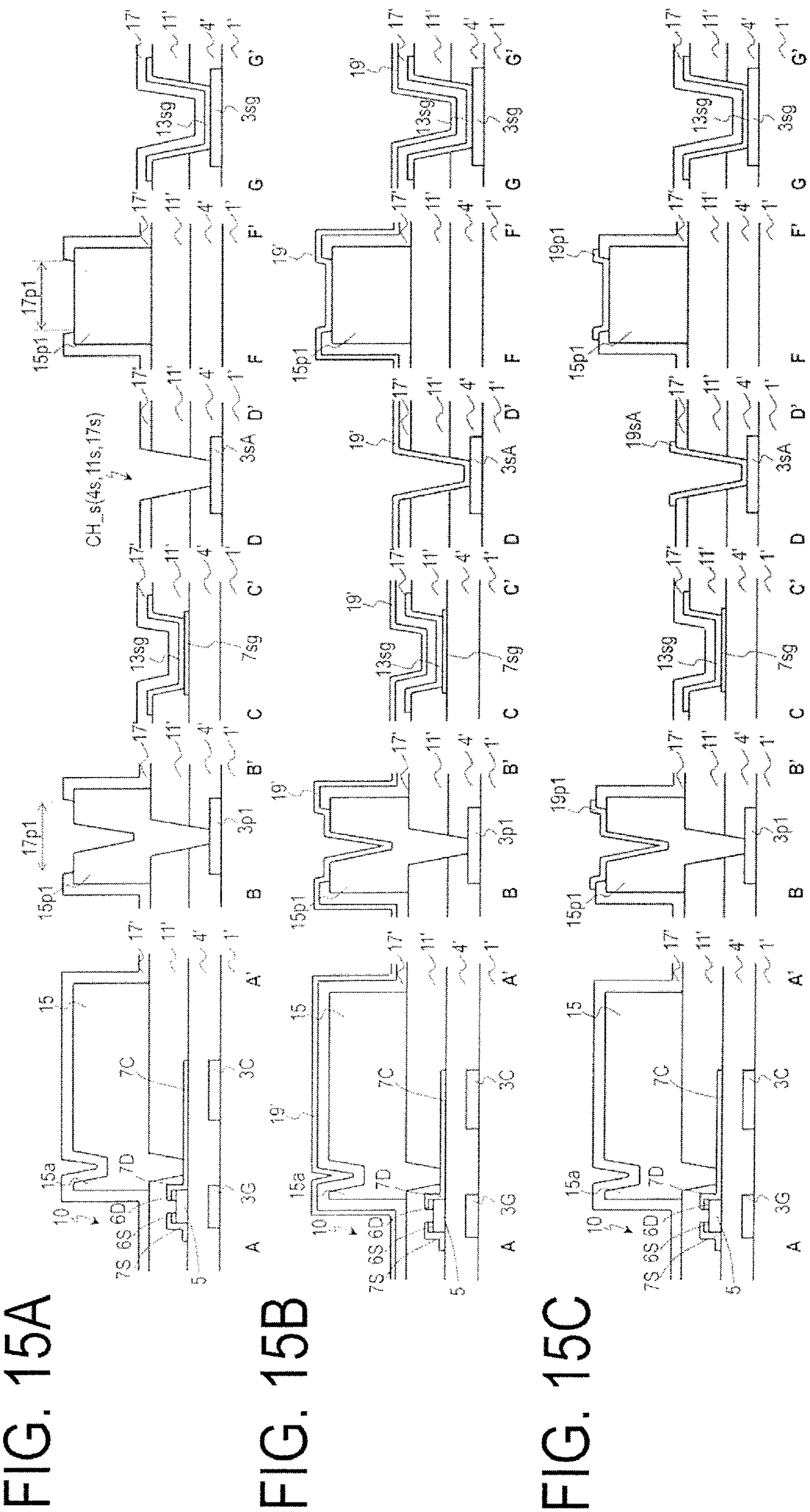
FIGS. 15A to 15C are schematic cross-sectional views for describing the method for manufacturing the TFT substrate 101R of Reference Example 1.
Figure 16A:
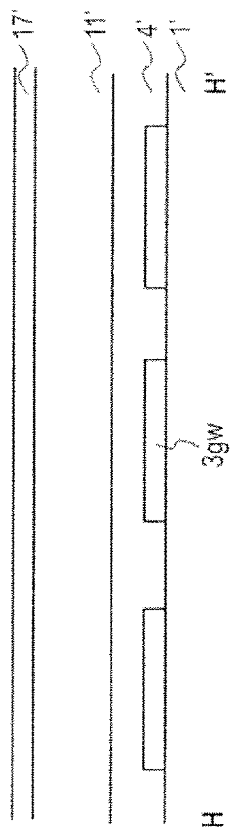
FIGS. 16A to 16C are schematic cross-sectional views for describing the method for manufacturing the TFT substrate 101R of Reference Example 1.

Subsequently, the second insulating film 17', the first insulating film 11', and the gate insulating film 4' are etched through a known photolithography process as illustrated in FIG. 15A and FIG. 16A. Specifically, formed are the contact hole CH_s that at least reaches the lower connection section 3*s*A in a source terminal section formation region, the contact hole CH_g that at least reaches the lower connection section 3*g*A in a gate terminal section formation region, the contact hole CH_c that at least reaches the lower connection section 3*c* in a CS terminal section formation region, and the opening 17*p*1 that at least reaches the conductive portion 15*p*1 in the transfer section formation region. Here, the second insulating film 17', the first insulating film 11', and the gate insulating film 4' are etched by dry etching using a fluorine-based gas, for example.

In the source terminal section formation region, the second insulating film 17', the first insulating film 11', and the gate insulating film 4' are collectively etched to form the contact hole CH_s, for example. The contact hole CH_s includes the opening 4*s* that is formed in the gate insulating layer 4 and at least reaches the lower connection section 3*s*A, the opening 11*s* that is formed in the first insulating layer 11 and overlaps the opening 4*s*, and the opening 17*s* that is formed in the second insulating film 17' and overlaps the opening 11*s*. A side surface of the opening 4*s*, a side surface of the opening 11*s*, and a side surface of the opening 17*s* may be aligned on a side surface of the contact hole CH_s.

Similarly, in the gate terminal section formation region, the second insulating film 17', the first insulating film 11', and the gate insulating film 4' are collectively etched, for example, to form the contact hole CH_g. The contact hole CH_g includes the opening 4*g* that is formed in the gate insulating layer 4 and at least reaches the lower connection section 3*g*A, the opening 11*g* that is formed in the first insulating layer 11 and overlaps the opening 4*g*, and the opening 17*g* that is formed in the second insulating film 17' and overlaps the opening 11*g*. A side surface of the opening 4*g*, a side surface of the opening 11*g*, and a side surface of the opening 17*g* may be aligned on a side surface of the contact hole CH_g.

In the CS terminal section formation region, the second insulating film 17', the first insulating film 11', and the gate insulating film 4' are collectively etched, for example, to form the contact hole CH_c. The contact hole CH_c includes the opening 4*c* that is formed in the gate insulating layer 4 and at least reaches the lower connection section 3*c*, the opening 11*c* that is formed in the first insulating layer 11 and overlaps the opening 4*c*, and the opening 17*c* that is formed in the second insulating film 17' and overlaps the opening 11*c*. A side surface of the opening 4*c*, a side surface of the opening 11*c*, and a side surface of the opening 17*c* may be aligned on a side surface of the contact hole CH_c.

Figure 16B:
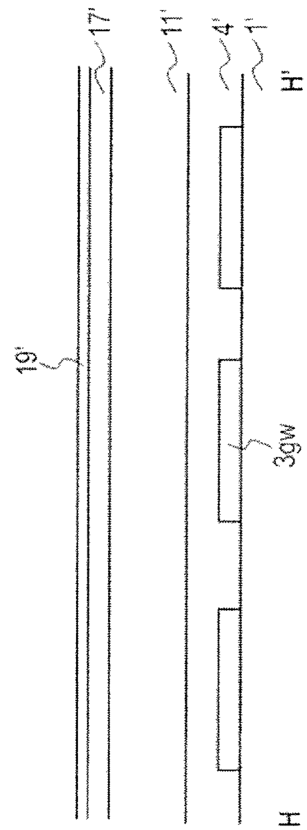

Next, as illustrated in FIG. 15B and FIG. 16B, an upper connection conductive film 19' is formed on the second insulating film 17', within the contact hole CH_s, within the contact hole CH_g, within the contact hole CH_c, and within the opening 17*p*1 by sputtering, for example. The upper connection conductive film 19' includes a transparent conductive film, for example. Here, an ITO film having a thickness of, for example, 70 nm is used as the upper connection conductive film 19'.

Figure 16C:
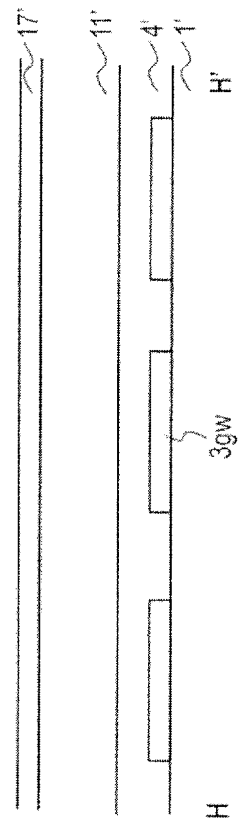

Next, the upper connection conductive film 19' is patterned to form the upper connection layer 19 as illustrated in FIG. 15C and FIG. 16C. This allows the mother TFT substrate 100R to be obtained. Specifically, formed are the upper connection section 19*s*A in contact with the lower connection section 3*s*A within the contact hole CH_s in the source terminal section formation region, the upper connection section 19*g*A in contact with the lower connection section 3*g*A within the contact hole CH_g in the gate terminal section formation region, the upper connection section 19*c* in contact with the lower connection section 3*c* within the contact hole CH_c in the CS terminal section formation region, and the upper connection section 19*p*1 in contact with the second conductive portion 15*p*1 within the opening 17*p*1 in the transfer section formation region.

After that, the mother TFT substrate 101R of Reference Example 1 is obtained by cutting the mother TFT substrate 100R along the cutting line CP. The dielectric substrate 1 is obtained by cutting the mother glass substrate 1' along the cutting line CP. The conductive layer or insulating layer that is present on the cutting line CP is cut together with the mother glass substrate 1'. Here, the wiring line sections 3*gw* and 3*sw*, the gate insulating film 4', the first insulating film 11', and the second insulating film 17', which are present on the cutting line CP, are also cut along the cutting line CP to obtain the wiring line sections 3*gw* and 3*sw*, the gate insulating layer 4, the first insulating layer 11, and the second insulating layer 17. The edges of the wiring line sections 3*gw* and 3*sw*, the edge of the gate insulating layer 4, the edge of the first insulating layer 11, and the edge of the second insulating layer 17 which are defined by the cutting line CP substantially conform to each other.

At this time, the cutting line CP cuts the low resistance metal layer (for example, the Al layer) included in the gate metal layer 3 (wiring line sections 3*gw* and 3*sw*). By doing so, as described above, the low resistance metal layer is exposed on the cutting surface, which may lead to the problem that adjacent wiring line sections are shorted.

Manufacturing Method of TFT Substrate 101A

A method for manufacturing the TFT substrate 101A according to Embodiment 1-1 will be described with reference to FIG. 17A to FIG. 20C. According to the manufacturing method described below, the TFT substrate 101A improved in reliability is obtained while suppressing an increase in manufacturing cost (for example, the number of photomasks).

FIGS. 17A to 17E, FIGS. 18A to 18C, and FIGS. 19A to 19C, and FIGS. 20A to 20C are schematic cross-sectional views for describing the method for manufacturing the TFT substrate 101A. These figures illustrate a cross section taken along a line A-A' illustrated in FIG. 5A, a cross section taken along a line C-C' illustrated in FIG. 5C, a cross section taken along a line G-G' illustrated in FIG. 5C, a cross section taken along a line H-H' illustrated in FIG. 5D, and a cross section taken along a line J-J' in FIG. 5D. Differences from the TFT substrate 101R of Reference Example 1 will be mainly described.

Figures 17A, 17B, 17C, 17D, 17E:
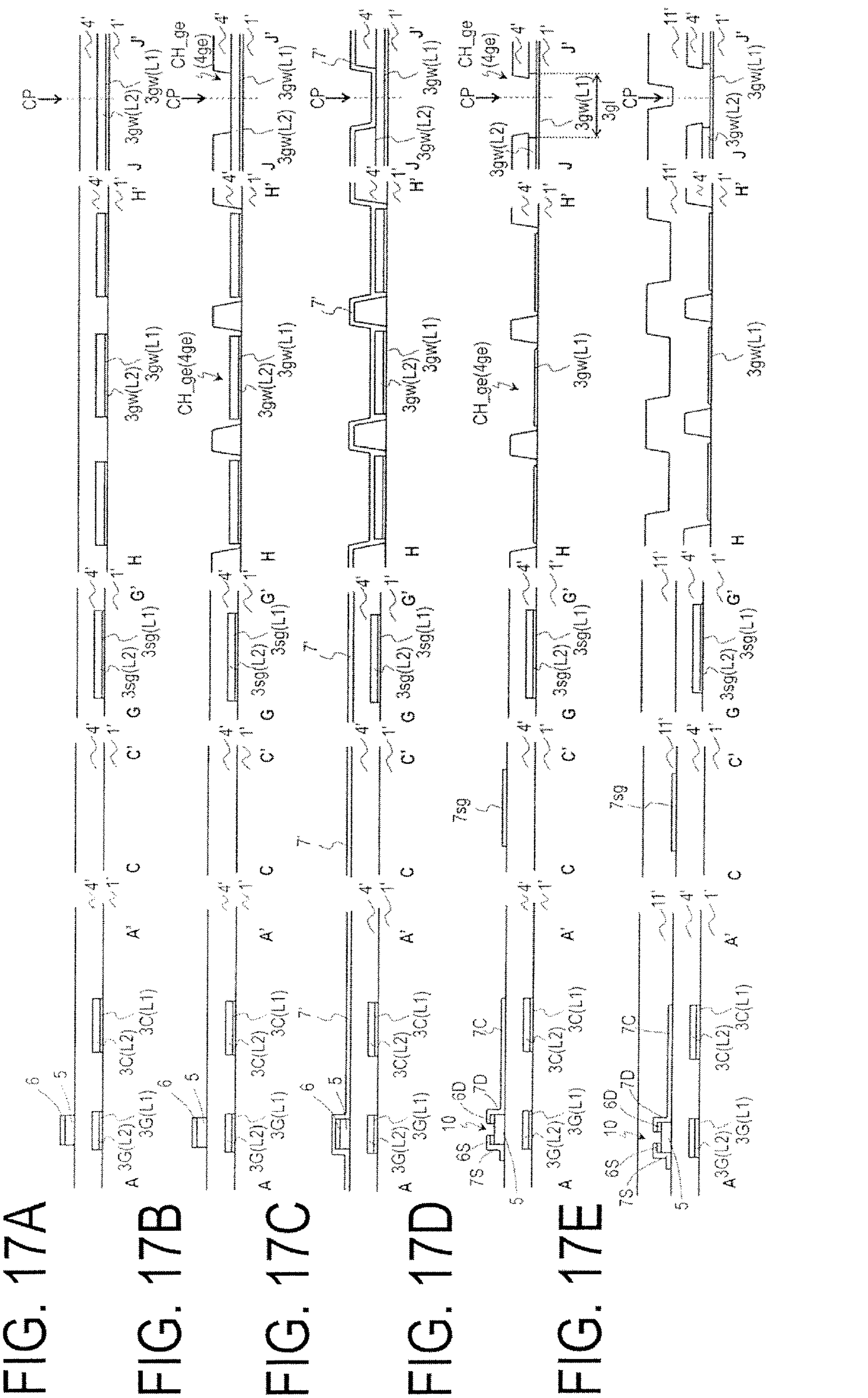
FIGS. 17A to 17E are schematic cross-sectional views for describing a method for manufacturing the TFT substrate 101A.

First, as illustrated in FIG. 17A, formed on the mother glass substrate 1' are the gate metal layer 3, the gate insulating film 4', the semiconductor layer 5, and the contact layer 6. Here, the gate conductive film for forming the gate metal layer 3 has a layered structure in which a first conductive film for forming the first conductive layer L1 and a second conductive film for forming the second conductive layer L2 are layered in this order. The first conductive film contains at least one selected from the group consisting of Ti, Ta, W, MoNb, Nb, Ni, In—Sn—C based oxide, In—Zn—O based oxide, and In—Ga—Zn—O based oxide, and the second conductive film is formed on the first conductive film and contains at least one selected from the group consisting of Cu, Al, Ag, and An. Here, a Ti film (having a thickness of 100 nm, for example) is formed as the first conductive film for forming the first conductive layer L1, and a layered film (MoN/Al) is used which is formed by layering an Al film (having a thickness of 150 nm, for example) and a MoN film (having a thickness of 100 nm, for example) in this order as the second conductive film for forming the second conductive layer L2. In this case, the gate metal layer 3 includes a Ti layer as the first conductive layer L1, and a layer (MoN/Al), as the second conductive layer L2, formed by layering an Al layer and a MoN layer in this order. Specifically, the gate metal layer 3 includes a layer (MoN/Al/Ti) formed by layering a Ti layer, an Al layer, and a MoN layer in this order.

Alternatively, a Ti film (having a thickness of 50 nm, for example) may be used as the first conductive film for forming the first conductive layer L1, and a Cu film (having a thickness of 150 nm, for example) may be used as the second conductive film for forming the second conductive layer L2. In this case, the gate metal layer 3 includes a layer (Cu/Ti) formed by layering a Ti layer and a Cu layer in this order.

Next, as illustrated in FIG. 17B, the opening 4*ge* that at least reaches the wiring line section 3*gw* is formed in the gate insulating film 4'. The openings 4*ge* is formed to cover at least a portion of the wiring line section 3*gw* that is present on the cutting line CP when viewed from the normal direction of the mother glass substrate 1'. Here, the gate insulating film 4' is etched by dry etching by using a fluorine gas. Similarly, although not illustrated, the opening 4*se* that at least reaches the wiring line section 3*sw* is formed in the gate insulating film 4' (a cross section taken along a line K-K' in FIG. 5D). The opening 4*se* is formed to cover at least a portion of the wiring line section 3*sw* that is present on the cutting position CP when viewed from the normal direction of the mother glass substrate 1'.

Next, as illustrated in FIG. 17C, a source conductive film 7' is formed on the gate insulating film 4', within the opening 4*ge*, within the opening 4*se*, and on the contact layer 6. The source conductive film 7' is in contact with the wiring line section 3*gw* and the wiring line section 3*sw* within the opening 4*ge* and within the opening 4*se*, respectively.

Next, the source conductive film 7' and the contact layer 6 are patterned to obtain the source metal layer 7, and the source contact layer 6S and the drain contact layer 6D as illustrated in FIG. 17D. At this time, the second conductive layer L2 of the wiring line section 3*gw* exposed from the gate insulating film 4' within the opening 4*ge* is also patterned and removed. Similarly, the second conductive layer L2 of the wiring line section 3*sw* exposed from the gate insulating film 4' within the opening 4*se* is also patterned and removed. The second conductive layer L2 present at least on the cutting position CP is removed. The second conductive layer L2 and the source conductive film 7' can be patterned using the same photomask. At this time, the portion of the second conductive layer L2 under the gate insulating film 4' serving as an etching mask is also etched (undercut) by side etching as illustrated in FIG. 17D.

In this example, since the second conductive layer L2 (MoN/Al) is formed of the same material as the source conductive film 7' (MoN/Al/MoN), etching of the second conductive layer L2 can be performed using the same etchant as the source conductive film 7'. In a case that the second conductive layer L2 is formed of the same material as the source conductive film 7', the same etchant can be used without problems.

In a case that a Cu layer is used as the second conductive layer L2 of the gate metal layer 3, a layered film (Cu/Ti) including a Ti film and a Cu film in this order can be used as the source conductive film 7', for example. The source conductive film 7' and the second conductive layer L2 may be patterned as follows, for example. After the Cu film of the source conductive film 7' is patterned by wet etching, the Ti film of the source conductive film 7' is patterned by dry etching, and then, the second conductive layer L2 (Cu layer) is patterned by wet etching. The Cu film of the source conductive film 7' and the second conductive layer L2 (Cu layer) can be etched using the same etchant.

By performing the above processes, when the mother TFT substrate 100A is cut along the cutting line CP at the end of the manufacturing process, the second conductive layer L2 is not exposed on the cutting surface. In addition, since the removal of the second conductive layer L2 is performed in the same process as the patterning of the source conductive film 7', the TFT substrate improved in reliability is obtained while suppressing an increase in manufacturing cost (for example, the number of photomasks).

After that, the TFT substrate 101A can be fabricated by the same process as the TFT substrate 101R of Reference Example 1 as illustrated below.

As illustrated in FIG. 17E, the first insulating film 11' is formed to cover the TFT 10, the source metal layer 7, the contact hole CH_ge, and the contact hole CH_se. The first insulating film 11' is formed to cover the first conductive layer L1 of the wiring line section 3*gw* exposed within the contact hole CH_ge and the first conductive layer L1 of the wiring line section 3*sw* exposed in the contact hole CH_se.

Figures 18A, 18B, 18C:
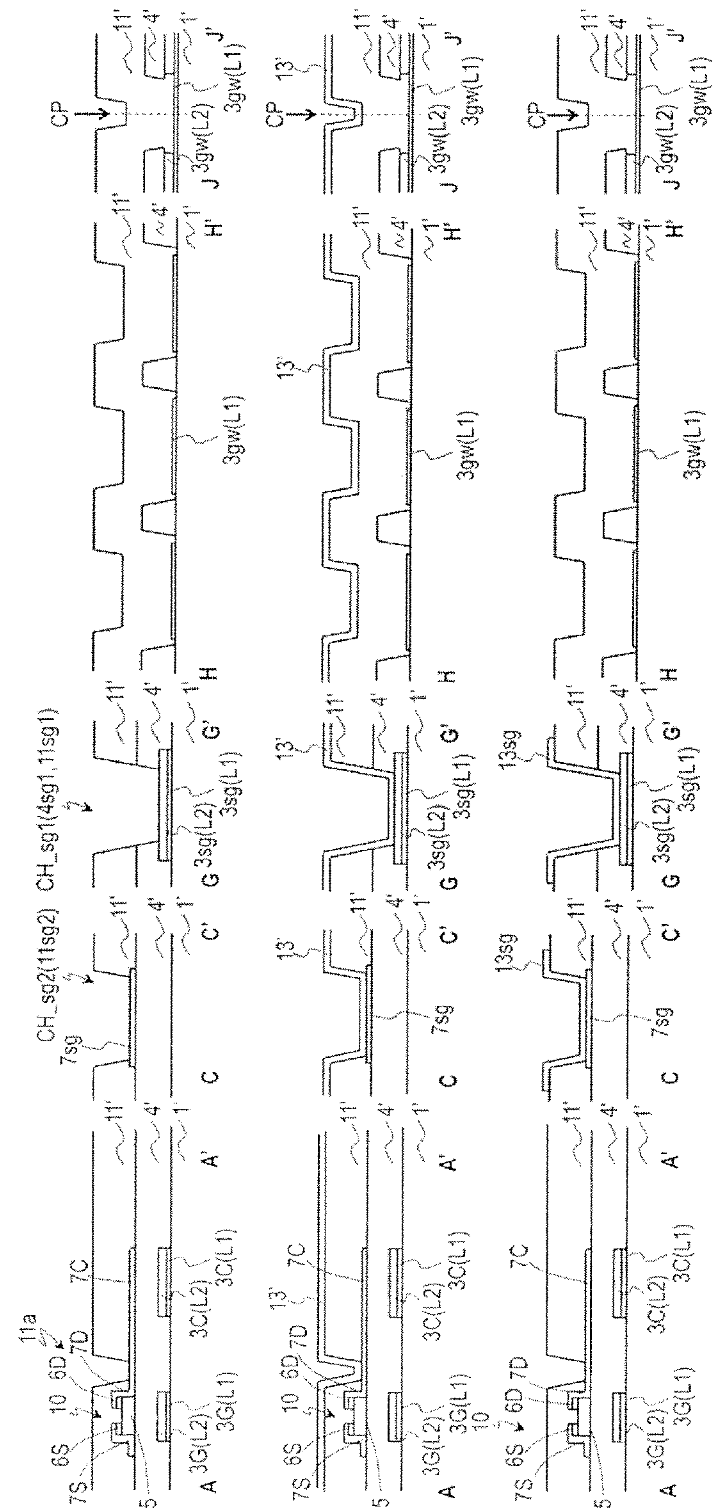
FIGS. 18A to 18C are schematic cross-sectional views for describing the method for manufacturing the TFT substrate 101A.

Next, the first insulating film 11' and the gate insulating film 4' are etched to form an opening in the first insulating film 11' and the gate insulating film 4' as illustrated in FIG. 18A.

Next, as illustrated in FIG. 18B, the lower connection conductive film 13' is formed on the first insulating film 11', within the opening 11*a*, within the contact hole CH_sg, within the opening 11*sg*2, and within the contact hole CH_p1.

Next, the lower connection conductive film 13' is patterned to obtain the lower connection layer 13 as illustrated in FIG. 180.

Figure 19A:
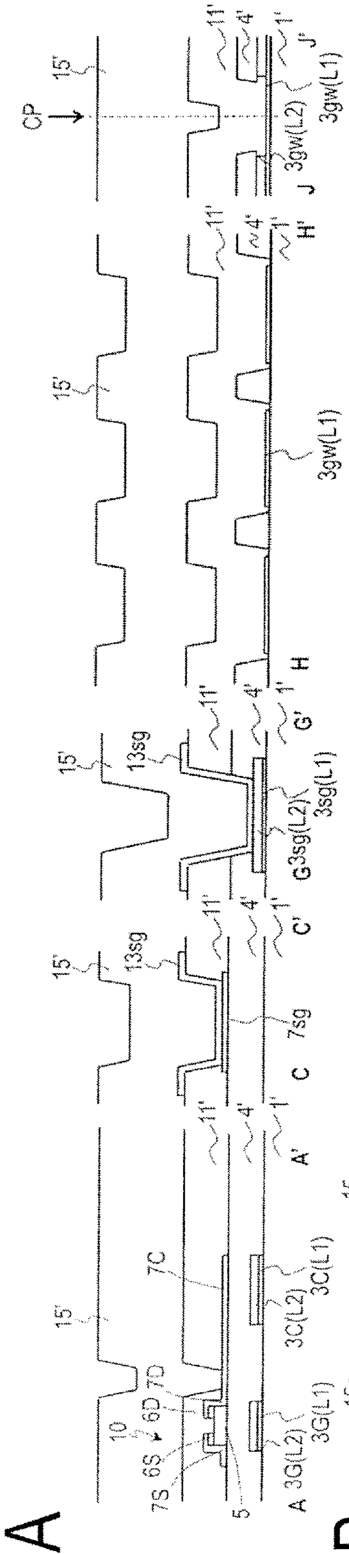
FIGS. 19A to 19C are schematic cross-sectional views for describing the method for manufacturing the TFT substrate 101A.

Subsequently, as illustrated in FIG. 19A, the patch conductive film 15' is formed on the first insulating film 11' and on the lower connection layer 13.

Figure 19B:
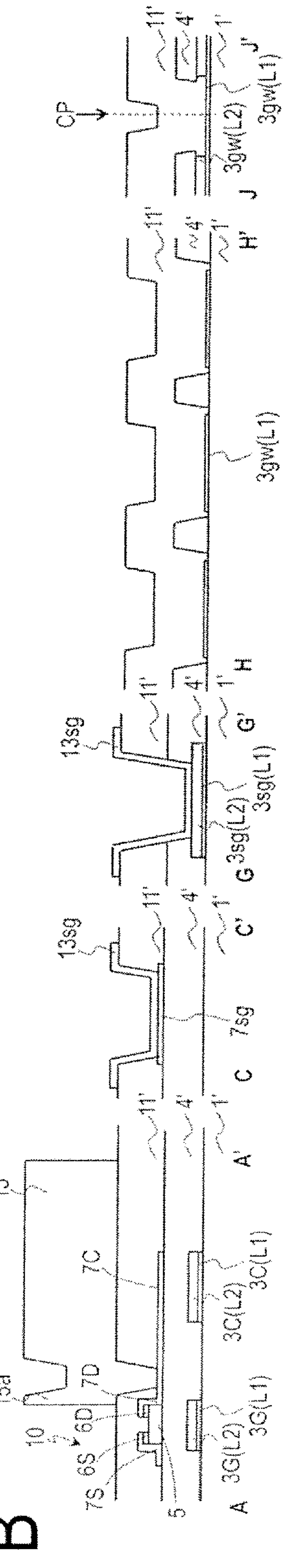

Next, the patch conductive film 15' is patterned to obtain the patch metal layer 151 as illustrated in FIG. 19B.

Figure 19C:
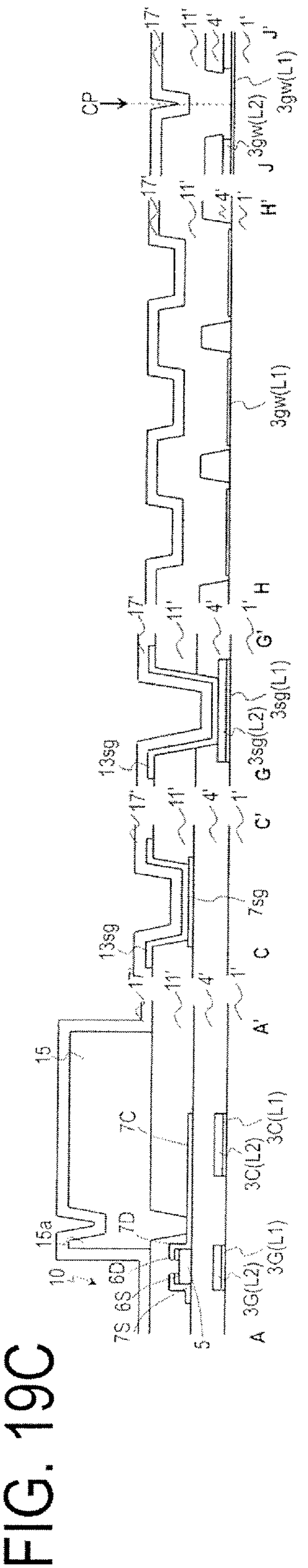

Next, as illustrated in FIG. 19C, the second insulating film 17' is formed on the patch metal layer 151, on the lower connection layer 13, and on the first insulating film 11'.

Figure 20A:
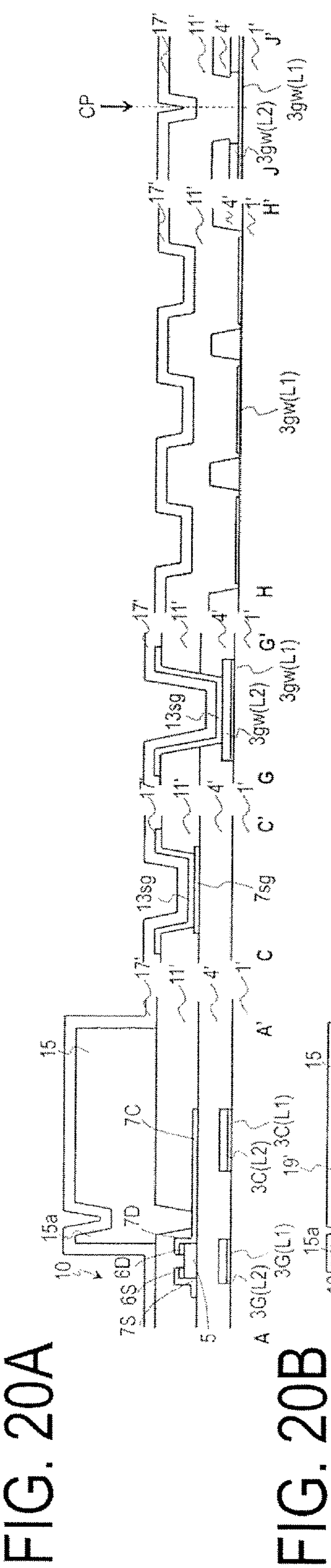
FIGS. 20A to 20C are schematic cross-sectional views for describing the method for manufacturing the TFT substrate 101A.

Subsequently, as illustrated in FIG. 20A, the second insulating film 17', the first insulating film 11', and the gate insulating film 4' are etched to form an opening in the second insulating film 17', the first insulating film 11', and the gate insulating film 4'.

Figure 20B:
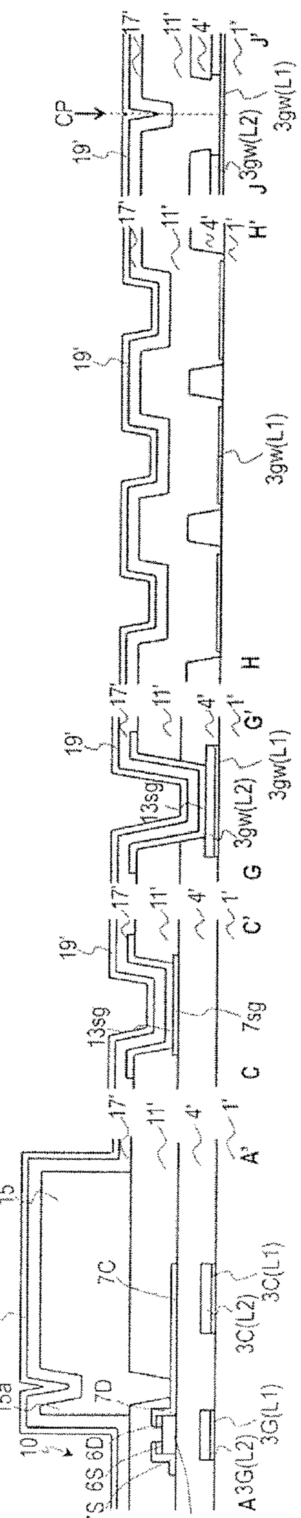

Next, as illustrated in FIG. 20B, the upper connection conductive film 19' is formed on the second insulating film 17', within the contact hole CH_s, within the contact hole CH_g, within the contact hole CH_c, and within the opening 17*p*1.

Figure 20C:
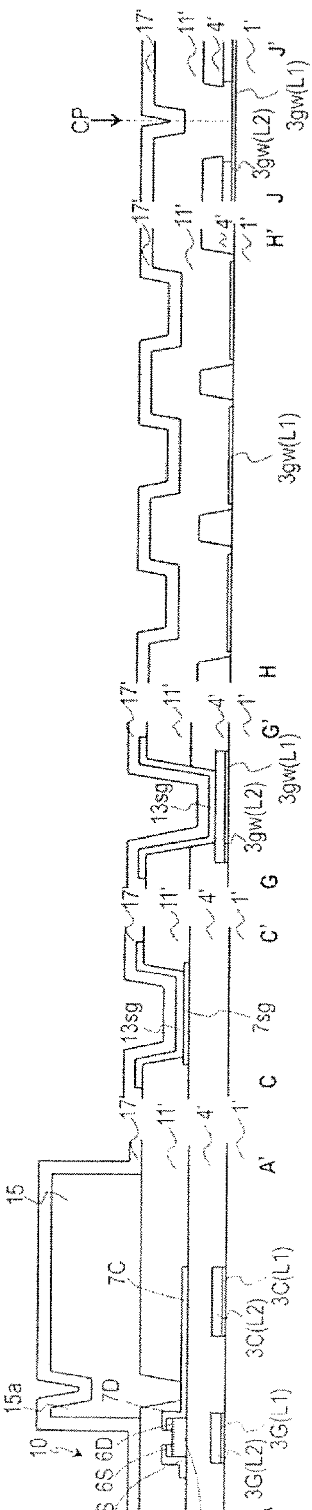

Next, the upper connection conductive film 19' is patterned to obtain the upper connection layer 19 as illustrated in FIG. 20C. This allows the mother TFT substrate 100A to be obtained.

After that, the TFT substrate 101A is obtained by cutting the mother TFT substrate 100A along the cutting line CP passing over the opening 4*ge* when viewed from the normal direction of the mother dielectric substrate 1'. At this time, since the cutting line CP does not cut the second conductive layer L2 of the gate metal layer 3, the low resistance metal layer is not exposed at the cutting surface. Accordingly, the occurrence of the problem that adjacent wiring line sections are shorted can be suppressed. At this time, the mother TFT substrate 100A is divided along the cutting line CP passing over the opening 4*ge*. The opening (notched portion) 4*ge* included in the TFT substrate 101A is a portion formed by cutting away the gate insulating layer 4 from the edge of the TFT substrate 101A.

JP 2010-210713 A discloses an active matrix substrate used in a liquid crystal display device and a method for manufacturing the same. The active matrix substrate disclosed in JP 2010-210713 A is obtained by dividing a substrate at a dividing portion, the substrate including an input terminal, a short ring connected to the input terminal, and the dividing portion for dividing the input terminal and the short ring. A first and second metal layers (for example, Cu layers) which are formed in the input terminal and the short ring are not formed in the dividing portion, and a third metal layer (for example, a Ti layer) is formed in the dividing portion to electrically connect the input terminal to the short ring. With this configuration, the first metal layer is not exposed on the cutting surface, and thus, even if a Cu layer or the like that tends to corrode is used as the first metal layer, corrosion thereof can be suppressed. JP 2010-210713 A does not disclose or suggest a process, as a method for manufacturing an active matrix substrate, of providing an opening to an insulating film on a Cu layer to expose the Cu layer in the dividing portion, and patterning the Cu layer together with a conductive layer formed on the insulating film. In the method for manufacturing an active matrix substrate in JP 2010-210713 A, it is described that when the Cu layer and the Ti layer are patterned, the Cu layer in the dividing portion is removed by a laser or the like.

Modification Example of Embodiment 1-1

A structure of a TFT substrate 101Aa according to a modification example of Embodiment 1-1 of the disclosure will be described with reference to FIG. 21A and FIG. 22. Differences from the TFT substrate 101A will be mainly described.

FIGS. 21A to 21D are plan views schematically illustrating a mother TFT substrate 100Aa used to fabricate the TFT substrate 101Aa. Referring to FIGS. 21A to 21D, the structure and manufacturing method of the TFT substrate 101Aa will be described. The TFT substrate 101Aa is obtained by cutting (dividing) the mother TFT substrate 100Aa along the cutting line CP. In other words, the mother TFT substrate 100Aa includes a mother dielectric substrate (e.g., a mother glass substrate) and components of the TFT substrate 101Aa supported on the mother dielectric substrate. An edge of the dielectric substrate 1 and an edge of the TFT substrate 101Aa are defined by the cutting line CP.

Figures 21A, 21B, 21C, 21D:
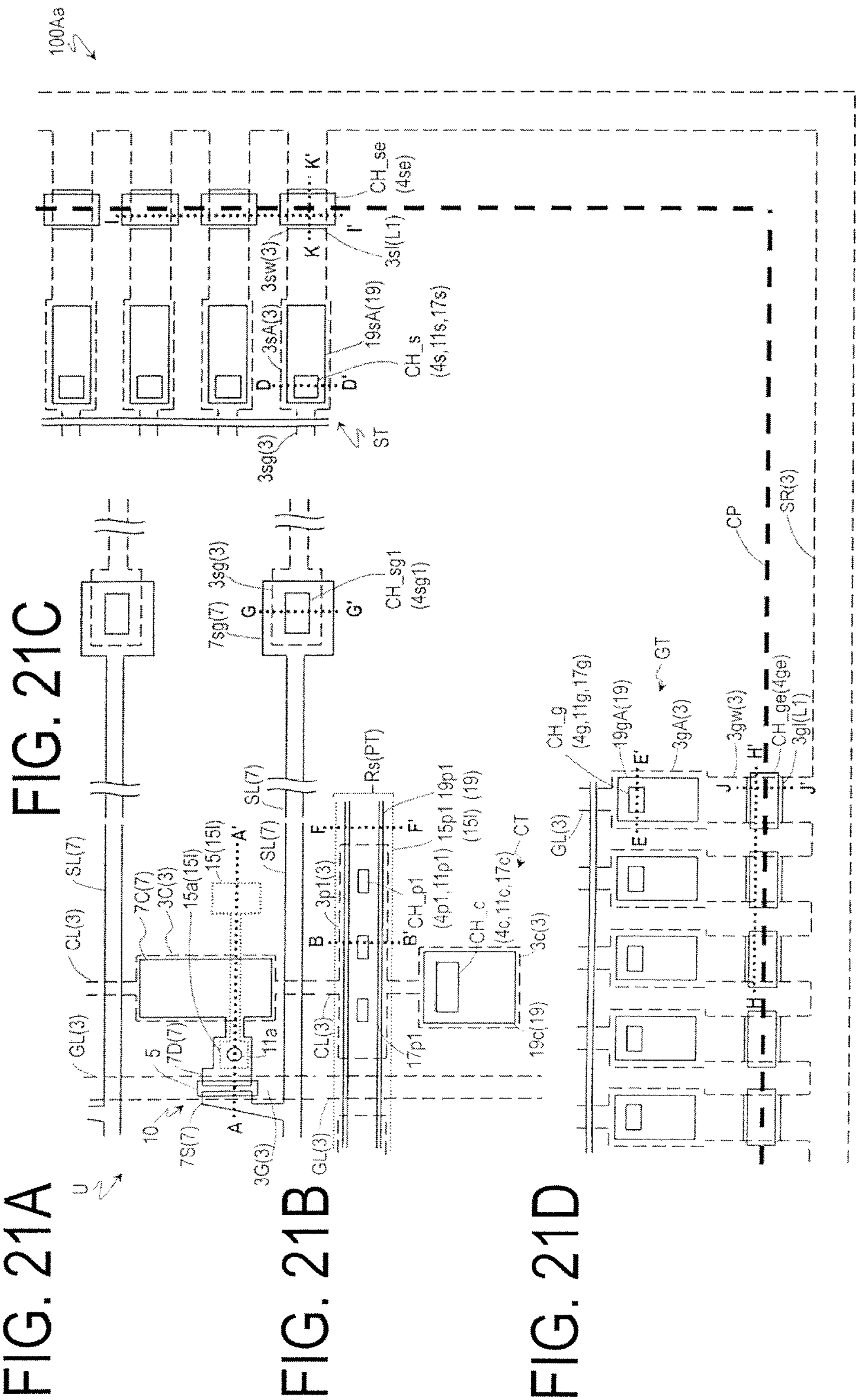
FIGS. 21A to 21D are plan views schematically illustrating a mother TFT substrate 100Aa used to fabricate a TFT substrate 101Aa according to a modification example of Embodiment 1-1 of the disclosure.

FIG. 21A illustrates the antenna unit region U in the transmission and/or reception region R1, FIG. 21B illustrates the transfer section PT and the CS terminal section CT provided in the non-transmission and/or reception region R2, FIG. 21C illustrates the source-gate connection section SG provided in the non-transmission and/or reception region R2, and FIG. 21D illustrates the gate terminal section GT and the source terminal section ST provided in the non-transmission and/or reception region R2.

Figure 22:
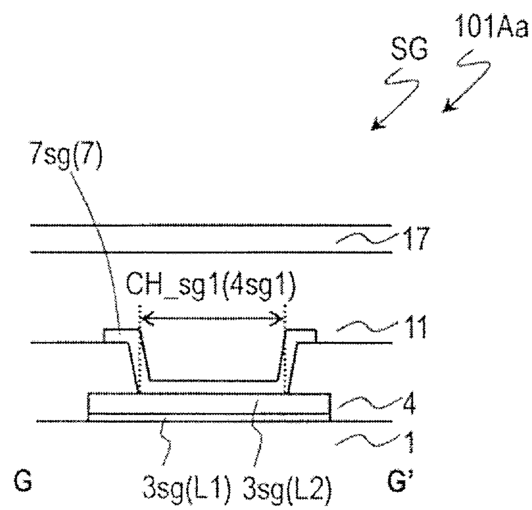
FIG. 22 is a schematic cross-sectional view of the TFT substrate 101Aa.

FIG. 22 is a schematic cross-sectional view of the TFT substrate 101Aa. FIG. 22 illustrates a cross section of the source-gate connection section SG corresponding to a line G-G' in FIG. 21C.

As illustrated in FIG. 21C and FIG. 22, the TFT substrate 101Aa differs from the TFT substrate 101A in the structure of the source-gate connection section SG.

As illustrated in FIG. 21C and FIG. 22, the source-gate connection section SG of the TFT substrate 101Aa includes a source lower connection wiring line 3*sg*, an opening 4*sg*1 formed in the gate insulating layer 4, and a source bus line connection section 7*sg*.

The source lower connection wiring line 3*sg* is included in the gate metal layer 3. The source lower connection wiring line 3*sg* is electrically separate from the gate bus line GL.

The opening 4*sg*1 formed in the gate insulating layer 4 at least reaches the source lower connection wiring line 3*sg*. The opening 4*sg*1 may be referred to as the contact hole CH_sg1.

The source bus line connection section 7*sg* is included in the source metal layer 7 and electrically connected to the source bus line SL. In this example, the source bus line connection section 7*sg* extends from the source bus line SL and is formed integrally with the source bus line SL. The source bus line connection section 7*sg* is formed within the contact hole CH_sg1, and is electrically connected to the source lower connection wiring line 3*sg* within the contact hole CH_sg1. A portion of the source lower connection wiring line 3*sg* exposed by the opening 4*sg*1 is preferably covered by the source bus line connection section 7*sg*.

The TFT substrate 101Aa does not include the lower connection layer 13.

In the TFT substrate 101Aa having such a structure also, the same effect as in the TFT substrate 101A can be obtained.

Note that such a modification example can be applied to any of the embodiments described below.

The TFT substrate 101Aa can be fabricated by modifying the method for manufacturing the TFT substrate 101A.

Embodiment 1-2

A structure of a TFT substrate 101B according to Embodiment 1-2 of the disclosure will be described with reference to FIGS. 23A to 23D and FIGS. 24A to 24D. Differences from the TFT substrate 101A according to Embodiment 1-1 will be mainly described.

FIGS. 23A to 23D are plan views schematically illustrating a mother TFT substrate 100B used to fabricate the TFT substrate 101B. Referring to FIGS. 23A to 23D, a structure and manufacturing method of the TFT substrate 101B will be described. The TFT substrate 101B is obtained by cutting (dividing) the mother TFT substrate 100B along the cutting line CP. In other words, the mother TFT substrate 100B includes a mother dielectric substrate (e.g., a mother glass substrate) and components of the TFT substrate 101B supported on the mother dielectric substrate. An edge of the dielectric substrate 1 and an edge of the TFT substrate 101B are defined by the cutting line CP.

Figures 23A, 23B, 23C, 23D:
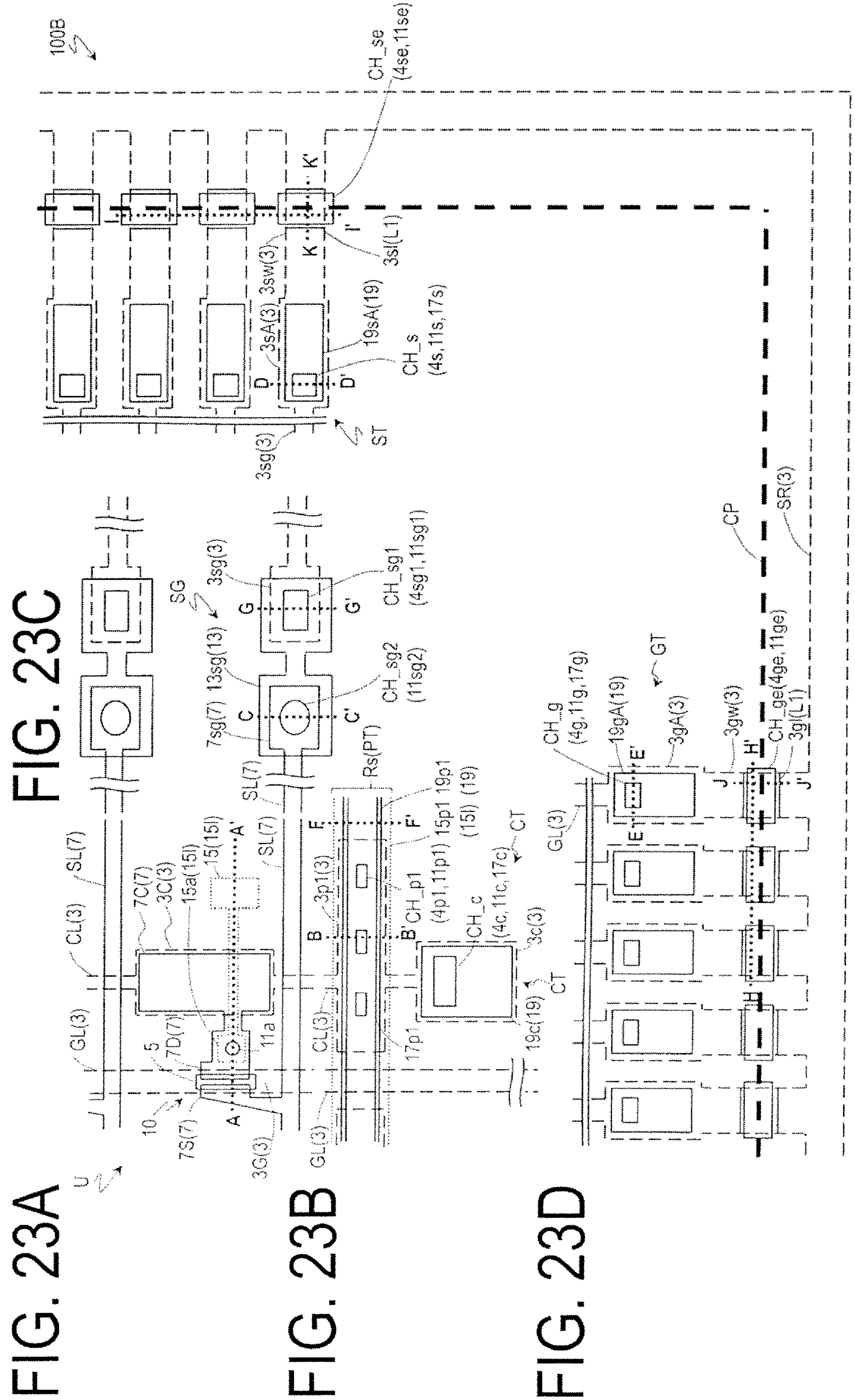
FIGS. 23A to 23D are plan views schematically illustrating a mother TFT substrate 100B used to fabricate a TFT substrate 101B according to Embodiment 1-2 of the disclosure.

FIG. 23A illustrates the antenna unit region U in the transmission and/or reception region R1, FIG. 23B illustrates the transfer section PT and the CS terminal section CT provided in the non-transmission and/or reception region R2, and FIG. 23C illustrates the source-gate connection section SG provided in the non-transmission and/or reception region R2. FIG. 23D illustrates the gate terminal section GT and the source terminal section ST provided in the non-transmission and/or reception region R2.

Figure 24A:
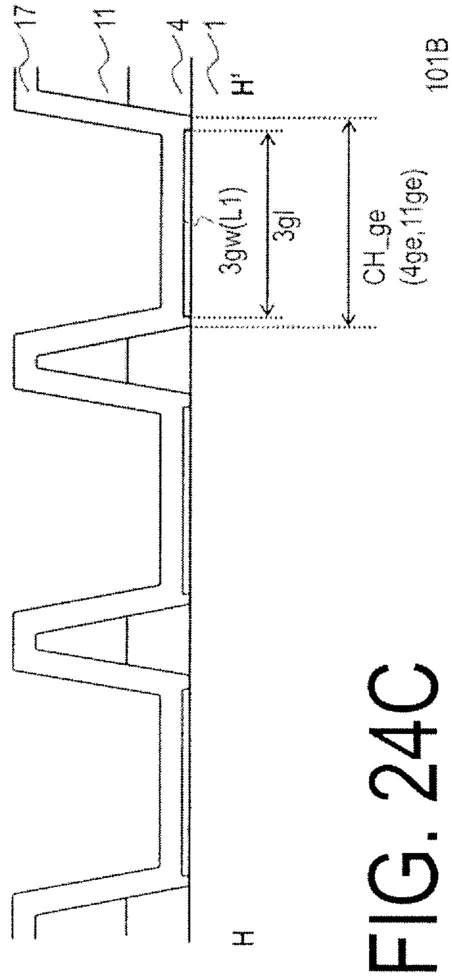
FIGS. 24A and 24C are schematic cross-sectional views of the TFT substrate 101B.
Figure 24B:
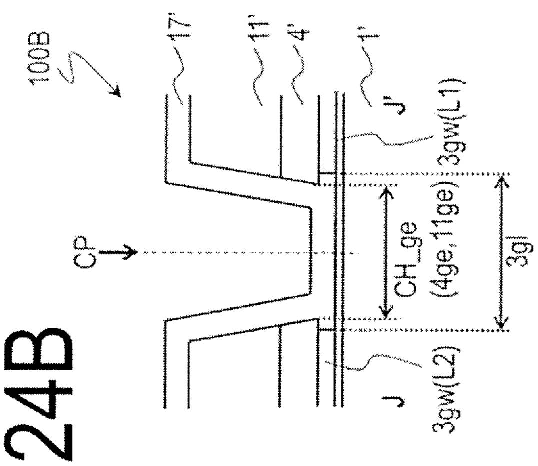
FIGS. 24B and 24D are schematic cross-sectional views of the mother TFT substrate 100B.
Figure 24C:
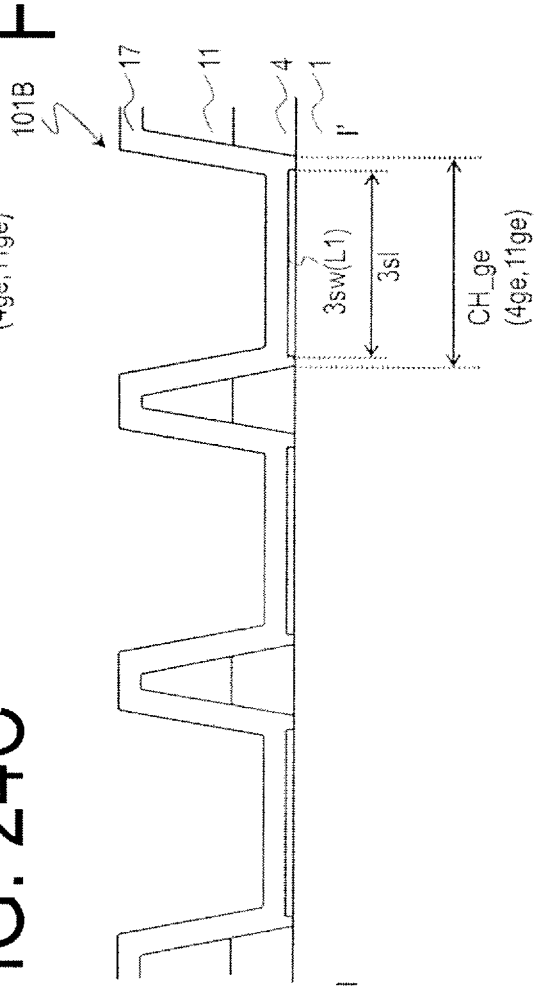
Figure 24D:
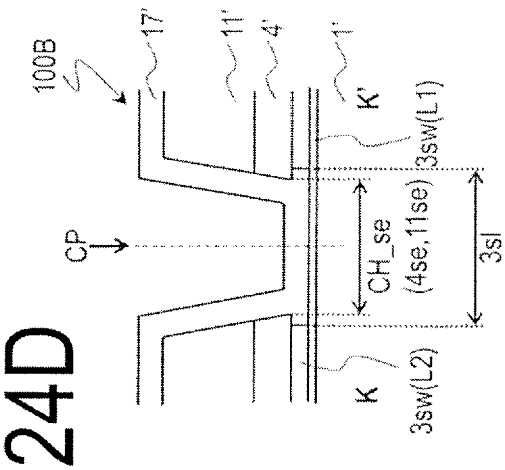

FIGS. 24A and 24C are schematic cross-sectional views of the TFT substrate 101B. FIG. 24A illustrates a cross section near the cutting line CP corresponding to a line H-H' in FIG. 239, and FIG. 24C illustrates a cross section near the cutting line CP corresponding to line I-I' in FIG. 23D. FIGS. 24B and 24D are schematic cross sectional views of the mother TFT substrate 100B. FIG. 24B illustrates a cross section near the cutting line CP along a line J-J' in FIG. 23D, and FIG. 24D illustrates a cross section near the cutting line CP along a line K-K' in FIG. 23D.

As illustrated in FIG. 23D and FIGS. 24A to 24D, the TFT substrate 101B differs from the TFT substrate 101A in the structure of the contact hole (notched portion) CH_ge that at least reaches the first region 3*g*1 of the wiring line section 3*gw* included in the gate terminal section GT. In the TFT substrate 101A, the opening (notched portion) 4*ge* formed in the gate insulating layer 4 constitutes the contact hole (notched portion) CH_ge, and the contact hole (notched portion) CH_ge is covered by the first insulating layer 11 and the second insulating layer 17. In contrast, in the TFT substrate 101B, the contact hole (notched portion) CH_ge is constituted by the opening (notched portion) 4*ge* formed in the gate insulating layer 4, and an opening (notched portion) 11*ge* formed in the first insulating layer 11 and overlapping the opening (notched portion) 4*ge* when viewed from the normal direction of the dielectric substrate 1, and the contact hole (notched portion) CH_ge is covered by the second insulating layer 17.

As for the source terminal section ST similarly, in the TFT substrate 101A, the opening (notched portion) 4*se* formed in the gate insulating layer 4 constitutes the contact hole (notched portion) CH_se, and the contact hole (notched portion) CH_se is covered by the first insulating layer 11 and the second insulating layer 17. In contrast, in the TFT substrate 101B, the contact hole (notched portion) CH_se is constituted by the opening (notched portion) 4*se* formed in the gate insulating layer 4 and an opening (notched portion) 11*se* formed in the first insulating layer 11, and the contact hole (notched portion) CH_se is covered by the second insulating layer 17.

According to the TFT substrate 101B having such a structure also, the same effect as in the preceding embodiments can be obtained. As illustrated in FIG. 23D and FIGS. 24A to 24D, the cutting line CP is located over the first region 3*g*1 of the wiring line section 3*gw* and the first region 3*s*1 of the wiring line section 3*sw*. When cutting the wiring line section 3*gw*, the first region 3*g*1 of the wiring line section 3*gw* is cut, and when cutting the wiring line section 3*sw*, the first region 3*s*1 of the wiring line section 3*sw* is cut. The second conductive layer L2 is not formed on the cutting line CP. Thus, the second conductive layer L2 is not exposed on the cutting surface, similar to the cross-sections illustrated in FIGS. 24A and 24C. This suppresses the occurrence of such problems that the connection sections connected to different gate bus lines or different source bus lines are shorted. The TFT substrate 101B is excellent in reliability.

Further, the gate insulating layer 4 having the opening 4*ge* allows the TFT substrate 101B improved in reliability to be obtained while suppressing an increase in manufacturing cost (for example, the number of photomasks), as is described later in the method for manufacturing the TFT substrate 101B.

First Manufacturing Method of TFT Substrate 101B

A first manufacturing method of the TFT substrate 101B will be described with reference to FIGS. 25A to 27C.

FIGS. 25A to 25D, FIGS. 26A to 26C, and FIGS. 27A to 27C are schematic cross-sectional views for describing the first manufacturing method of the TFT substrate 101B. These figures illustrate a cross section taken along a line A-A' illustrated in FIG. 23A, a cross section taken along a line C-C' illustrated in FIG. 23C, a cross section taken along a line G-G' illustrated in FIG. 23C, a cross section taken along a line H-H' illustrated in FIG. 23D, and a cross section taken along a line J-J' in FIG. 23D. Differences from the TFT substrate 101R of Reference Example 1 and the TFT substrate 101A according to Embodiment 1-1 will be mainly described.

Figures 25A, 25B, 25C, 25D:
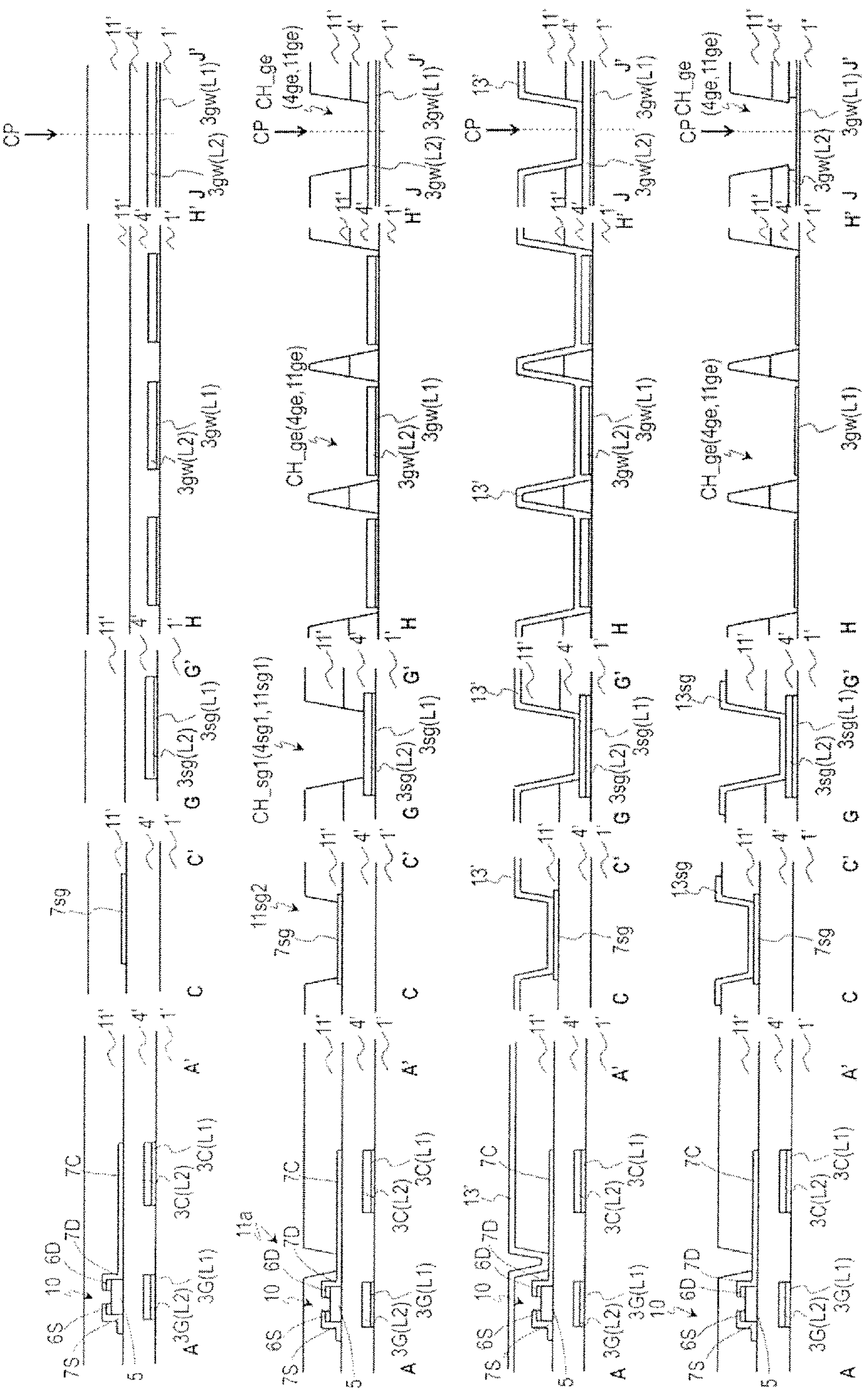
FIGS. 25A to 25D are schematic cross-sectional views for describing a first manufacturing method of the TFT substrate 101B.

First, as illustrated in FIG. 25A, formed on the mother glass substrate 1' are the gate metal layer 3, the gate insulating film 4', the semiconductor layer 5, the contact layer 6, the source metal layer 7, and the first insulating film 11'. These processes are carried out similarly to the processes of manufacturing the TFT substrate 101R of Reference Example 1 described above referring to FIGS. 9A to 9F, FIGS. 10A to 10F, FIG. 11A, and FIG. 12A. However, similar to the TFT substrate 101A according to the Embodiment 1-1, the gate metal layer 3 includes the first conductive layer L1 and the second conductive layer L2 formed on the first conductive layer L1.

Next, as illustrated in FIG. 25B, the first insulating film 11' and the gate insulating film 4' are etched to form an opening in the first insulating film 11' and gate insulating film 4'. At this time, the contact hole CH_ge at least reaching the wiring line section 3*gw* is formed in the first insulating film 11' and the gate insulating film 4'. The first insulating film 11' and the gate insulating film 4' are collectively etched, for example, to form the contact hole CH_ge. The contact hole CH_ge includes the opening 4*ge* that is formed in the gate insulating layer 4 and at least reaches the wiring line section 3*gw*, and the opening 11*ge* that is formed in the first insulating layer 11 and overlaps the opening 4*ge*. A side surface of the opening 4*ge* and a side surface of the opening 11*ge* may be aligned on a side surface of the contact hole CH_ge. The openings 4*ge* is formed to cover at least a portion of the wiring line section 3*gw* that is present on the cutting line CP when viewed from the normal direction of the mother glass substrate 1'. Here, the first insulating film 11' and the gate insulating film 4' are etched by dry etching using a fluorine gas. The wiring line section 3*sw* is formed similarly to the wiring line section 3*gw*, and thus, the illustration and description thereof are omitted.

Next, as illustrated in FIG. 25C, the lower connection conductive film 13' is formed on the first insulating film 11', within the opening 11*a*, within the contact hole CH_sg, within the opening 11*sg*2, within the contact hole CH_p1, within the contact hole CH_ge, and within the contact hole CH_se. The lower connection conductive film 13' is in contact with the second conductive layer L2 of the wiring line section 3*gw* within the opening 4*ge*.

Next, as illustrated in FIG. 25D, the lower connection conductive film 13' is patterned to obtain the lower connection layer 13. At this time, the second conductive layer L2 of the wiring line section 3*gw* exposed from the gate insulating film 4' within the opening 4*ge* is also patterned and removed. The second conductive layer L2 present at least on the cutting position CP is removed. The second conductive layer L2 and the lower connection conductive film 13' can be patterned using the same photomask. For example, in a case that a layer (MoN/Al) formed by layering an Al layer and a MoN layer in this order is used as the second conductive layer L2 of the gate metal layer 3, the lower connection conductive film 13' (for example, an ITO film) is patterned using oxalic acid to anneal the resulting lower connection layer 13, and thereafter, the second conductive layer L2 can be patterned by wet etching using an aqueous solution containing phosphoric acid, nitric acid, and acetic acid.

By performing the above processes, when the mother TFT substrate 100B is cut along the cutting line CP at the end of the manufacturing process, the second conductive layer L2 is not exposed on the cutting surface. In addition, since the removal of the second conductive layer L2 is performed in the same process as the patterning of the lower connection conductive film 13', the TFT substrate improved in reliability is obtained while suppressing an increase in manufacturing cost (for example, the number of photomasks).

After that, the TFT substrate 101B can be fabricated by the same process as the TFT substrate 101R of Reference Example 1 or the TFT substrate 101A according to Embodiment 1-1 as illustrated below.

Figures 26A, 26B, 26C:
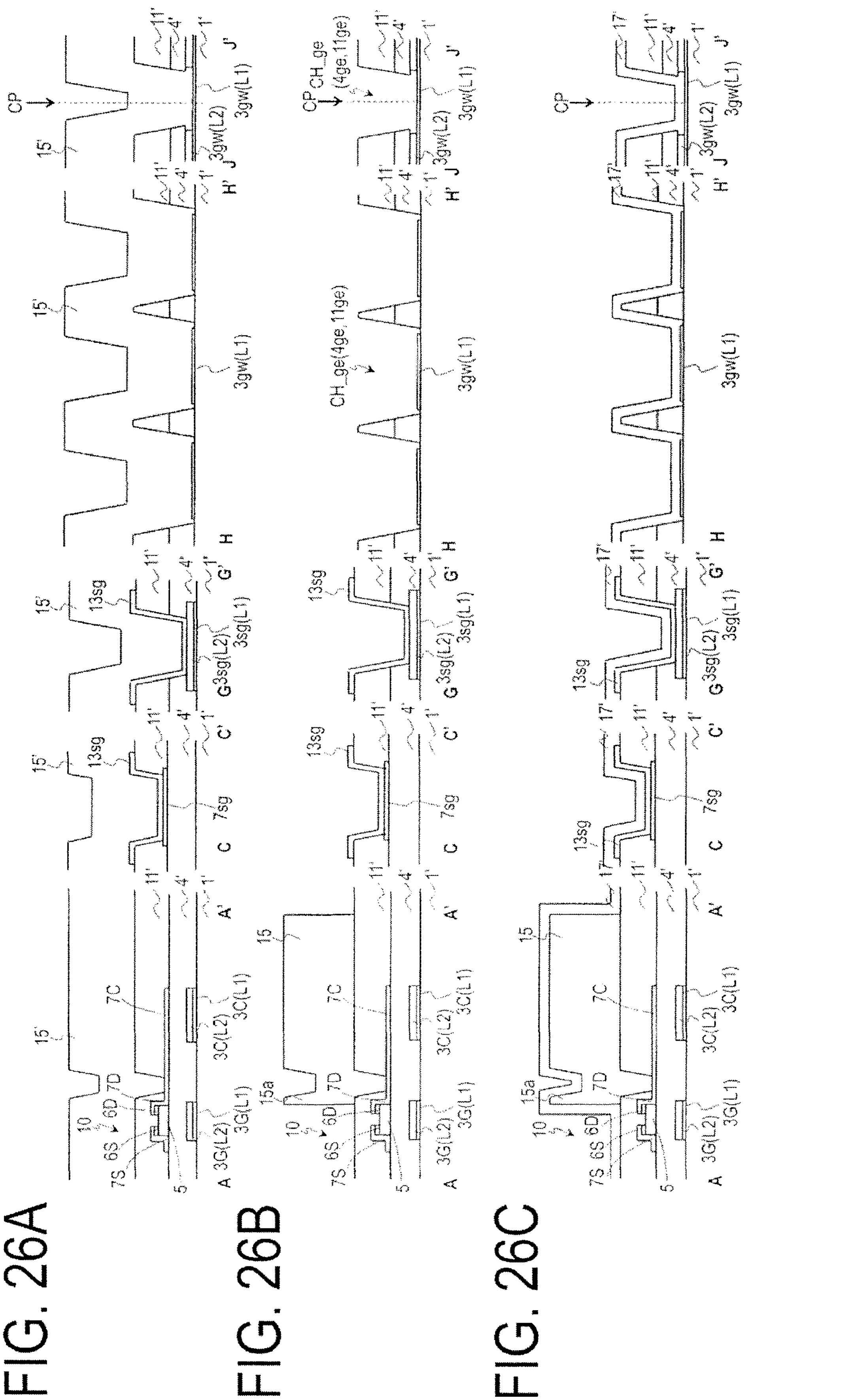
FIGS. 26A to 26C are schematic cross-sectional views for describing the first manufacturing method of the TFT substrate 101B.

As illustrated in FIG. 26A, the patch conductive film 15' is formed on the first insulating film 11', on the lower connection layer 13, within the contact hole CH_ge, and within the contact hole CH_se.

Next, as illustrated in FIG. 26B, the patch conductive film 15' is patterned to obtain the patch metal layer 151.

Next, as illustrated in FIG. 26C, the second insulating film 17' is formed on the patch metal layer 151, on the lower connection layer 13, on the first insulating film 11', within the contact hole CH_ge, and within the contact hole CH_se.

Figure 27A:
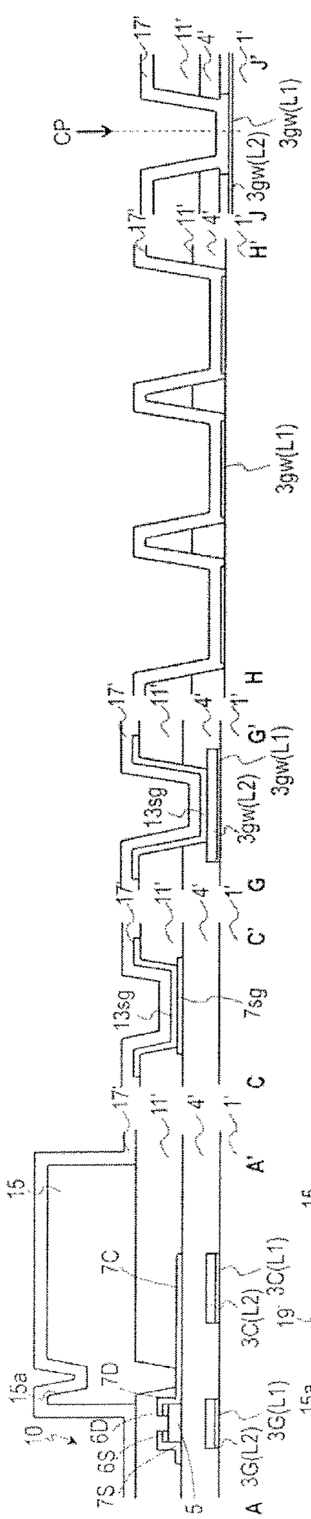
FIGS. 27A to 27C are schematic cross-sectional views for describing the first manufacturing method of the TFT substrate 101B.

Subsequently, as illustrated in FIG. 27A, the second insulating film 17', the first insulating film 11', and the gate insulating film 4' are etched to form an opening in the second insulating film 17', the first insulating film 11', and the gate insulating film 4'.

Figure 27B:
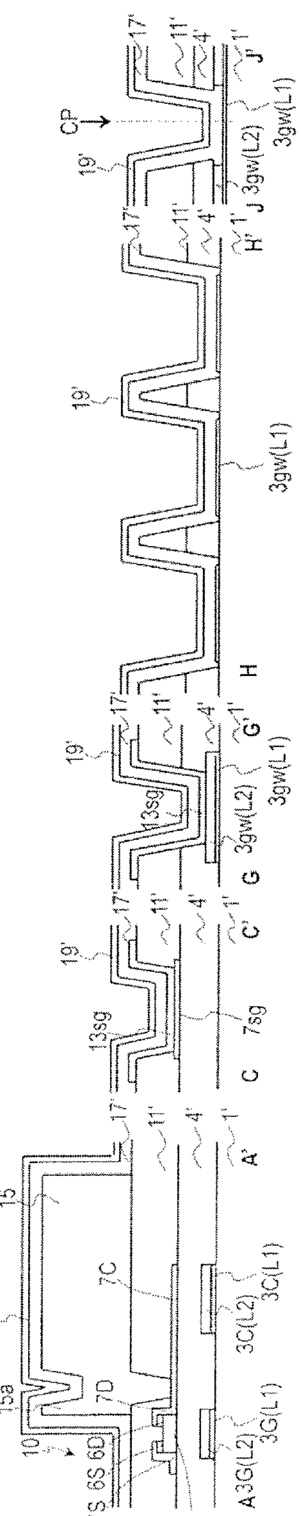

Next, as illustrated in FIG. 27B, the upper connection conductive film 19' is formed on the second insulating film 17', within the contact hole CH_s, within the contact hole CH_g, within the contact hole CH_c, and within the opening 17*p*1.

Figure 27C:
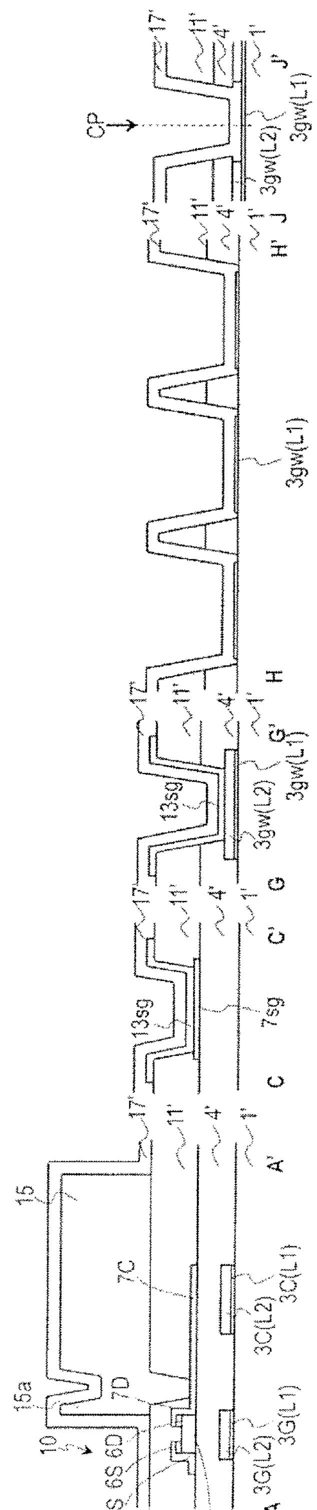

Next, as illustrated in FIG. 27C, the upper connection conductive film 19' is patterned to obtain the upper connection layer 19. This allows the mother TFT substrate 100B to be obtained.

After that, the TFT substrate 101B is obtained by cutting the mother TFT substrate 100B along the cutting line CP. At this time, since the cutting line CP does not cut the second conductive layer L2 of the gate metal layer 3, the low resistance metal layer is not exposed at the cutting surface. Accordingly, the occurrence of the problem that adjacent wiring line sections are shorted can be suppressed.

Second Manufacturing Method of TFT Substrate 1018

A second manufacturing method of the TFT substrate 101B will be described with reference to FIGS. 28A to 28C. According to the manufacturing method described below also, the TFT substrate 101B improved in reliability can be obtained while suppressing an increase in manufacturing cost (for example, the number of photomasks).

Figure 28A:
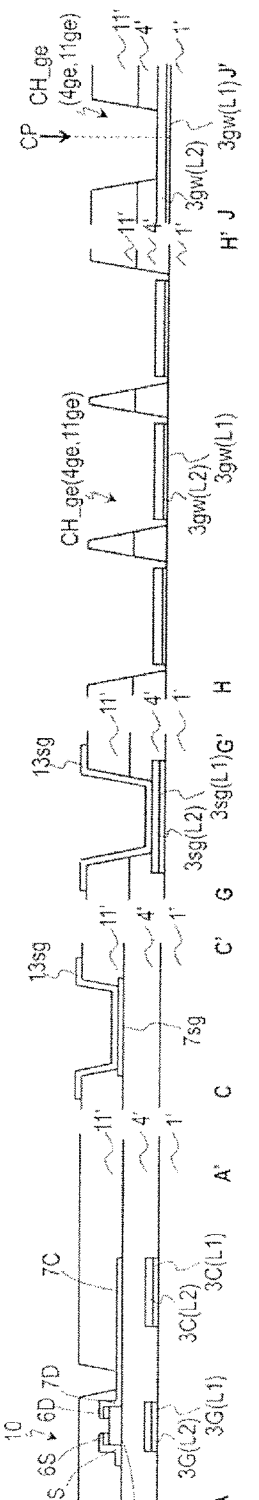
FIGS. 28A to 28C are schematic cross-sectional views for describing a second manufacturing method of the TFT substrate 101B.
Figure 28B:
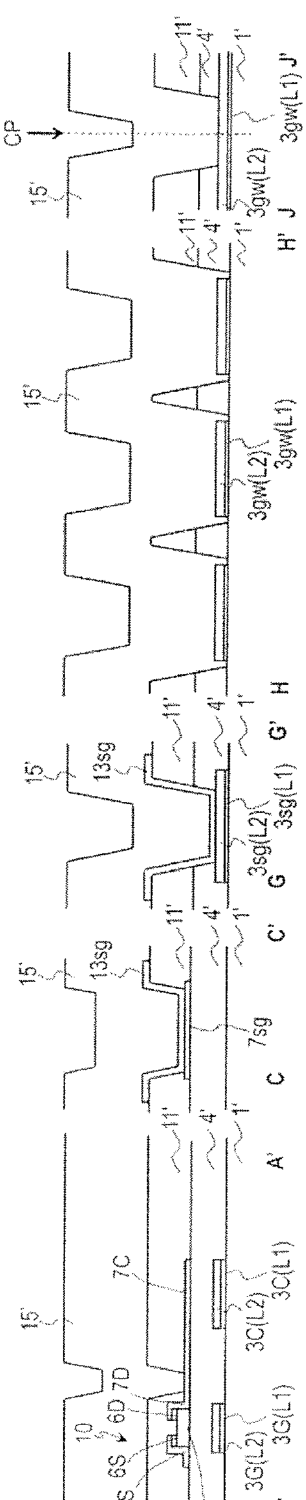
Figure 28C:
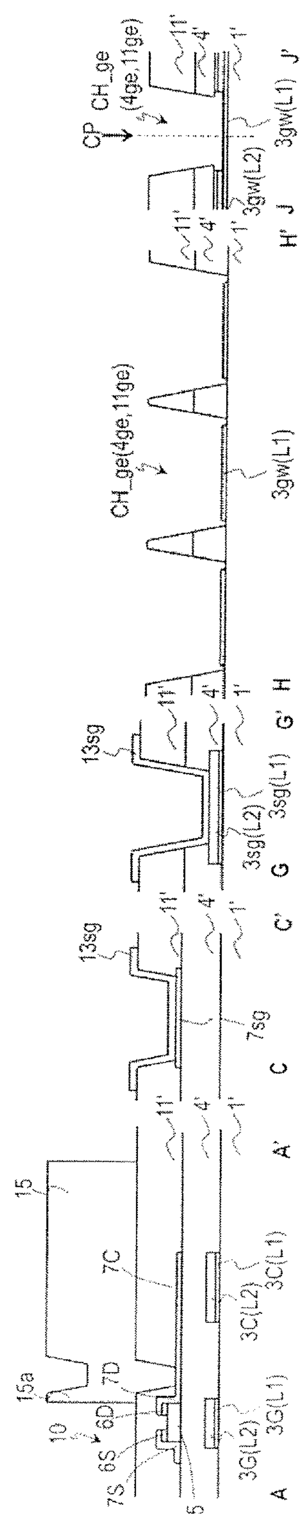

FIGS. 28A to 28C are schematic cross-sectional views for describing the second manufacturing method of the TFT substrate 101B. These figures illustrate a cross section taken along a line A-A' illustrated in FIG. 23A, a cross section taken along a line C-C' illustrated in FIG. 23C, a cross section taken along a line G-G' illustrated in FIG. 23C, a cross section taken along a line H-H' illustrated in FIG. 23D, and a cross section taken along a line J-J' in FIG. 23D. Differences from the first manufacturing method of the TFT substrate 101B will be mainly described.

First, similar to the way described with reference to FIGS. 25A to 25C, formed on the mother glass substrate 1' are the gate metal layer 3, the gate insulating film 4', the semiconductor layer 5, the contact layer 6, the source metal layer 7, the first insulating film 11', and the lower connection conductive film 13'.

Next, as illustrated in FIG. 28D, the lower connection conductive film 13' is patterned to obtain the lower connection layer 13. At this time, a difference from the first manufacturing method is in that the second conductive layer L2 of the wiring line section 3*gw* exposed from the gate insulating film 4' within the opening 4*ge* is not patterned or removed.

Next, as illustrated in FIG. 28B, the patch conductive film 15' is formed on the first insulating film 11', on the lower connection layer 13, within the contact hole CH_ge, and within the contact hole CH_se. The patch conductive film 15' is in contact with the second conductive layer L2 of the wiring line section 3*gw* within the opening 4*ge*.

Next, as illustrated in FIG. 28C, the patch conductive film 15' is patterned to obtain the patch metal layer 151. At this time, the second conductive layer L2 of the wiring line section 3*gw* exposed from the gate insulating film 4' within the opening 4*ge* is also patterned and removed. The second conductive layer L2 present at least on the cutting position CP is removed. The second conductive layer L2 and the patch conductive film 15' can be patterned using the same photomask. For example, in the case that a layer (MoN/Al) formed by layering an Al layer and a MoN layer in this order is used as the second conductive layer L2 of the gate metal layer 3, a layered film (MoN/Al/MoN) is preferably used, as the patch conductive film 15', which is formed by layering a MoN layer (having a thickness of 50 nm, for example), an Al layer (having a thickness of 1000 nm, for example), and a MoN layer (having a thickness of 50 nm, for example) in this order. In this case, since the second conductive layer L2 (MoN/Al) is formed of the same material as the patch conductive film 15' (MoN/Al/MoN), the same etchant can be used without problems.

In a case that a Cu layer is used as the second conductive layer L2 of the gate metal layer 3, a layered film (Cu/Ti) including a Ti film and a Cu film in this order can be used as the patch conductive film 15', for example. The patch conductive film 15' and the second conductive layer L2 may be patterned as follows, for example. After the Cu film of the patch conductive film 15' is patterned by wet etching, the Ti film of the patch conductive film 15' is patterned by dry etching, and then, the second conductive layer L2 (Cu layer) is patterned by wet etching. The Cu film of the patch conductive film 15' and the second conductive layer L2 (Cu layer) can be etched using the same etchant.

In this process, that is, in the process of patterning the patch conductive film 15', the lower connection layer 13 (upper connection section 13*sg*) formed within the contact hole CH_sg1 in the source-gate connection section formation region (C-C' cross section and G-G' cross section) remains unremoved. Therefore, it is preferable to select, as the lower connection layer 13, a material having a high etch selectivity with respect to the patch conductive film 15'.

By performing the above processes, when the mother TFT substrate 100B is cut along the cutting line CP at the end of the manufacturing process, the second conductive layer L2 is not exposed on the cutting surface. In addition, since the removal of the second conductive layer L2 is performed in the same process as the patterning of the patch conductive film 15', the TFT substrate improved in reliability is obtained while suppressing an increase in manufacturing cost (for example, the number of photomasks).

After that, the TFT substrate 101B can be fabricated by performing the same process as the first manufacturing method described with reference to FIG. 26C and FIGS. 27A to 27C.

Embodiment 1-3

A structure of a TFT substrate 101C according to Embodiment 1-3 of the disclosure will be described with reference to FIGS. 29A to 29D and FIGS. 30A to 30D. Differences from the TFT substrate 101A according to Embodiment 1-1 will be mainly described.

FIGS. 29A to 29D are plan views schematically illustrating a mother TFT substrate 100C used to fabricate the TFT substrate 101C. Referring to FIGS. 29A to 29D, a structure and manufacturing method of the TFT substrate 101C will be described. The TFT substrate 101C is obtained by cutting (dividing) the mother TFT substrate 100C along the cutting line CP. In other words, the mother TFT substrate 100C includes a mother dielectric substrate (e.g., a mother glass substrate) and components of the TFT substrate 101C supported on the mother dielectric substrate. An edge of the dielectric substrate 1 and an edge of the TFT substrate 101C are defined by the cutting line CP.

Figures 29A, 29B, 29C, 29D:
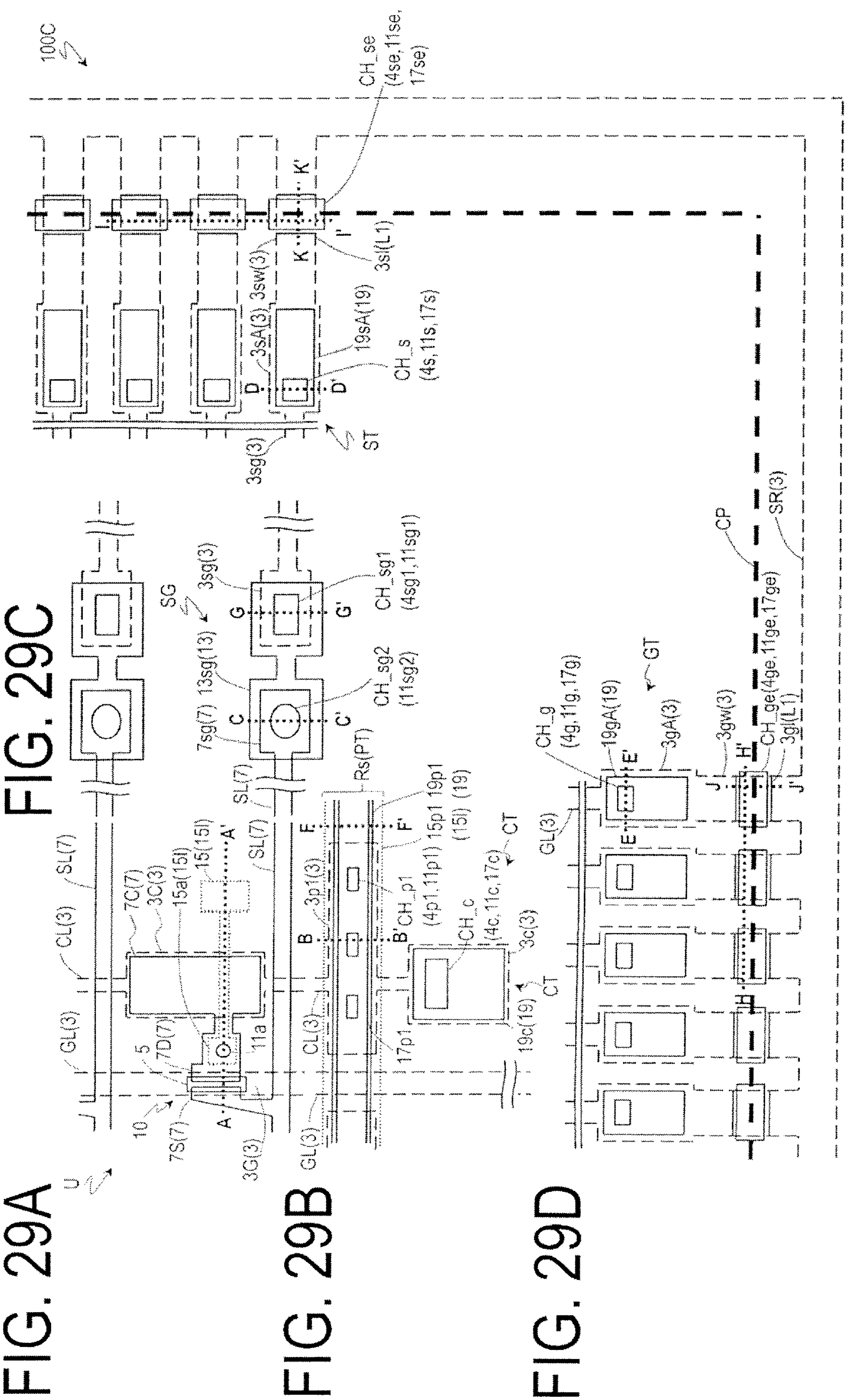
FIGS. 29A to 29D are plan views schematically illustrating a mother TFT substrate 100C used to fabricate a TFT substrate 101C according to Embodiment 1-3 of the disclosure.

FIG. 29A illustrates the antenna unit region U in the transmission and/or reception region R1, FIG. 29B illustrates the transfer section PT and the CS terminal section CT provided in the non-transmission and/or reception region R2, and FIG. 29C illustrates the source-gate connection section SG provided in the non-transmission and/or reception region R2. FIG. 29D illustrates the gate terminal section GT and the source terminal section ST provided in the non-transmission and/or reception region R2.

Figure 30A:
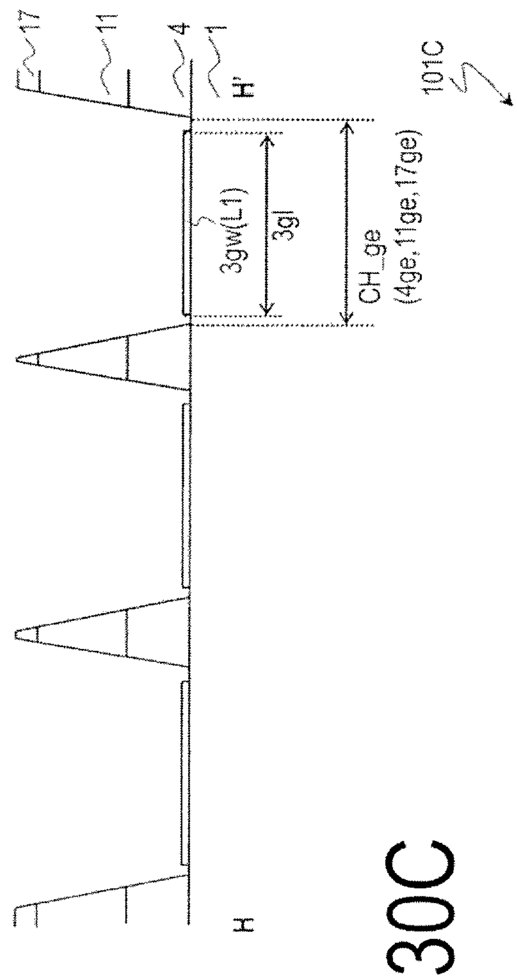
FIGS. 30A and 30C are schematic cross-sectional views of the TFT substrate 1010 and FIGS. 30B and 30D are schematic cross-sectional views of the mother TFT substrate 100C.
Figure 30B:
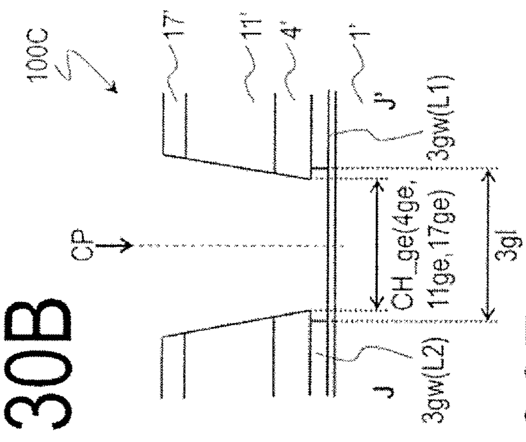
Figure 30C:
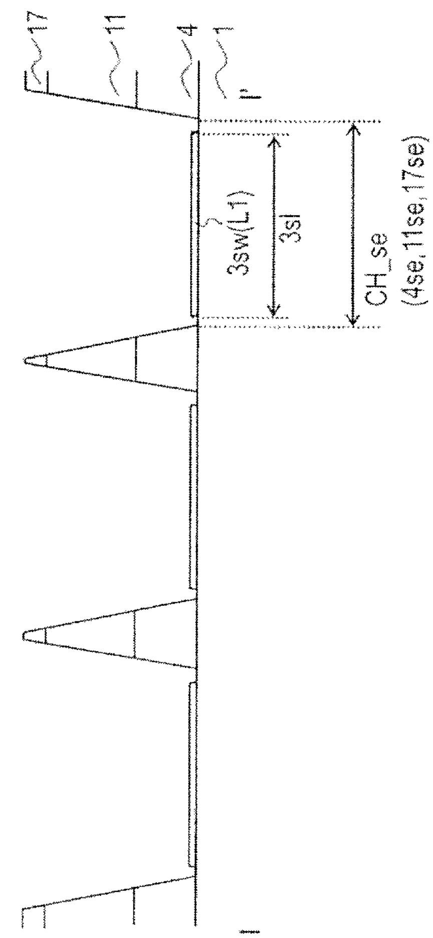
Figure 30D:
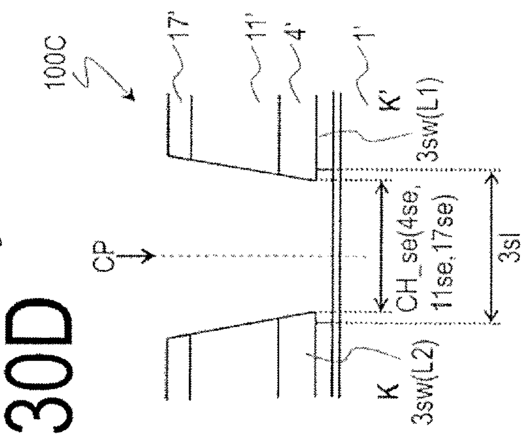

FIGS. 30A and 30C are schematic cross-sectional views of the TFT substrate 101C. FIG. 30A illustrates a cross section near the cutting line CP corresponding to a line H-H' in FIG. 29D, and FIG. 30C illustrates a cross section near the cutting line CP corresponding to line I-I' in FIG. 29D. FIGS. 30B and 30D are schematic cross-sectional views of the mother TFT substrate 100C. FIG. 30B illustrates a cross section near the cutting line CP along a line J-J' in FIG. 29D, and FIG. 30D illustrates a cross section near the cutting line CP along a line K-K' in FIG. 29D.

As illustrated in FIG. 29D and FIGS. 30A to 30D, the TFT substrate 101C differs from the TFT substrate 101A in the structure of the contact hole CH_ge that at least reaches the first region 3*g*1 of the wiring line section 3*gw* included in the gate terminal section GT. In the TFT substrate 101A, the opening (notched portion) 4*ge* formed in the gate insulating layer 4 constitutes the contact hole (notched portion) CH_ge, and the contact hole (notched portion) CH_ge is covered by the first insulating layer 11 and the second insulating layer 17. In contrast, in the TFT substrate 101C, the contact hole (notched portion) CH_ge is constituted by the opening (notched portion) 4*ge* formed in the gate insulating layer 4, the opening (notched portion) 11*ge* formed in the first insulating layer 11, and the opening (notched portion) 17*ge* formed in the second insulating layer 17. The opening (notched portion) 11*ge* formed in the first insulating layer 11 overlaps the opening (notched portion) 4*ge* when viewed from the normal direction of the dielectric substrate 1, and the opening (notched portion) 17*ge* formed in the second insulating layer 17 overlaps the opening (notched portion) 11*ge* when viewed from the normal direction of the dielectric substrate 1.

As for the source terminal section ST similarly, in the TFT substrate 101A, the opening (notched portion) 4*se* formed in the gate insulating layer 4 constitutes the contact hole (notched portion) CH_se, and the contact hole (notched portion) CH_se is covered by the first insulating layer 11 and the second insulating layer 17. In contrast, in the TFT substrate 101C, the contact hole (notched portion) CH_se is constituted by the opening (notched portion) 4*se* formed in the gate insulating layer 4, the opening (notched portion) 11*se* formed in the first insulating layer 11, and the opening (notched portion) 17*se* formed in the second insulating layer 17. The opening (notched portion) 11*se* formed in the first insulating layer 11 overlaps the opening (notched portion) 4*se* when viewed from the normal direction of the dielectric substrate 1, and the opening (notched portion) 17*se* formed in the second insulating layer 17 overlaps the opening (notched portion) 11*se* when viewed from the normal direction of the dielectric substrate 1.

According to the TFT substrate 101C having such a structure also, the same effect as in the preceding embodiments can be obtained. As illustrated in FIG. 29D and FIGS. 30A to 30D, the cutting line CP is located over the first region 3*g*1 of the wiring line section 3*gw* and the first region 3*s*1 of the wiring line section 3*sw*. When cutting the wiring line section 3*gw*, the first region 3*g*1 of the wiring line section 3*gw* is cut, and when cutting the wiring line section 3*sw*, the first region 3*s*1 of the wiring line section 3*sw* is cut. The second conductive layer L2 is not formed on the cutting line CP. Thus, the second conductive layer L2 is not exposed on the cutting surface, similar to the cross-sections illustrated in FIGS. 30A and 30C. This suppresses the occurrence of such problems that the connection sections connected to different gate bus lines or different source bus lines are shorted. The TFT substrate 101C is excellent in reliability.

Further, the gate insulating layer 4 having the opening 4*ge* allows the TFT substrate 101C improved in reliability to be obtained while suppressing an increase in manufacturing cost (for example, the number of photomasks), as is described later in the method for manufacturing the TFT substrate 1010.

Manufacturing Method of TFT Substrate 101C

Figure 31A:
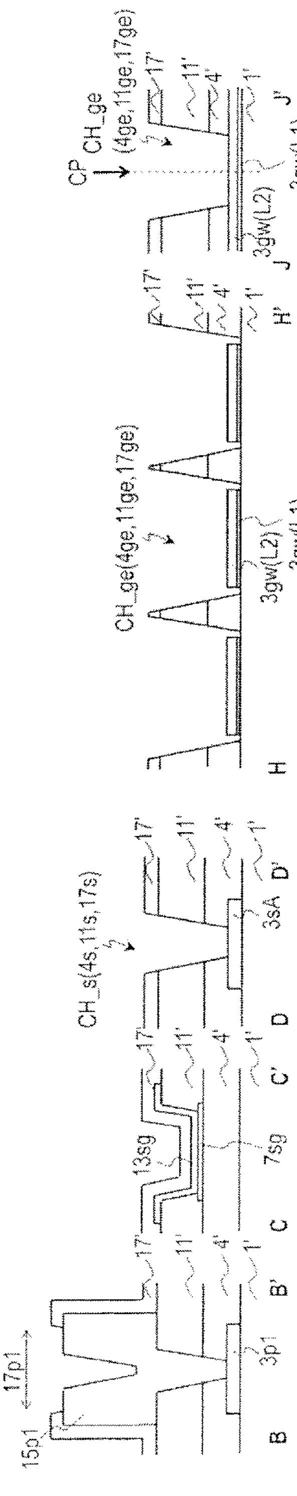
FIGS. 31A to 31C are schematic cross-sectional views for describing a method for manufacturing the TFT substrate 101C.
Figure 31B:
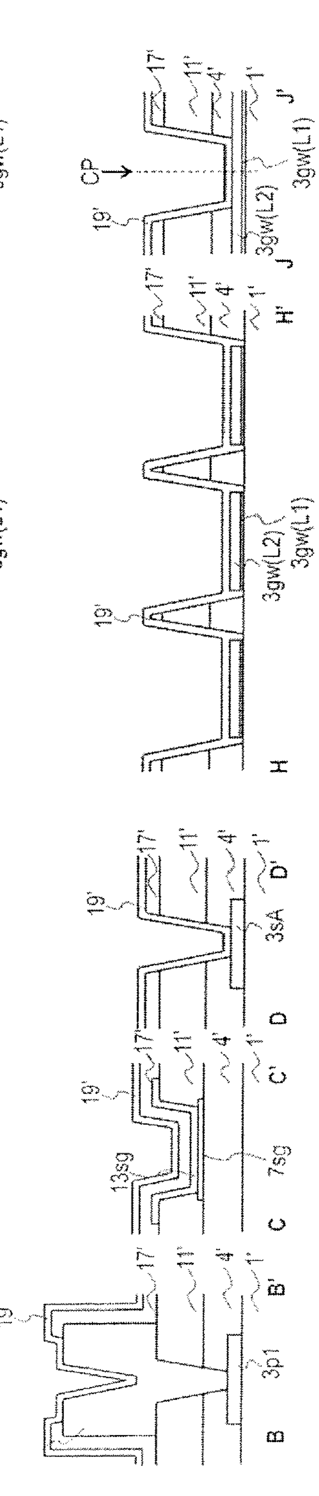
Figure 31C:
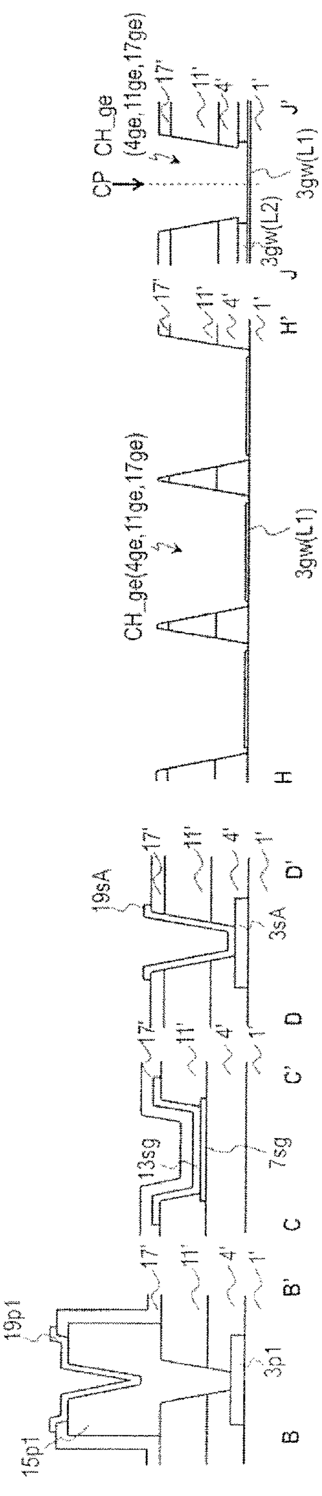

The method for manufacturing the TFT substrate 101C with reference to FIGS. 31A to 31C.

FIGS. 31A to 31C are schematic cross-sectional views for describing the method for manufacturing the TFT substrate 101C. These figures illustrate a cross section taken along a line A-A' illustrated in FIG. 29A, a cross section taken along a line C-C' illustrated in FIG. 29C, a cross section taken along a line G-G' illustrated in FIG. 29C, a cross section taken along a line H-H' illustrated in FIG. 29D, and a cross section taken along a line J-J' in FIG. 29D. Differences from the TFT substrate 101R of Reference Example 1 and the TFT substrate 101A according to Embodiment 1-1 will be mainly described.

First, similarly to the processes of manufacturing the TFT substrate 101R of Reference Example 1 described above with reference to FIGS. 9A to 9F, FIGS. 10A to 10F, FIG. 11A to 11D, FIGS. 12A to 12D, FIGS. 13A to 13C, and FIGS. 14A to 14C, formed on the mother glass substrate 1' are the gate metal layer 3, the gate insulating film 4', the semiconductor layer 5, the contact layer 6, the source metal layer 7, the first insulating film 11', the lower connection layer 13, the patch metal layer 151, and the second insulating film 17'. However, similar to the TFT substrate 101A according to the Embodiment 1-1, the gate metal layer 3 includes the first conductive layer L1 and the second conductive layer L2 formed on the first conductive layer L1.

Next, as illustrated in FIG. 30A, the second insulating film 17', the first insulating film 11', and the gate insulating film 4' are etched to form an opening in the second insulating film 17', the first insulating film 11', and the gate insulating film 4'. At this time, the contact hole CH_ge at least reaching the wiring line section 3*gw* is formed in the second insulating film 17', the first insulating film 11' and the gate insulating film 4'. The second insulating film 17', the first insulating film 11' and the gate insulating film 4' are collectively etched, for example, to form the contact hole CH_ge. The contact hole CH_ge includes the opening 4*ge* that is formed in the gate insulating layer 4 and at least reaches the wiring line section 3*gw*, the opening 11*ge* that is formed in the first insulating layer 11 and overlaps the opening 4*ge*, and the opening 17*ge* that is formed in the second insulating layer 17 and overlaps the opening 11*ge*. A side surface of the opening 4*ge*, a side surface of the opening 11*ge*, and a side surface of the opening 17*ge* may be aligned on a side surface of the contact hole CH_ge. The openings 4*ge* is formed to cover at least a portion of the wiring line section 3*gw* that is present on the cutting line CP when viewed from the normal direction of the mother glass substrate 1'. Here, the second insulating film 17', the first insulating film 11', and the gate insulating film 4' are etched by dry etching using a fluorine gas. The wiring line section 3*sw* is formed similarly to the wiring line section 3*gw*, and thus, the illustration and description thereof are omitted.

Next, as illustrated in FIG. 31B, the upper connection conductive film 19' is formed on the second insulating film 17', within the contact hole CH_s, within the contact hole CH_g, within the contact hole CH_c, within the opening 17*p*1, and within the contact hole CH_ge. The upper connection conductive film 19' is in contact with the second conductive layer L2 of the wiring line section 3*gw* within the opening 4*ge*.

Next, as illustrated in FIG. 31C, the upper connection conductive film 19' is patterned to obtain the upper connection layer 19. At this time, the second conductive layer L2 of the wiring line section 3*gw* exposed from the gate insulating film 4' within the opening 4*ge* is also patterned and removed. The second conductive layer L2 present at least on the cutting position CP is removed. The second conductive layer L2 and the upper connection conductive film 19' can be patterned using the same photomask. For example, in the case that a layer (MoN/Al) formed by layering an Al layer and a MoN layer in this order is used as the second conductive layer L2 of the gate metal layer 3, the upper connection conductive film 19' (for example, an ITO film) is patterned using oxalic acid to anneal the resulting upper connection layer 19, and thereafter, the second conductive layer L2 can be patterned by wet etching using an aqueous solution containing phosphoric acid, nitric acid, and acetic acid.

In the present embodiment, in the process of patterning the upper connection conductive film 19', the lower connection layer 13 (upper connection section 13*sg*) formed within the contact hole CH_sg1 in the source-gate connection section formation region (C—C' cross section and G-G' cross section) is covered by the second insulating layer 17. Therefore, compared to the second manufacturing method according to Embodiment 1-2, there is an advantage that the degree of freedom of selection of the material forming the lower connection layer 13 is high.

This allows the mother TFT substrate 100C to be obtained.

After that, the TFT substrate 101C is obtained by cutting the mother TFT substrate 100C along the cutting line CP. At this time, since the cutting line CP does not cut the second conductive layer L2 of the gate metal layer 3, the low resistance metal layer is not exposed at the cutting surface. Accordingly, the occurrence of the problem that adjacent wiring line sections are shorted can be suppressed. In addition, since the removal of the second conductive layer L2 is performed in the same process as the patterning of the upper connection conductive film 19', the TFT substrate improved in reliability is obtained while suppressing an increase in manufacturing cost (for example, the number of photomasks).

Embodiment 2-1

In the preceding Embodiments 1-1 to 1-3 above described, the wiring line sections of the gate terminal section and source terminal section are included in the gate metal layer. In contrast, in Embodiments 2-1 to 2-3 described below, the wiring line sections of the gate terminal section and source terminal section are included in the source metal layer.

A structure of a TFT substrate 101D according to Embodiment 2-1 of the disclosure will be described with reference to FIG. 32A to FIG. 34D. Differences from the TFT substrate 101A according to Embodiment 1-1 will be mainly described.

Figures 32A, 32B, 32C:
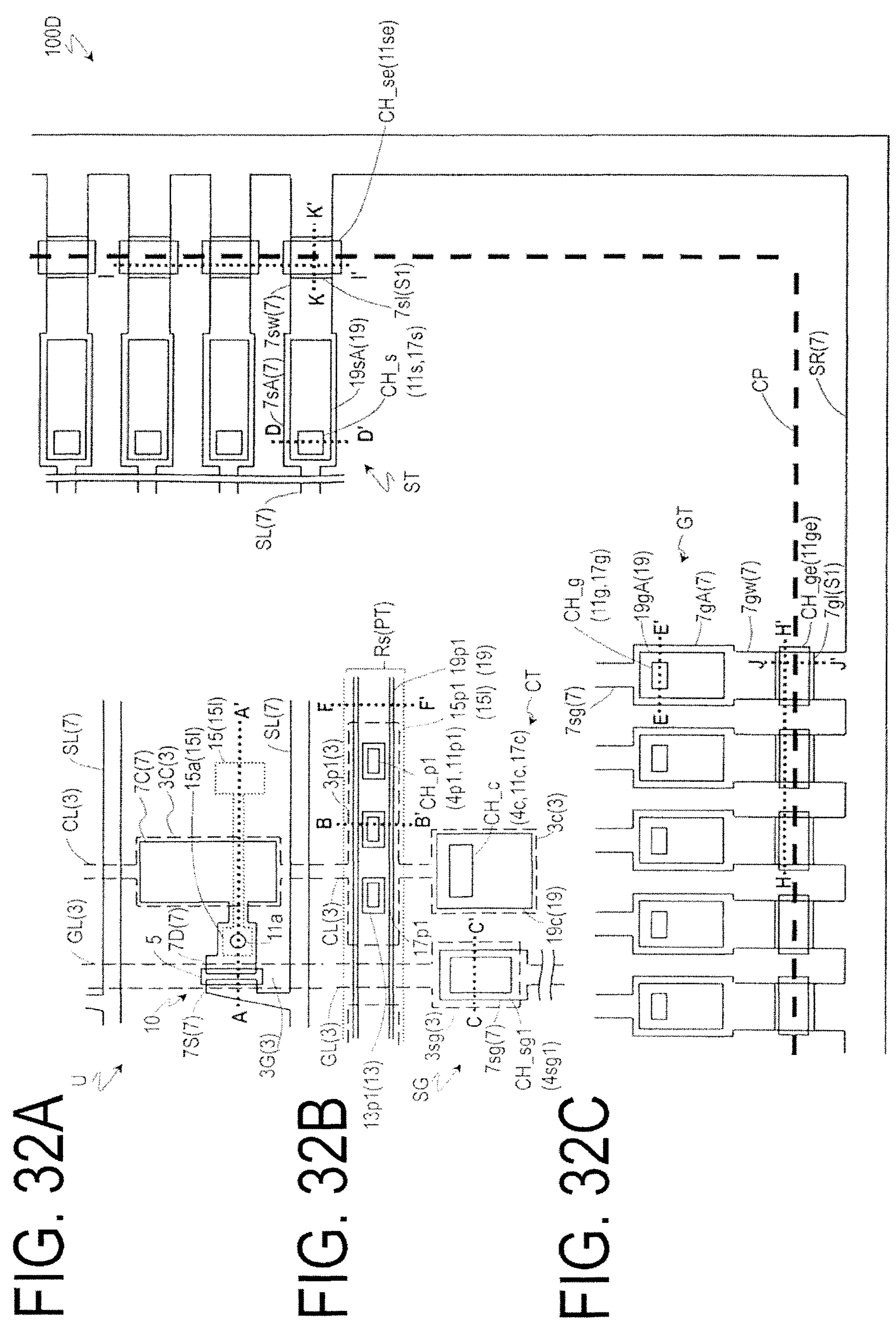
FIGS. 32A to 32C are plan views schematically illustrating a mother TFT substrate 100D used to fabricate a TFT substrate 101D according to Embodiment 2-1 of the disclosure.

FIGS. 32A to 32C are plan views schematically illustrating a mother TFT substrate 100D used to fabricate the TFT substrate 101D. Referring to FIGS. 32A to 32C, a structure and manufacturing method of the TFT substrate 101D will be described. The TFT substrate 101D is obtained by cutting (dividing) the mother TFT substrate 100D along the cutting line CP. In other words, the mother TFT substrate 100D includes a mother dielectric substrate (e.g., a mother glass substrate) and components of the TFT substrate 101D supported on the mother dielectric substrate. An edge of the dielectric substrate 1 and an edge of the TFT substrate 101D are defined by the cutting line CP.

FIG. 32A illustrates the antenna unit region U in the transmission and/or reception region R1, FIG. 32B illustrates the transfer section PT, the CS terminal section CT, and the source-gate connection section SG provided in the non-transmission and/or reception region R2. FIG. 32C illustrates the gate terminal section GT and the source terminal section ST provided in the non-transmission and/or reception region R2.

Figures 33A, 33B, 33C, 33D:
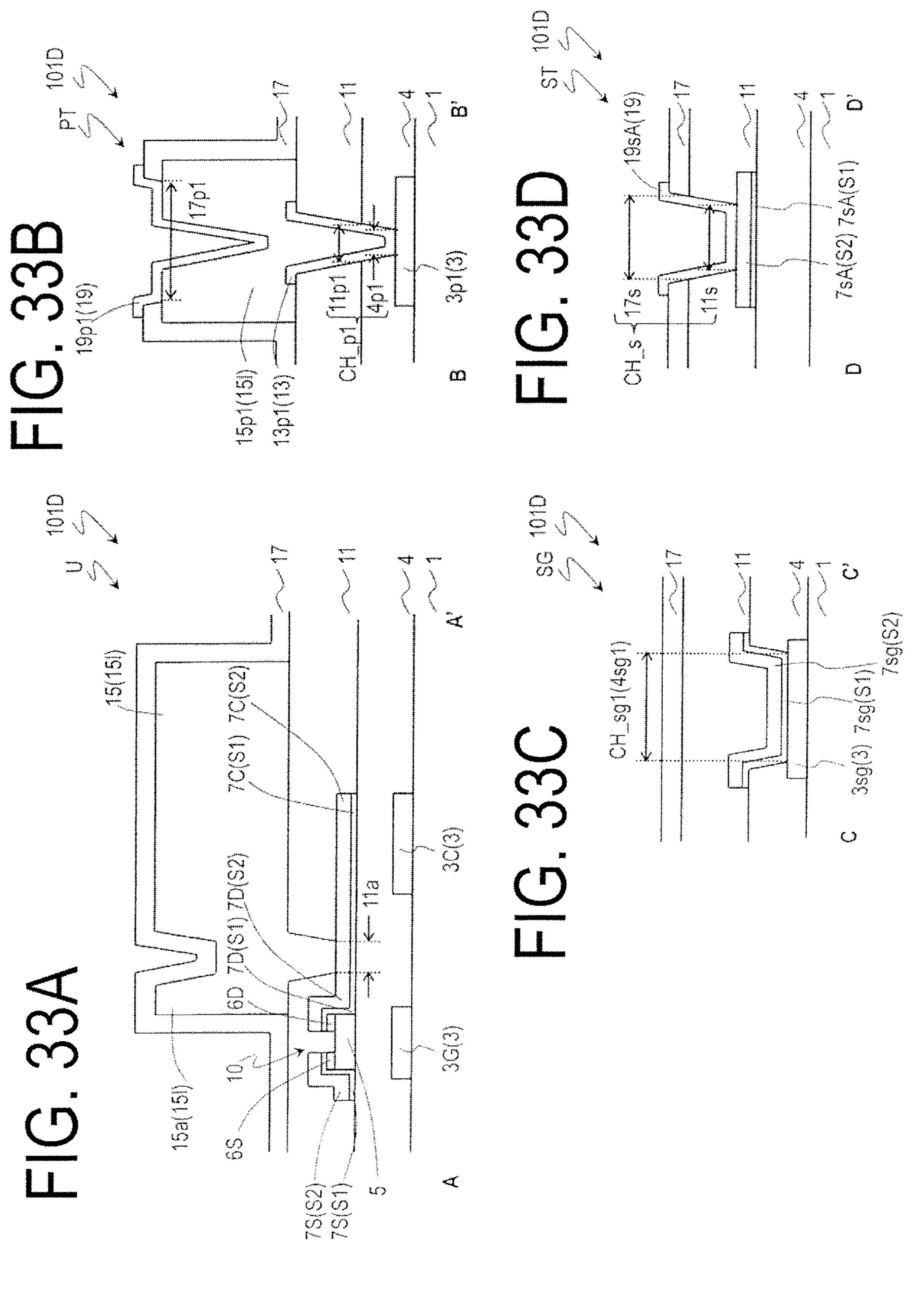
FIGS. 33A to 33D are schematic cross-sectional views of the TFT substrate 101D.
Figure 34A:
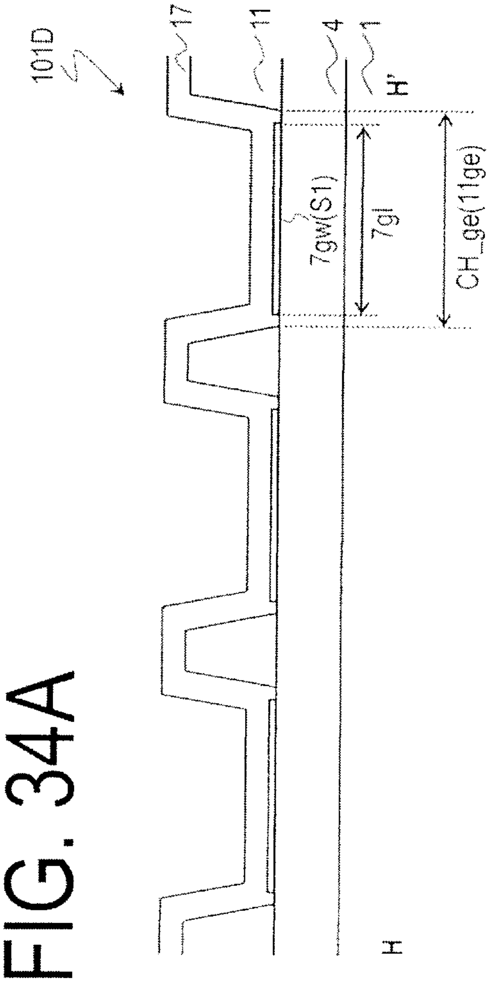
FIGS. 34A and 34C are schematic cross-sectional views of the TFT substrate 101D and FIGS. 34B and 34D are schematic cross-sectional views of the mother TFT substrate 100D.
Figure 34B:
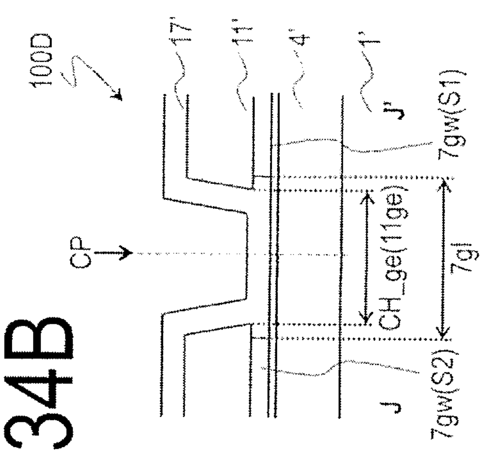
Figure 34C:
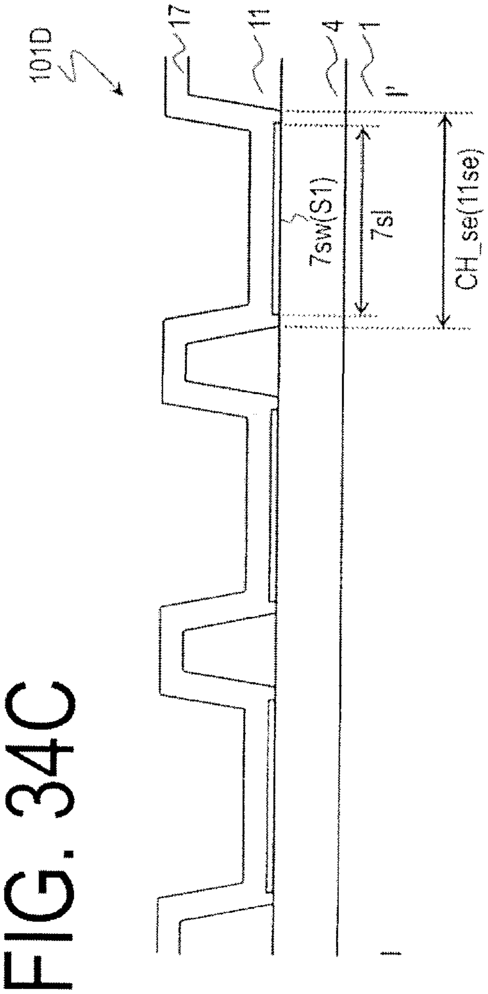
Figure 34D:
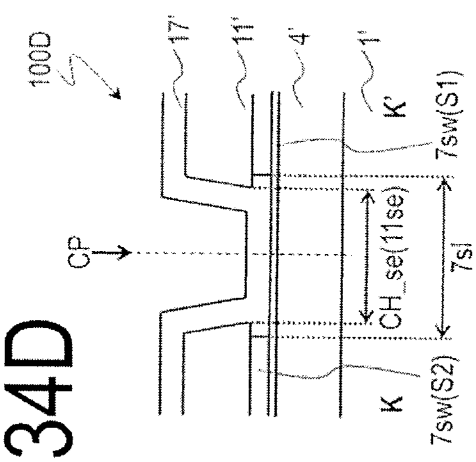

FIGS. 33A to 33D, and FIGS. 34A and 34C are schematic cross-sectional views of the TFT substrate 101D. FIG. 33A illustrates a cross section of the antenna unit region U corresponding to a line A-A' in FIG. 32A, FIG. 33B illustrates a cross section of the transfer section PT corresponding to a line B-B' in FIG. 32B, FIG. 33C illustrates a cross section of the source-gate connection section SG corresponding to a line C-C' in FIG. 32C, FIG. 33D illustrates a cross section of the source terminal section ST corresponding to a line D-D' in FIG. 32C, FIG. 34A illustrates a cross section near the cutting line CP corresponding to a line H-H' in FIG. 32C, and FIG. 34C illustrates a cross section near the cutting line CP corresponding to a line I-I' in FIG. 32C. FIGS. 34B and 34D are schematic cross-sectional views of the mother TFT substrate 100D. FIG. 34B illustrates a cross section near the cutting line CP along a line J-J' in FIG. 32C, and FIG. 349 illustrates a cross section near the cutting line CP along a line K-K' in FIG. 32C.

Source Terminal Section ST

Referring to FIG. 32C, FIG. 33C, FIG. 34C, and FIG. 34D, a structure and manufacturing method of the source terminal section ST included in the TFT substrate 101D will be described. Although the source terminal section ST of the TFT substrate 101A according to Embodiment 1-1 includes the lower connection section 3*s*A included in the gate metal layer 3, the source terminal section ST of the TFT substrate 101D includes the lower connection section 7*s*A included in the source metal layer 7. Differences from the source terminal section ST of the TFT substrate 101A will be mainly described.

The source terminal section ST includes the source terminal lower connection section 7*s*A (also simply referred to as a "lower connection section 7*s*A" or the "connection section 7*s*A"), and a source terminal wiring line section 7*sw* (also simply referred to as a "wiring line section 7*sw*") that extends from the lower connection section 7*s*A and at least reaches the edge of the dielectric substrate 1 when viewed from the normal direction of the dielectric substrate 1. The source terminal section ST further includes the opening 11*s* formed in the first insulating layer 11, the opening 17*s* formed in the second insulating layer 17, and the source terminal upper connection section 19*s*A (also simply referred to as the "upper connection section 19*s*A").

The lower connection section 7*s*A is electrically connected to the corresponding source bus line SL. In this example, the lower connection section 7*s*A extends from the corresponding source bus line SL and is formed integrally with the corresponding source bus line SL. The lower connection section 7*s*A and the wiring line section 7*sw* are included in the source metal layer 7. The source metal layer 7 includes a first conductive layer S1 that contains at least one selected from the group consisting of Ti, Ta, W, MoNb, Nb, Ni, In—Sn—O based oxide, In—Zn—O based oxide, and In—Ga—Zn—O based oxide, and a second conductive layer S2 that is disposed on the first conductive layer S1 and contains at least one element selected from the group consisting of Cu, Al, Ag, and Au.

The opening 11*s* formed in the first insulating layer 11 at least reaches the lower connection section 7*s*A.

The opening 17*s* formed in the second insulating layer 17 overlaps the opening 11*s* formed in the first insulating layer 11 when viewed from the normal direction of the dielectric substrate 1. The opening 11*s* formed in the first insulating layer 11 and the opening 17*s* formed in the second insulating layer 17 constitute the contact hole CH_s.

The upper connection section 19*s*A is included in the upper connection layer 19. The upper connection section 19*s*A is formed on the second insulating layer 17 and within the contact hole CH_s, and is electrically connected to the lower connection section 7*s*A within the contact hole CH_s. For example, the upper connection section 19*s*A is in contact with the lower connection section 7*s*A within the opening 11*s* formed in the first insulating layer 11.

A structure of the mother TFT substrate 100D will be described. The wiring line section 7*sw* includes a region (also referred to as a "first region") 7*s*1 that includes the first conductive layer S1 and does not include the second conductive layer S2. The first region 7*s*1 is provided in a region including at least the cutting line CP of the wiring line section 7*sw*. The first insulating layer 11 on the source metal layer 7, when viewed from the normal direction of the mother dielectric substrate (the dielectric substrate 1), includes the opening 11*se* overlapping at least a portion of the first region 7*s*1 (the region including at least the cutting line CP). The opening 11*se* at least reaches the first conductive layer S1 in the first region 7*s*1. The opening 11*se* may be referred to as the contact hole CH_se. The contact hole CH_se is covered with the second insulating layer 17.

The TFT substrate 101D is obtained by dividing the mother TFT substrate 100D having such a structure along the cutting line CP. As illustrated in FIG. 32C, the cutting line CP is located over the first region 7*s*1 of the wiring line section 7*sw*. When cutting the wiring line section 7*sw*, the first region 7*s*1 of the wiring line section 7*sw* is cut. In other words, the second conductive layer S2 is not formed on the cutting line CP. Thus, the second conductive layer S2 is not exposed on the cutting surface, similar to the cross section illustrated in FIG. 34D. This suppresses the occurrence of such problems that the connection sections connected to different source bus lines are shorted. The TOT substrate 101D is excellent in reliability.

An edge of the dielectric substrate 1 and an edge of the TFT substrate 101D are defined by the cutting line CP. The cutting line CP is located to divide the first region 7*s*1 of the wiring line section 7*sw* of the mother TFT substrate 100D. The wiring line section 7*sw* (first region 7*s*1) of the mother TFT substrate 100D is divided along the cutting line CP to obtain the wiring line section 7*sw* (first region 7*s*1) included in the source terminal section ST of the TFT substrate 101D. The edge of the wiring line section 7*sw* (the edge of the first region 7*s*1) included in the source terminal section ST of the TOT substrate 101D is defined by the cutting line CP, and thus, substantially conforms to the edge of the dielectric substrate 1. The first region 7*s*1 of the wiring line section 7*sw* included in the source terminal section ST of the TOT substrate 101D has an edge side (also referred to as a "first edge side") substantially conforms to the edge of the dielectric substrate 1.

The first insulating layer 11 having the opening 11*se* allows the TFT substrate 101D improved in reliability to be obtained while suppressing an increase in manufacturing cost, as is described later in the method for manufacturing the TFT substrate 101D.

Source-Gate Connection Section SG and Gate Terminal Section GT

The TFT substrate 101D includes the source-gate connection section SG corresponding to each of the gate bus lines GL, and the source-gate connection section SG electrically connects each gate bus line GL to a connection wiring line formed in the source metal layer 7. This allows the gate terminal section GT to have a structure similar to that of the source terminal section ST as illustrated in FIG. 32C.

As illustrated in FIG. 32B and FIG. 33C, the source-gate connection section SG of the TFT substrate 101D includes the source lower connection wiring line 3*sg*, the opening 4*sg*1 formed in the gate insulating layer 4, and the source bus line connection section 7*sg*.

The source lower connection wiring line 3*sg* is included in the gate metal layer 3 and electrically connected to the corresponding gate bus line GL. In this example, the source lower connection wiring line 3*sg* extends from the corresponding gate bus line GL and is formed integrally with the gate bus line GL.

The opening 4*sg*1 formed in the gate insulating layer 4 at least reaches the source lower connection wiring line 3*sg*. The opening 4*sg*1 may be referred to as the contact hole CH_sg1.

The source bus line connection section 7*sg* is included in the source metal layer 7 and electrically connected to a lower connection section 7*g*A of the corresponding gate terminal section GT. The source bus line connection section 7*sg* is formed within the contact hole CH_sg1, and is electrically connected to the source lower connection wiring line 3*sg* within the contact hole CH_sg1. A portion of the source lower connection wiring line 3*sg* exposed by the opening 4*sg*1 is preferably covered by the source bus line connection section 7*sg*.

The gate terminal section GT includes the gate terminal lower connection section 7*g*A (also simply referred to as the "lower connection section 7*g*A" or the "connection section 7*g*A") and a gate terminal wiring line section 7*gw* (also simply referred to as a "wiring line section 7*gw*") that extends from the lower connection section 7*g*A and at least reaches the edge of the dielectric substrate 1 when viewed from the normal direction of the dielectric substrate 1. The gate terminal section GT further includes the opening 11*g* formed in the first insulating layer 11, the opening 17*g* formed in the second insulating layer 17, and the gate terminal upper connection section 19*g*A (also simply referred to as the "upper connection section 19*g*A"). The opening 11*g* formed in the first insulating layer 11 and the opening 17*g* formed in the second insulating layer 17 constitute the contact hole CH_g.

The structure of the mother TFT substrate 100D will be described. The wiring line section 7*gw* includes a region (also referred to as a "first region") 7*g*1 that includes the first conductive layer S1 and does not include the second conductive layer S2. The first region 7*g*1 is provided in a region including at least the cutting line CP of the wiring line section 7*gw*. The first insulating layer 11 on the source metal layer 7, when viewed from the normal direction of the mother dielectric substrate (the dielectric substrate 1), includes the opening 11*ge* overlapping at least a portion of the first region 7*g*1 (the region including at least the cutting line CP). The opening 11*ge* at least reaches the first conductive layer S1 in the first region 7*g*1. The opening 11*ge* may be referred to as the contact hole CH_ge. The contact hole CH_ge is covered with the second insulating layer 17.

The TFT substrate 101D is obtained by dividing the mother TFT substrate 100D having such a structure along the cutting line CP. As illustrated in FIG. 32C, the cutting line CP is located over the first region 7*g*1 of the wiring line section 7*gw*. When cutting the wiring line section 7*gw*, the first region 7*g*1 of the wiring line section 7*gw* is cut. In other words, the second conductive layer S2 is not formed on the cutting line CP. Thus, the second conductive layer S2 is not exposed on the cutting surface, similar to the cross section illustrated in FIG. 34B. This suppresses the occurrence of such problems that the connection sections connected to different gate bus lines are shorted. The TFT substrate 101D is excellent in reliability.

An edge of the dielectric substrate 1 and an edge of the TFT substrate 101D are defined by the cutting line CP. The cutting line CP is located to divide the first region 7*g*1 of the wiring line section 7*gw* of the mother TFT substrate 100D. The wiring line section 7*gw* (first region 7*g*1) of the mother TFT substrate 100D is divided along the cutting line CP to obtain the wiring line section 7*gw* (first region 7*g*1) included in the gate terminal section GT of the TFT substrate 101D. The edge of the wiring line section 7*gw* (the edge of the first region 7*g*1) included in the gate terminal section GT of the TFT substrate 101D is defined by the cutting line CP, and thus, substantially conforms to the edge of the dielectric substrate 1. The first region 7*g*1 of the wiring line section 7*gw* included in the gate terminal section GT of the TFT substrate 101D has an edge side (also referred to as a "first edge side") substantially conforms to the edge of the dielectric substrate 1.

The first insulating layer 11 having the opening 11*ge* allows the TFT substrate 101D improved in reliability to be obtained while suppressing an increase in manufacturing cost, as is described later in the method for manufacturing the TFT substrate 101D.

The structure other than the gate terminal section GT and the source terminal section ST of the TFT substrate 101D will be described below, but embodiments of the disclosure are not limited to those illustrated, and may be modified as appropriate.

Transfer Section PT

The transfer section PT of the TFT substrate 101D differs, from the transfer section PT of the TFT substrate 101A according to Embodiment 1-1, in further including first conductive portion 13*p*1 included in the lower connection layer 13 as illustrated in FIG. 32B and FIG. 33B.

Specifically, the transfer section PT of the TFT substrate 101D includes the transfer lower connection section 3*p*1, the opening 4*p*1 formed in the gate insulating layer 4, the opening 11*p*1 formed in the first insulating layer 11, the first conductive portion for transfer 13*p*1 (also simply referred to as a "first conductive portion 13*p*1"), the second conductive portion for transfer 15*p*1 (also simply referred to as the "second conductive portion 15*p*1"), the opening 17*p*1 formed in the second insulating layer 17, and the transfer upper connection section 19*p*1 as illustrated in FIG. 32B and FIG. 33B.

The lower connection section 3*p*1 is included in the gate metal layer 3. That is, the lower connection section 3*p*1 is formed of the same conductive film as that of the gate bus line GL. The lower connection section 3*p*1 is electrically separate from the gate bus line GL. For example, in a case where the CS bus line CL is supplied with the same voltage as the slot voltage, the lower connection section 3*p*1 is electrically connected to, for example, the CS bus line CL. As is illustrated, the lower connection section 3*p*1 may extend from the CS bus line. However, the lower connection section 3*p*1 is not limited to the illustrated example and may be electrically separate from the CS bus line.

The opening 4*p*1 formed in the gate insulating layer 4 at least reaches the lower connection section 3*p*1.

The opening 11*p*1 formed in the first insulating layer 11 overlaps the opening 4*p*1 formed in the gate insulating layer 4 when viewed from the normal direction of the dielectric substrate 1. The opening 4*p*1 formed in the gate insulating layer 4 and the opening 11*p*1 formed in the first insulating layer 11 constitute a contact hole CH_p1.

The first conductive portion 13*p*1 is included in the lower connection layer 13. The first conductive portion 13*p*1 is formed on the first insulating layer 11 and within the contact hole CH_p1, and is connected to the lower connection section 3*p*1 within the contact hole CH_p1. Here, the first conductive portion 13*p*1 is in contact with the lower connection section 3*p*1 within the opening 4*p*1.

The second conductive portion 15*p*1 is included in the patch metal layer 151. The second conductive portion 15*p*1 is formed on the first conductive portion 13*p*1. The second conductive portion 15*p*1 is electrically connected to the first conductive portion 13*p*1. For example, here, the second conductive portion 15*p*1 is in direct contact with the first conductive portion 13*p*1.

The opening (contact hole) 17*p*1 formed in the second insulating layer 17 at least reaches the second conductive portion 15*p*1.

The upper connection section 19*p*1 is included in the upper connection layer 19. The upper connection section 19*p*1 is formed on the second insulating layer 17 and within the opening 17*p*1, and is connected to the second conductive portion 15*p*1 within the opening 17*p*1. Here, the upper connection section 19*p*1 is in contact with the second conductive portion 15*p*1 within the opening 17*p*1. The upper connection section 19*p*1 is connected to the transfer terminal connection section on the slot substrate side by, for example, a sealing member including conductive particles.

In this example, the transfer section PT does not include the conductive portion included in the source metal layer 7.

The transfer section PT includes the first conductive portion 13*p*1 and second conductive portion 15*p*1 between the lower connection section 3*p*1 and the upper connection section 19*p*1. This allows the transfer section PT to have an advantage that an electric resistance between the lower connection section 3*p*1 and the upper connection section 19*p*1 is low.

An entire of the upper connection section 19*p*1 may overlap the second conductive portion 15*p*1 when viewed from the normal direction of the dielectric substrate 1.

In this example, the lower connection section 3*p*1 is disposed between two gate bus lines GL adjacent to each other. Two lower connection sections 3*p*1 disposed with the gate bus line GL being interposed therebetween may be electrically connected to each other via a conductive connection section (not illustrated). The conductive connection section may be formed of the same conductive film as that of the source bus line, for example.

Here, a plurality of contact holes CH_p1 are provided so that the lower connection section 3*p*1 is connected to the upper connection section 19*p*1 with the first conductive portion 13*p*1 and second conductive portion 15*p*1 interposed therebetween, but one or more contact holes CH_p1 may be provided to one lower connection section 3*p*1. One contact hole may be provided to one lower connection section 3*p*1. The number of contact holes or the shapes thereof are not limited to the illustrated example.

Here, although the first conductive portion 13*p*1 is formed to overlap the respective contact holes CH_p1, the shape of the first conductive portion 13*p*1 is not limited thereto. The first conductive portion may be formed to overlap a plurality of contact holes CH_p1.

Here, the upper connection section 19*p*1 is connected to the first conductive portion 13*p*1 and second conductive portion 15*p*1 through one opening 17*p*1, but one or more openings 17*p*1 may be provided to one upper connection section 19*p*1. A plurality of openings may be provided to one upper connection section 19*p*1. The number of openings or the shapes thereof are not limited to the illustrated example.

Manufacturing Method of TFT Substrate 101D

A method for manufacturing the TFT substrate 101D according to Embodiment 2-1 will be described with reference to FIG. 35A to FIG. 38C. According to the manufacturing method described below, the TFT substrate 101D improved in reliability is obtained while suppressing an increase in manufacturing cost (for example, the number of photomasks). Differences from the TFT substrate 101R of Reference Example 1 and the TFT substrate 101A according to Embodiment 1-1 will be mainly described.

FIGS. 35A to 35C, FIGS. 36A to 36C, and FIGS. 37A to 37C, and FIGS. 38A to 38C are schematic cross-sectional views for describing the method for manufacturing the TFT substrate 101D. These figures illustrate a cross section taken along a line A-A' illustrated in FIG. 32A, a cross section taken along a line C-C' illustrated in FIG. 32B, a cross section taken along a line D-D' illustrated in FIG. 32C, a cross section taken along a line H-H' illustrated in FIG. 32C, and a cross section taken along a line J-J' in FIG. 32C.

Figures 35A, 35B, 35C:
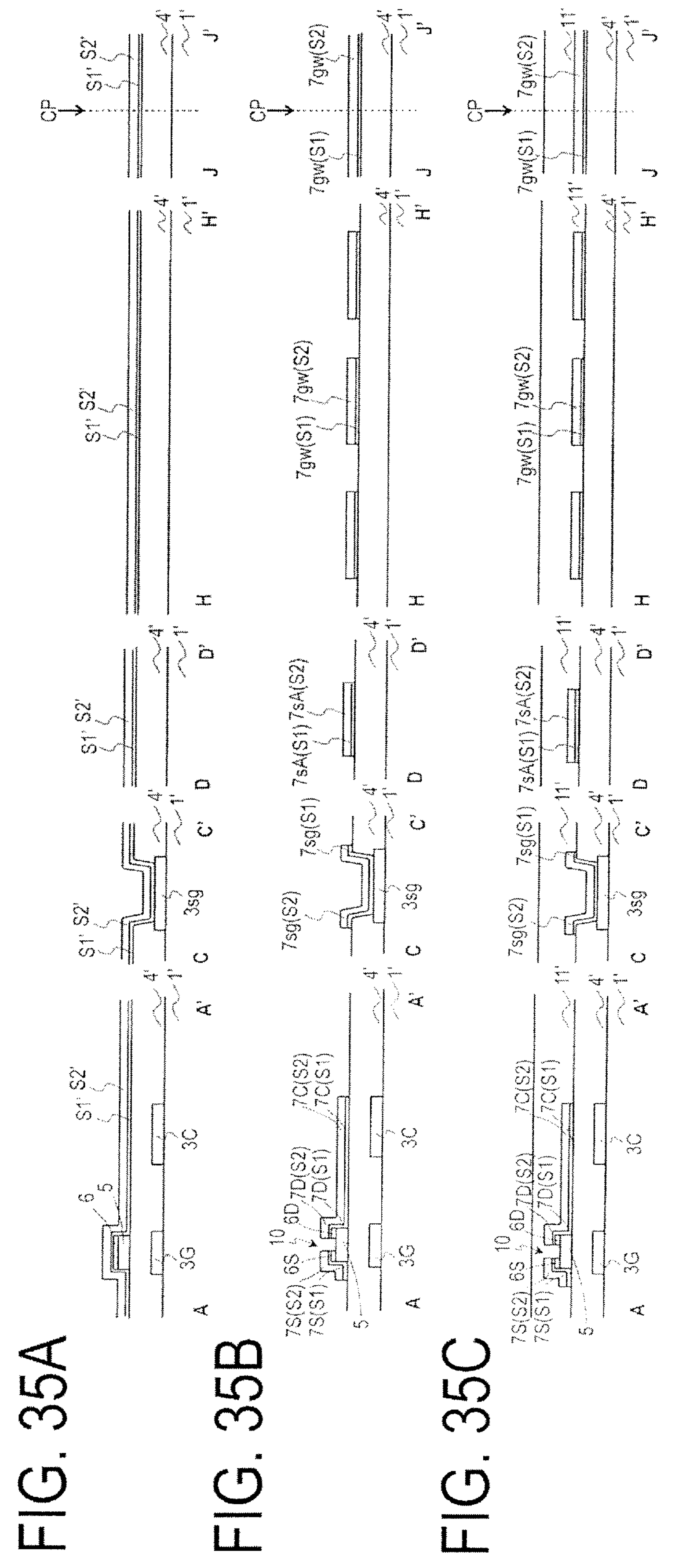
FIGS. 35A to 35C are schematic cross-sectional views for describing a method for manufacturing the TFT substrate 101D.

First, as illustrated in FIG. 35A, formed on the mother glass substrate 1' are the gate metal layer 3, the gate insulating film 4', the semiconductor layer 5, the contact layer 6, a first conductive film S1', and a second conductive film S2'. Here, a Ti film (having a thickness of 100 nm, for example) is used as the first conductive film S1', and a layered film (MoN/Al) is used, as the second conductive film S2', which is formed by layering an Al film (having a thickness of 150 nm, for example) and a MoN film (having a thickness of 100 nm, for example) in this order. In this case, the source metal layer 7 includes a Ti layer as the first conductive layer S1, and a layer (MoN/Al), as the second conductive layer S2, formed by layering an Al layer and a MoN layer in this order. Specifically, the source metal layer 7 includes a layer (MoN/Al/Ti) formed by layering a Ti layer, an Al layer, and a MoN layer in this order.

Alternatively, a Ti film (having a thickness of 50 nm, for example) may be used as the first conductive film S1', and a Cu film (having a thickness of 150 nm, for example) may be used as the second conductive film S2'. In this case, the gate metal layer 3 includes a layer (Cu/Ti) formed by layering a Ti layer and a Cu layer in this order.

Next, as illustrated in FIG. 35B, the first conductive film S1', the second conductive film S2', and the contact layer 6 are patterned to obtain the source metal layer 7 including the first conductive layer S1 and the second conductive layer S2 disposed on the first conductive layer S1, and the source contact layer 6S and the drain contact layer 6D.

Next, as illustrated in FIG. 35C, the first insulating film 11' is formed to cover the TFT 10 and the source metal layer 7.

Figure 36A:
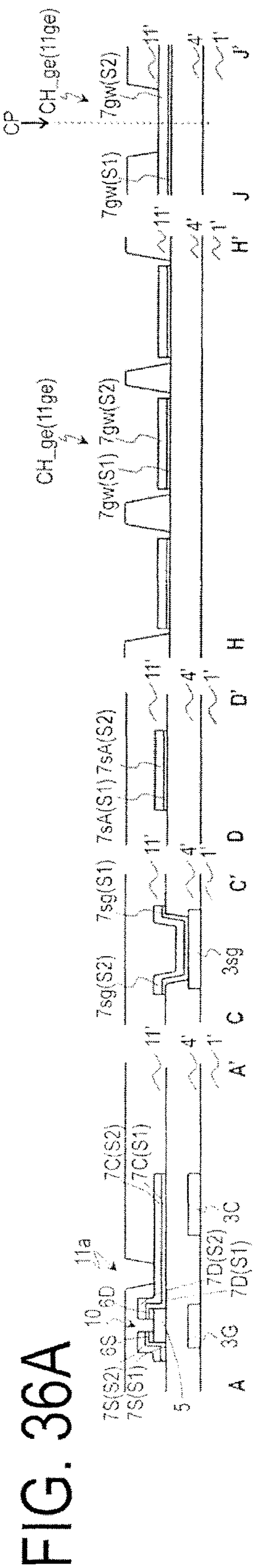
FIGS. 36A to 36C are schematic cross-sectional views for describing a method for manufacturing the TFT substrate 101D.

Next, as illustrated in FIG. 36A, the first insulating film 11' and the gate insulating film 4' are etched to form an opening in the first insulating film 11' and gate insulating film 4'. At this time, the opening 11*ge* that reaches the wiring line section 7*gw* is formed in the first insulating film 11'. The openings 11*ge* is formed to cover at least a portion of the wiring line section 7*gw* that is present on the cutting line CP when viewed from the normal direction of the mother glass substrate 1'. Here, the first insulating film 11' and the gate insulating film 4' are etched by dry etching using a fluorine gas. Similarly, although not illustrated, the opening 11*se* that at least reaches the wiring line section 7*sw* is formed in the first insulating film 11' (a cross section taken along a line K-K' in FIG. 32C). The opening 11*se* is formed to cover at least a portion of the wiring line section 7*sw* that is present on the cutting position CP when viewed from the normal direction of the mother glass substrate 1'.

Figure 36B:
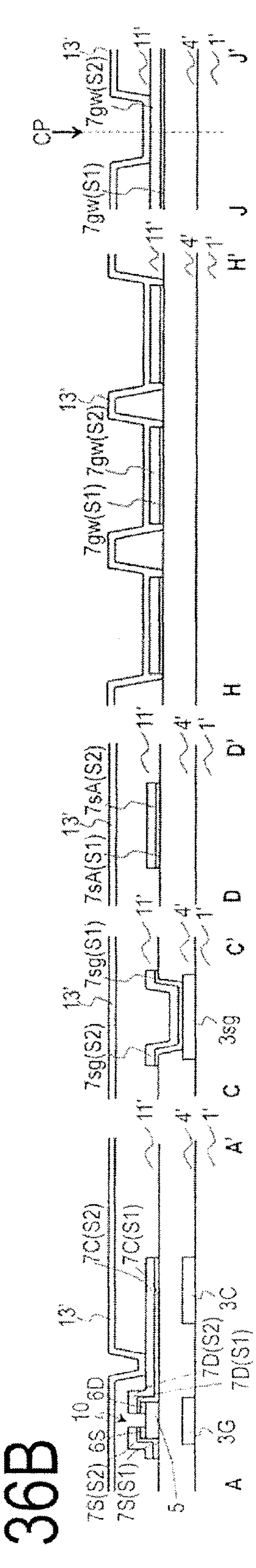

Next, as illustrated in FIG. 36B, the lower connection conductive film 13' is formed on the first insulating film 11', within the opening 11*a*, within the contact hole CH_sg, within the opening 11*sg*2, within the contact hole CH_p1, within the contact hole CH_ge, and within the contact hole CH_se. The lower connection conductive film 13' is in contact with the wiring line section 7*gw* and the wiring line section 7*sw* within the opening 11*ge* and within the opening 11*se*, respectively.

Figure 36C:
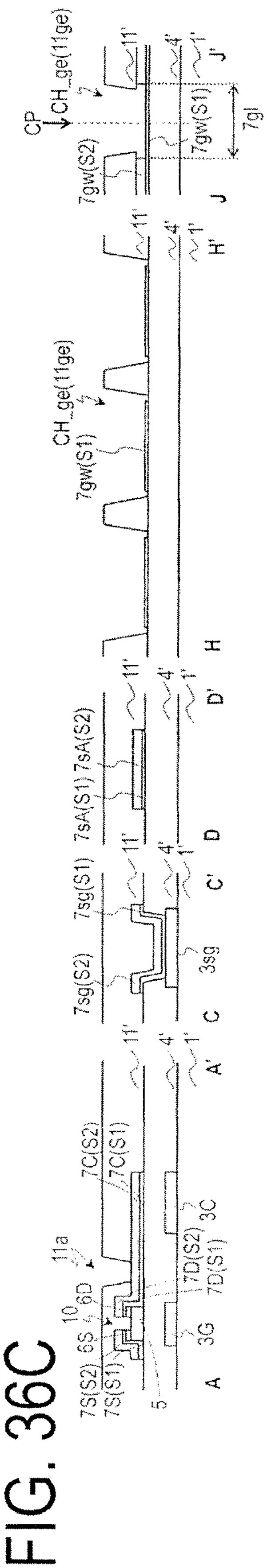

Next, as illustrated in FIG. 36C, the lower connection conductive film 13' is patterned to obtain the lower connection layer 13. At this time, the second conductive layer S2 of the wiring line section 7*gw* exposed from the first insulating film 11' within the opening 11*ge* is also patterned and removed. Similarly, the second conductive layer S2 of the wiring line section 7*sw* exposed from the first insulating film 11' within the opening 11*se* is also patterned and removed. The second conductive layer S2 present at least on the cutting position CP is removed. The second conductive layer S2 and the lower connection conductive film 13' can be patterned using the same photomask. For example, in a case that a layer (MoN/Al) formed by layering an Al layer and a MoN layer in this order is used as the second conductive layer S2 of the source metal layer 7, the lower connection conductive film 13' (for example, an ITO film) is patterned using oxalic acid to anneal the resulting lower connection layer 13, and thereafter, the second conductive layer S2 can be patterned by wet etching using an aqueous solution containing phosphoric acid, nitric acid, and acetic acid.

Note that in the step of patterning the lower connection conductive film 13', the source bus line connection section 7*sg* formed within the contact hole CH_sg1 in the source-gate connection section formation region (C—C' cross-section) is covered with the first insulating layer 11.

By performing the above processes, when the mother TFT substrate 100D is cut along the cutting line CP at the end of the manufacturing process, the second conductive layer S2 is not exposed on the cutting surface. In addition, since the removal of the second conductive layer S2 is performed in the same process as patterning the lower connection conductive film 13', the TFT substrate improved in reliability is obtained while suppressing an increase in manufacturing cost (for example, the number of photomasks).

After that, the TFT substrate 101D can be fabricated by the same process as the TFT substrate 101R of Reference Example 1 as illustrated below.

Figures 37A, 37B, 37C:
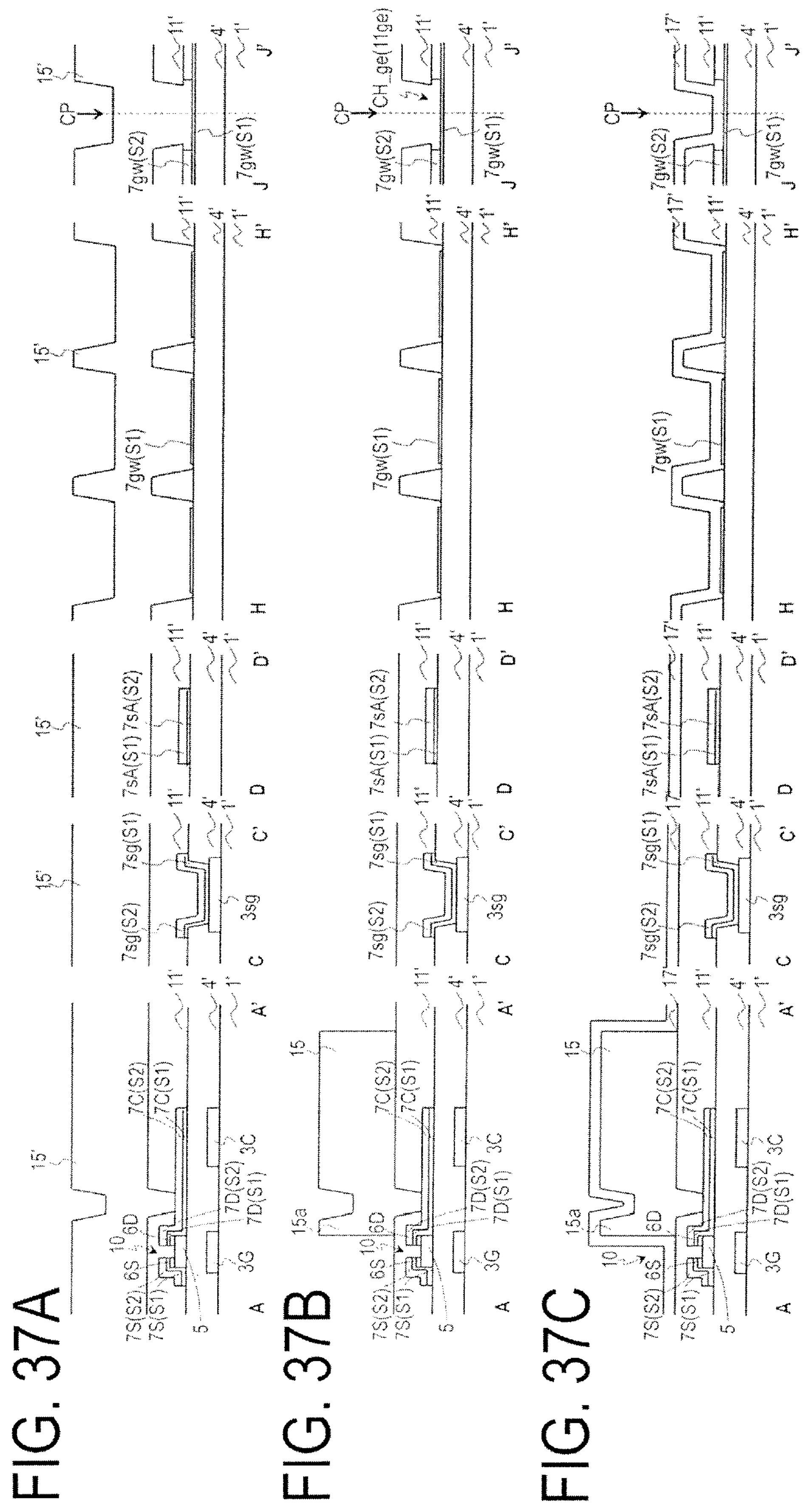
FIGS. 37A to 37C are schematic cross-sectional views for describing the method for manufacturing the TFT substrate 101D.

Subsequently, as illustrated in FIG. 37A, the patch conductive film 15' is formed on the first insulating film 11' and on the lower connection layer 13.

Next, as illustrated in FIG. 37B, the patch conductive film 15' is patterned to obtain the patch metal layer 151.

Next, as illustrated in FIG. 37C, the second insulating film 17' is formed on the patch metal layer 151, on the lower connection layer 13, on the first insulating film 11', and on the second insulating film 17'.

Figure 38A:
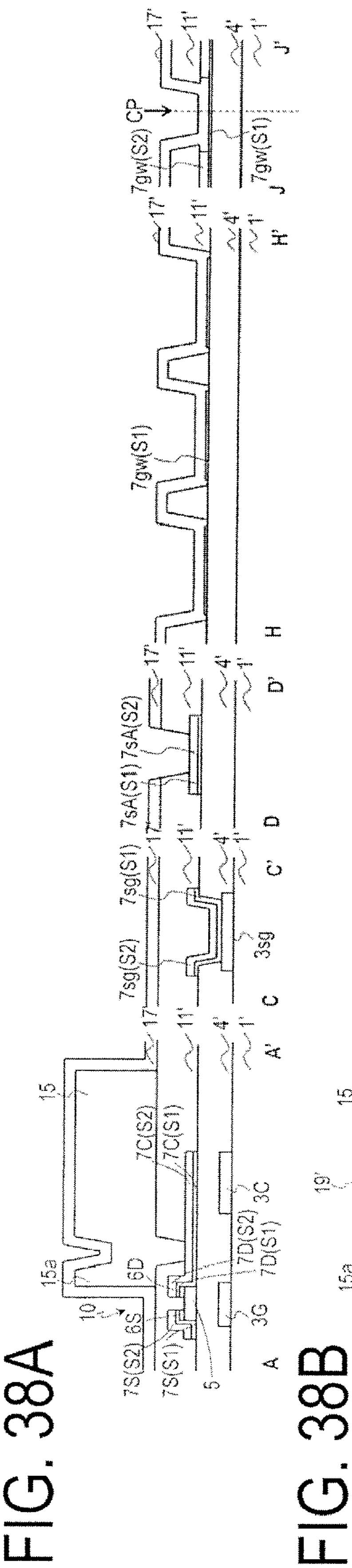
FIGS. 38A to 38C are schematic cross-sectional views for describing the method for manufacturing the TFT substrate 101D.

Subsequently, as illustrated in FIG. 38A, the second insulating film 17', the first insulating film 11', and the gate insulating film 4' are etched to form an opening in the second insulating film 17', the first insulating film 11', and the gate insulating film 4'.

Figure 38B:
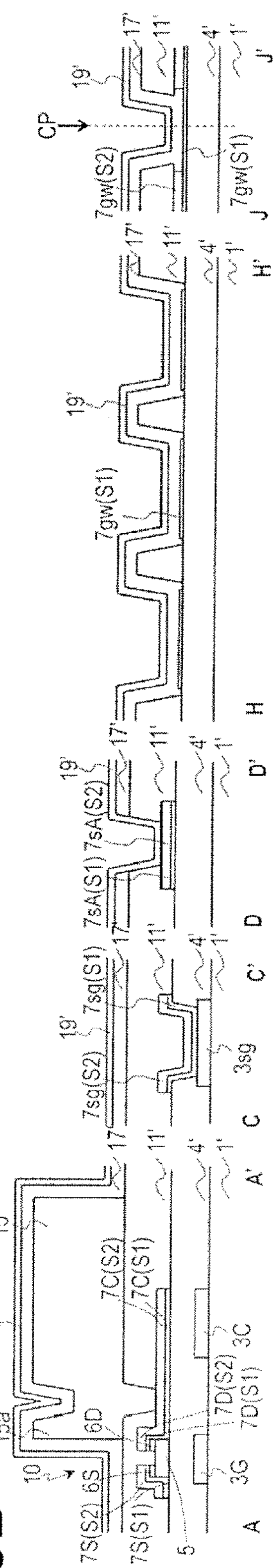

Next, as illustrated in FIG. 38B, the upper connection conductive film 19' is formed on the second insulating film 17', within the contact hole CH_s, within the contact hole CH_g, within the contact hole CH_c, and within the opening 17*p*1.

Figure 38C:
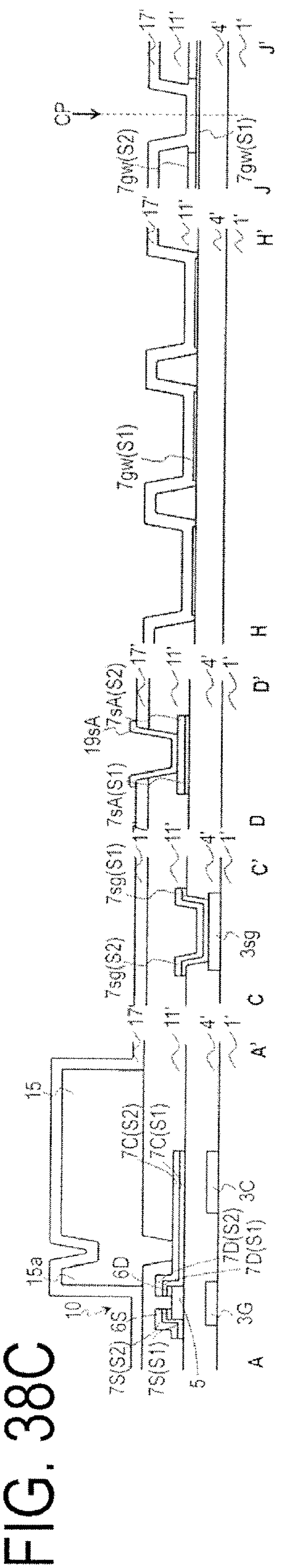

Next, as illustrated in FIG. 38C, the upper connection conductive film 19' is patterned to obtain the upper connection layer 19. This allows the TFT substrate 100D to be obtained.

After that, the TFT substrate 101D is obtained by cutting the mother TFT substrate 100D along the cutting line CP. At this time, since the cutting line CP does not cut the second conductive layer S2 of the source metal layer 7, the low resistance metal layer is not exposed at the cutting surface. Accordingly, the occurrence of the problem that adjacent wiring line sections are shorted can be suppressed. In addition, at this time, because the mother TFT substrate 100D is divided along the cutting line CP passing over the opening 11*ge*, the opening 11*ge* included in the TFT substrate 101D is a portion formed by cutting away the first insulating layer 11 from the edge of the TFT substrate 101D.

Modification Example of Embodiment 2-1

A structure of a TFT substrate 101Da according to a modification example of Embodiment 2-1 of the disclosure will be described with reference to FIGS. 39A to 39C and FIG. 40. Differences from the TFT substrate 101D will be mainly described.

Figures 39A, 39B, 39C:
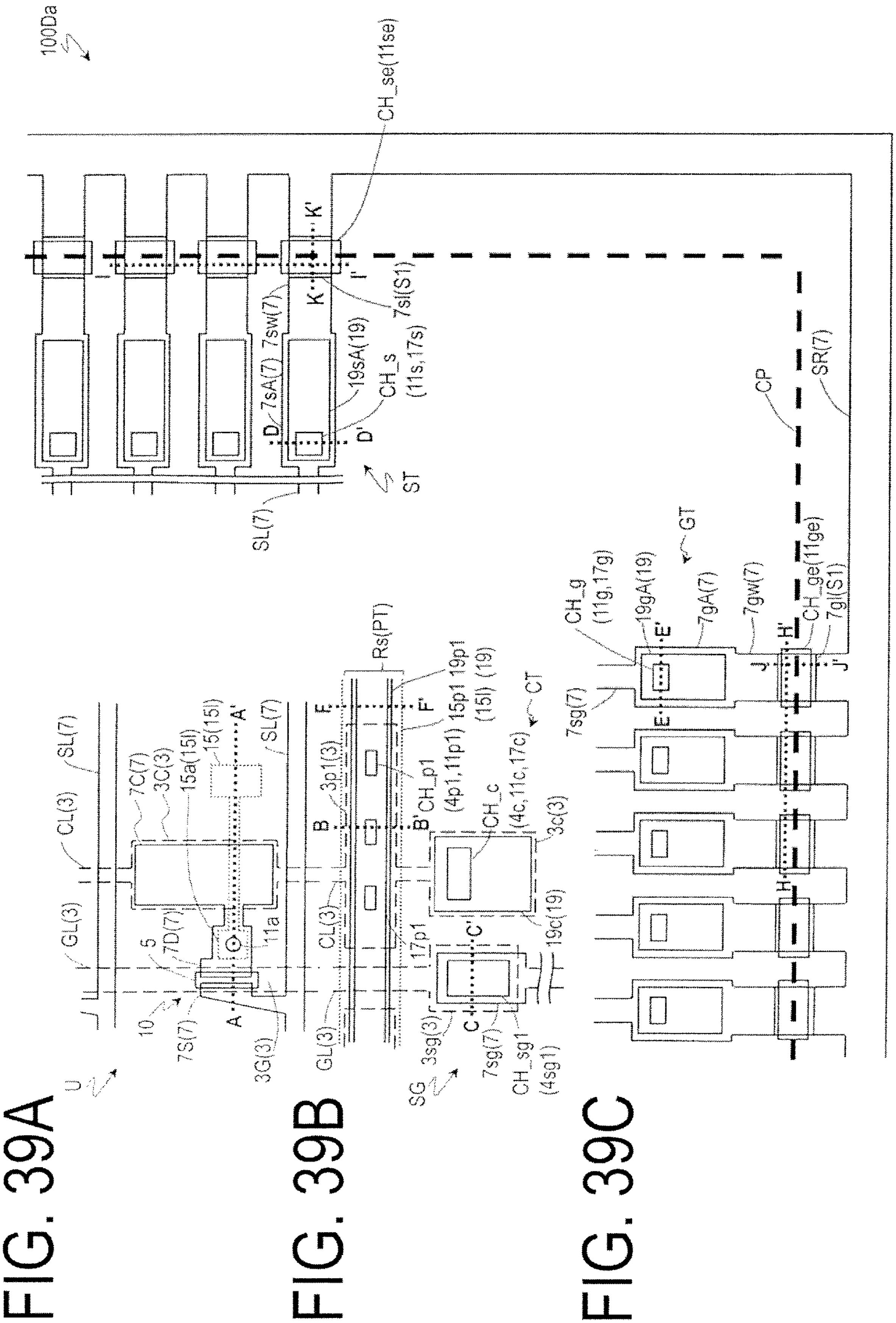
FIGS. 39A to 39C are plan views schematically illustrating a mother TFT substrate 100Da used to fabricate a TFT substrate 101Da according to a modification example of Embodiment 2-1 of the present embodiment.

FIGS. 39A to 39C are plan views schematically illustrating a mother TFT substrate 100Da used to fabricate the TFT substrate 101Da. Referring to FIGS. 39A to 39C, a structure and manufacturing method of the TFT substrate 101Da will be described. The TFT substrate 101Da is obtained by cutting (dividing) the mother TFT substrate 100Da along the cutting line CP. In other words, the mother TFT substrate 100Da includes a mother dielectric substrate (e.g., a mother glass substrate) and components of the TFT substrate 101Da supported on the mother dielectric substrate. An edge of the dielectric substrate 1 and an edge of the TFT substrate 101Da are defined by the cutting line CP.

FIG. 39A illustrates the antenna unit region U in the transmission and/or reception region R1, FIG. 39B illustrates the transfer section PT, the CS terminal section CT, and the source-gate connection section SG provided in the non-transmission and/or reception region R2. FIG. 39C illustrates the gate terminal section GT and the source terminal section ST provided in the non-transmission and/or reception region R2.

Figure 40:
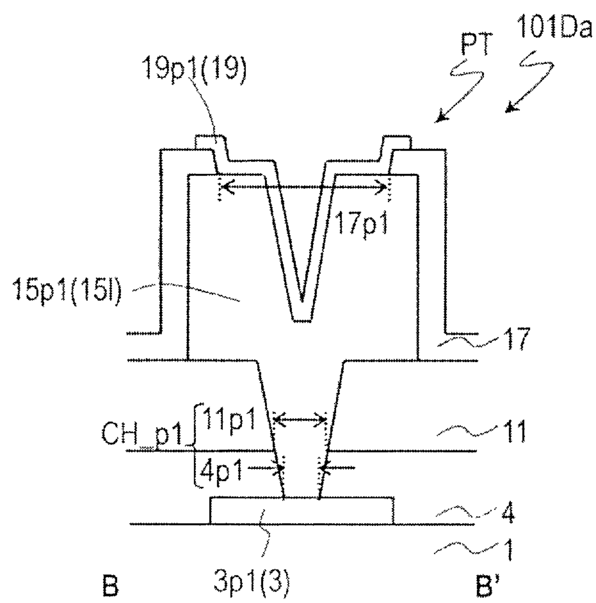
FIG. 40 is a schematic cross-sectional view of the TFT substrate 101Da.

FIG. 40 is a schematic cross-sectional view of the TFT substrate 101Da. FIG. 40 illustrates a cross section of the transfer section PT corresponding to line B-B' in FIG. 39 B.

As illustrated in FIG. 39B and FIG. 40, the TFT substrate 101Da differs from the TFT substrate 101D in the structure of the transfer section PT. The transfer section PT of the TFT substrate 101Da differs, from the transfer section PT of the TFT substrate 101D, in not including the first conductive portion 13*p*1 included in the lower connection layer 13. The transfer section PT of the TFT substrate 101Da has the same structure as the transfer section PT of the TFT substrate 101A according to Embodiment 1-1.

The TFT substrate 101Da does not include the lower connection layer 13.

In the TFT substrate 101Da having such a structure also, the same effect as in the TFT substrate 101D can be obtained.

Manufacturing Method of TFT Substrate 101Da

A method for manufacturing the TFT substrate 101Da according to the modification example of Embodiment 2-1 will be described with reference to FIGS. 41A and 41B. According to the manufacturing method described below, the TFT substrate 101Da improved in reliability is obtained while suppressing an increase in manufacturing cost (for example, the number of photomasks). Differences from the TFT substrate 101D will be mainly described.

Figure 41A:
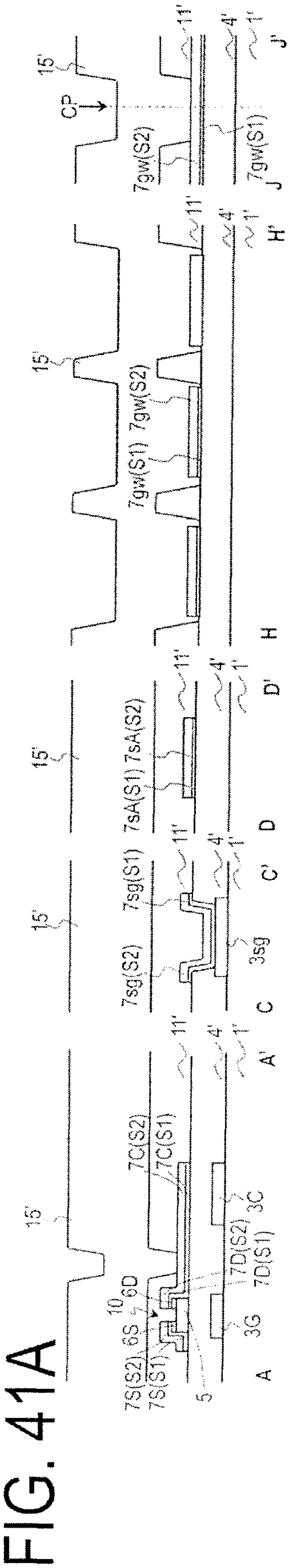
FIGS. 41A and 41B are schematic cross-sectional views for describing a method for manufacturing the TFT substrate 101Da.
Figure 41B:
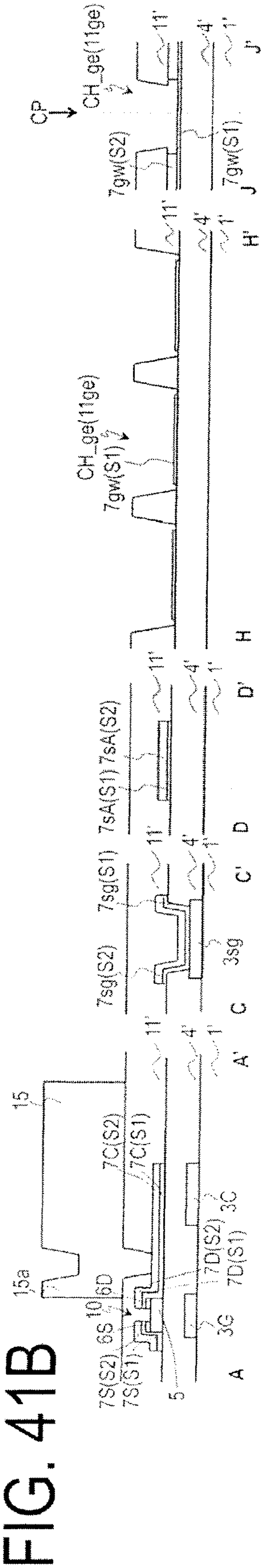

FIGS. 41A and 41B are schematic cross-sectional views for describing the method for manufacturing the TFT substrate 101Da. These figures illustrate a cross section taken along a line A-A' illustrated in FIG. 39A, a cross section taken along a line C-C' illustrated in FIG. 39B, a cross section taken along a line D-D' illustrated in FIG. 39C, a cross section taken along a line H-H' illustrated in FIG. 39C, and a cross section taken along a line J-J' in FIG. 39C.

First, similar to the way described with reference to FIGS. 35A to 35C and FIG. 36A, formed on the mother glass substrate 1' are the gate metal layer 3, the gate insulating film 4', the semiconductor layer 5, the contact layer 6, the source metal layer 7, and the first insulating film 11'.

Next, as illustrated in FIG. 41A, the patch conductive film 15' is formed on the first insulating film 11' and within the contact hole CH_ge. The patch conductive film 15' is in contact with the second conductive layer S2 of the wiring line section 7*gw* within the opening 11*ge*.

Next, as illustrated in FIG. 41B, the patch conductive film 15' is patterned to obtain the patch metal layer 151. At this time, the second conductive layer S2 of the wiring line section 7*gw* exposed from the gate insulating film 4' within the opening 11*ge* is also patterned and removed. The second conductive layer S2 present at least on the cutting position CP is removed. The second conductive layer S2 and the patch conductive film 15' can be patterned using the same photomask. For example, in a case that a layer (MoN/Al) formed by layering an Al layer and a MoN layer in this order is used as the second conductive layer S2 of the source metal layer 7, a layered film (MoN/Al/MoN) is preferably used, as the patch conductive film 15', which is formed by layering a MoN layer (having a thickness of 50 nm, for example), an Al layer (having a thickness of 1000 nm, for example), and a MoN layer (having a thickness of 50 nm, for example) in this order. In this case, since the second conductive layer S2 (MoN/Al) includes the same material as the patch conductive film 15' (MoN/Al/MoN), the same etchant can be used without problems.

By performing the above processes, when the mother TFT substrate 100Da is cut along the cutting line CP at the end of the manufacturing process, the second conductive layer S2 is not exposed on the cutting surface. In addition, since the removal of the second conductive layer L2 is performed in the same process as the patterning of the patch conductive film 15', the TFT substrate improved in reliability is obtained while suppressing an increase in manufacturing cost (for example, the number of photomasks).

After that, the TFT substrate 101Da can be fabricated by performing the same process as the manufacturing method of the TFT substrate 101D described with reference to FIG. 37C and FIGS. 38A to 38C.

Embodiment 2-2

A structure of a TFT substrate 101E according to Embodiment 2-2 of the disclosure will be described with reference to FIGS. 42A to 420 and FIGS. 43A to 43D. Differences from the TFT substrate 101Da according to the modification example of Embodiment 2-1 will be mainly described.

Figures 42A, 42B, 42C:
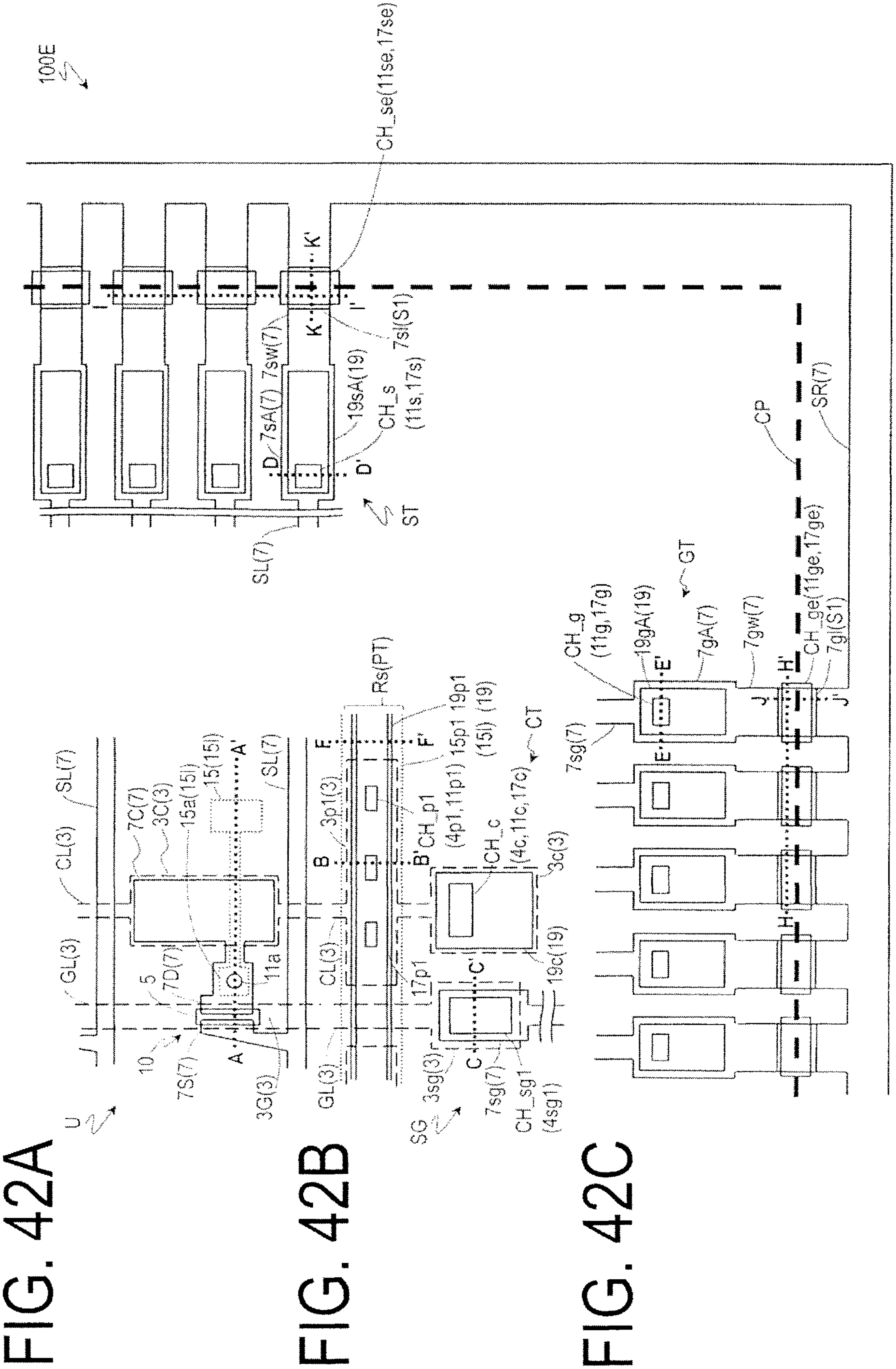
FIGS. 42A to 42C are plan views schematically illustrating a mother TFT substrate 100E used to fabricate a TFT substrate 101E.

FIGS. 42A to 42C are plan views schematically illustrating a mother TFT substrate 100E used to fabricate the TFT substrate 101E. Referring to FIGS. 42A to 42C, a structure and manufacturing method of the TFT substrate 101E will be described. The TFT substrate 101E is obtained by cutting (dividing) the mother TFT substrate 100E along the cutting line CP. In other words, the mother TFT substrate 100E includes a mother dielectric substrate (e.g., a mother glass substrate) and components of the TFT substrate 101E supported on the mother dielectric substrate. An edge of the dielectric substrate 1 and an edge of the TFT substrate 101E are defined by the cutting line CP.

FIG. 42A illustrates the antenna unit region U in the transmission and/or reception region R1, FIG. 42B illustrates the transfer section PT, the CS terminal section CT, and the source-gate connection section SG provided in the non-transmission and/or reception region R2. FIG. 42C illustrates the gate terminal section GT and the source terminal section ST provided in the non-transmission and/or reception region R2.

Figure 43A:
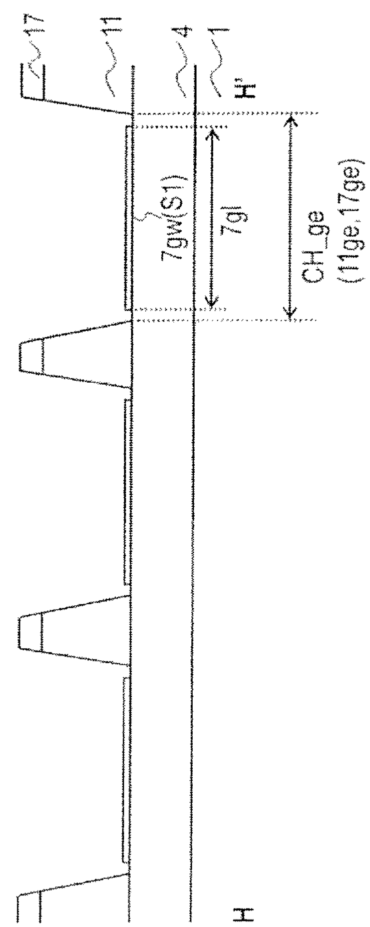
FIGS. 43A and 43C are schematic cross-sectional views of the TFT substrate 101E and FIGS. 43B and 43D are schematic cross-sectional views of the mother TFT substrate 100E.
Figure 43B:
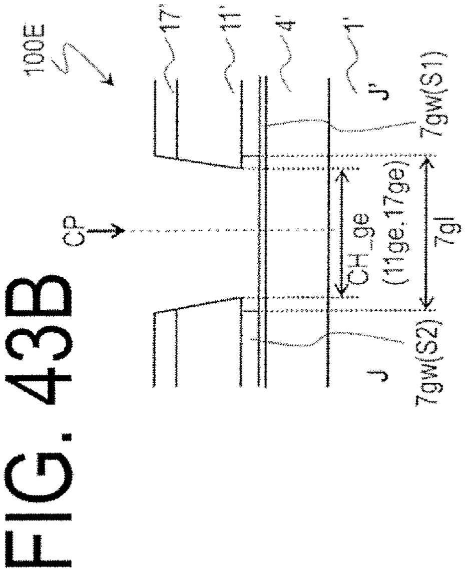
Figure 43C:
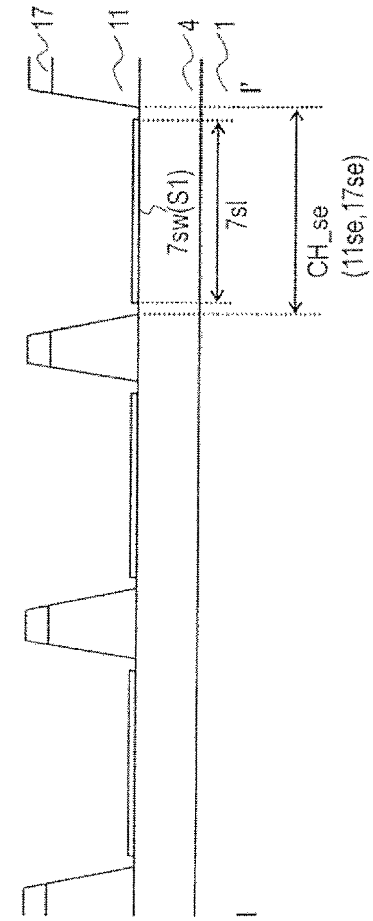
Figure 43D:
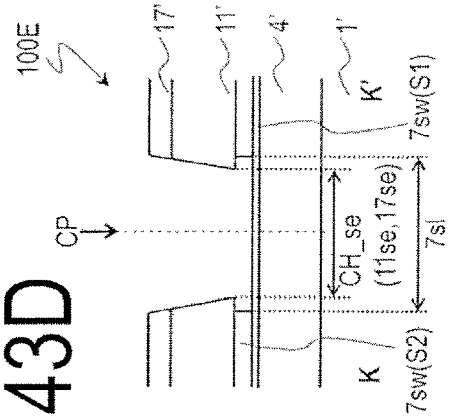

FIGS. 43A and 43C are schematic cross-sectional views of the TFT substrate 101E. FIG. 43A illustrates a cross section near the cutting line CP corresponding to a line H-H' in FIG. 42C, and FIG. 43C illustrates a cross section near the cutting line CP corresponding to line I-I' in FIG. 42C. FIGS. 43B and 43D are schematic cross-sectional views of the mother TFT substrate 100E. FIG. 43B illustrates a cross section near the cutting line CP along a line J-J' in FIG. 42C, and FIG. 43D illustrates a cross section near the cutting line CP along a line K-K' in FIG. 42C.

As illustrated in FIG. 42D and FIGS. 43A to 43D, the TFT substrate 101E differs from the TFT substrate 101Da in the structure of the contact hole CH_ge that at least reaches the first region 7g1 of the wiring line section 7gw included in the gate terminal section GT. In the TFT substrate 101Da, the opening 11ge formed in the first insulating layer 11 constitutes the contact hole CH_ge, and the contact hole CH_ge is covered by the second insulating layer 17. In contrast, in the TFT substrate 101E, the contact hole CH_ge is constituted by the opening 11ge formed in the first insulating layer 11 and the opening 17ge formed in the second insulating layer 17.

As for the source terminal section ST similarly, in the TFT substrate 101Da, the opening 11se formed in the first insulating layer 11 constitutes the contact hole CH_se, and the contact hole CH_se is covered by the second insulating layer 17. In contrast, in the TFT substrate 101E, the contact hole CH_se is constituted by the opening 11se formed in the first insulating layer 11 and the opening 17se formed in the second insulating layer 17.

According to the TFT substrate 101E having such a structure also, the same effect as in the preceding embodiments can be obtained. As illustrated in FIG. 42D and FIGS. 43A to 43D, the cutting line CP is located over the first region 7g1 of the wiring line section 7gw and the first region 7s1 of the wiring line section 7sw. When cutting the wiring line section 7gw, the first region 7g1 of the wiring line section 7gw is cut, and when cutting the wiring line section 7sw, the first region 7s1 of the wiring line section 7sw is cut. The second conductive layer S2 is not formed on the cutting line CP. Thus, the second conductive layer S2 is not exposed on the cutting surface, similar to the cross-sections illustrated in FIGS. 43A and 43C. This suppresses the occurrence of such problems that the connection sections connected to different gate bus lines or different source bus lines are shorted. The TFT substrate 1015 is excellent in reliability.

Further, the first insulating layer 11 having the opening 11ge allows the TFT substrate 101E improved in reliability to be obtained while suppressing an increase in manufacturing cost (for example, the number of photomasks), as is described later in the method for manufacturing the TFT substrate 101E.

Manufacturing Method of TFT Substrate 101E

The method for manufacturing the TFT substrate 101E will be described with reference to FIGS. 44 to 46C.

FIG. 44, FIGS. 45A to 45C, and FIGS. 46A to 46C are schematic cross-sectional views for describing the method for manufacturing the TFT substrate 101E.

These figures illustrate a cross section taken along a line A-A' illustrated in FIG. 42A, a cross section taken along a line C-C' illustrated in FIG. 42B, a cross section taken along a line D-D' illustrated in FIG. 42C, a cross section taken along a line H-H' illustrated in FIG. 42C, and a cross section taken along a line J-J' in FIG. 42C. Differences from the TFT substrate 101Da according to the modification example of Embodiment 2-1 will be mainly described.

First, similar to the way described with reference to FIGS. 35A to 35C, formed on the mother glass substrate 1' are the gate metal layer 3, the gate insulating film 4', the semiconductor layer 5, the contact layer 6, the source metal layer 7, and the first insulating film 11'.

Figure 44:
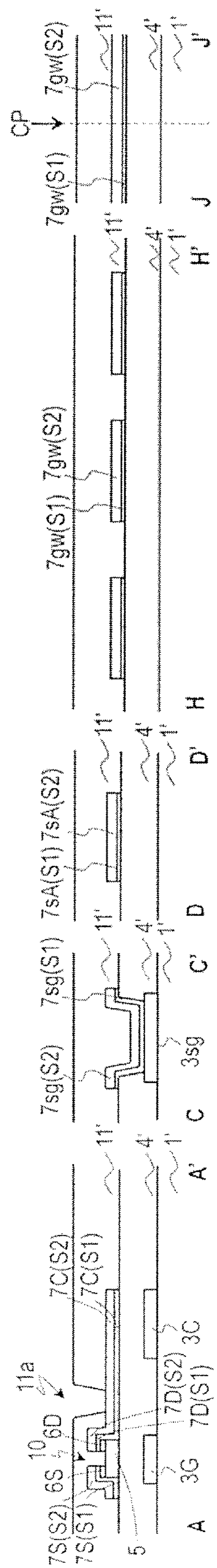
FIG. 44 is a schematic cross-sectional view for describing a method for manufacturing the TFT substrate 101E.

Next, as illustrated in FIG. 44, the first insulating film 11' and the gate insulating film 4' are etched to form an opening in the first insulating film 11' and gate insulating film 4'. At this time, a difference from the TFT substrate 101Da is in that the opening at least reaching the wiring line section 7gw is not formed in the first insulating film 11'.

Figures 45A, 45B, 45C:
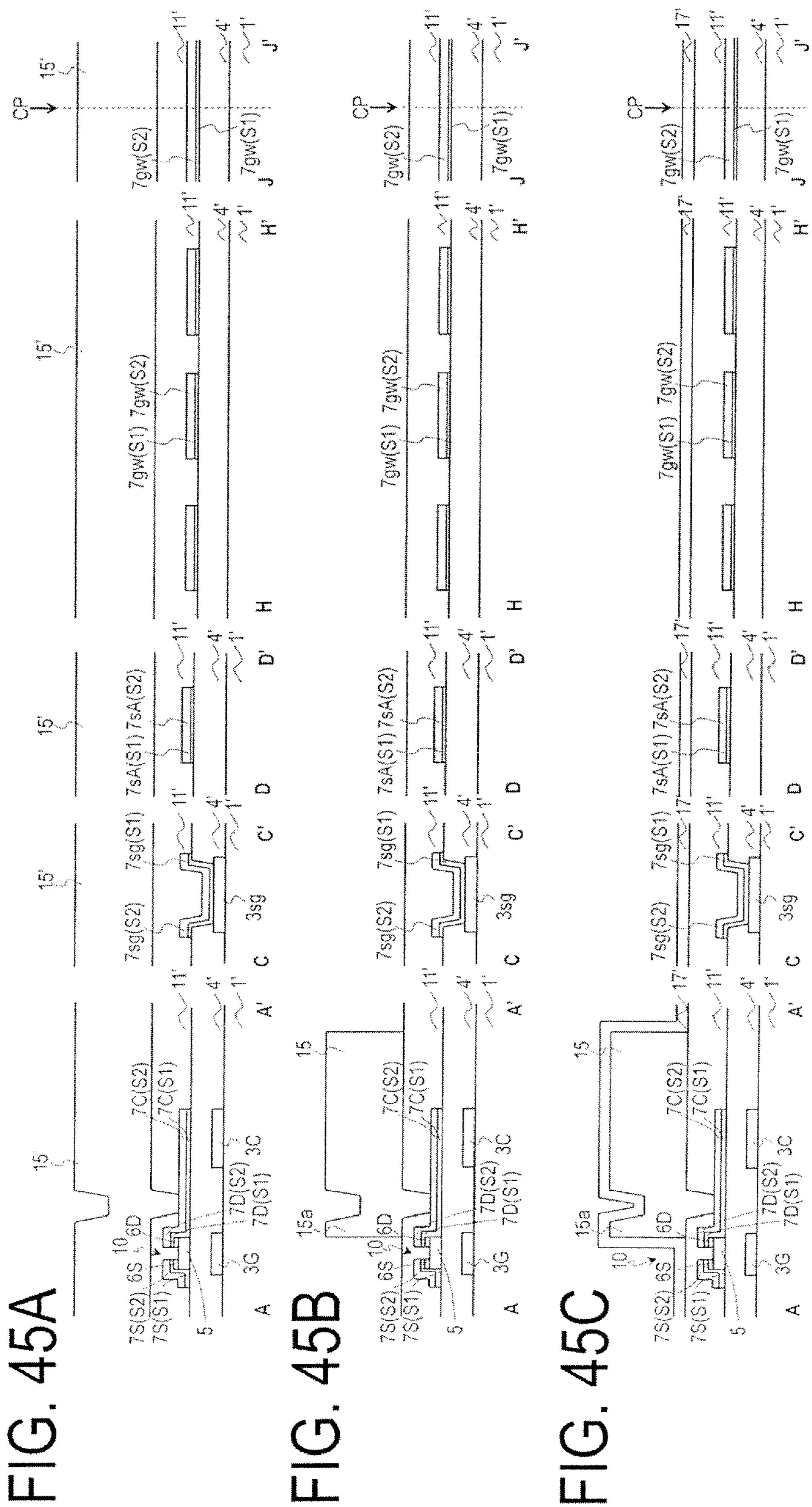
FIGS. 45A to 45C are schematic cross-sectional views for describing the method for manufacturing the TFT substrate 101E.

Subsequently, as illustrated in FIG. 45A, the patch conductive film 15' is formed on the first insulating film 11'.

Next, as illustrated in FIG. 45B, the patch conductive film 15' is patterned to obtain the patch metal layer 151.

Next, as illustrated in FIG. 45C, the second insulating film 17' is formed on the patch metal layer 151, on the lower connection layer 13, and on the first insulating film 11'.

Figure 46A:
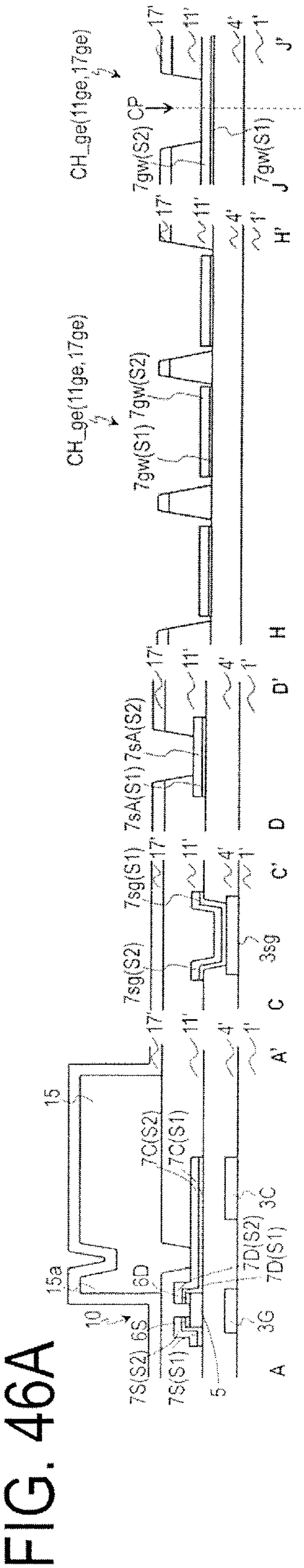
FIGS. 46A to 46C are schematic cross-sectional views for describing the method for manufacturing the TFT substrate 101E.

Subsequently, as illustrated in FIG. 46A, the second insulating film 17', the first insulating film 11', and the gate insulating film 4' are etched to form an opening in the second insulating film 17', the first insulating film 11', and the gate insulating film 4'. At this time, the contact hole CH_ge at least reaching the wiring line section 7gw is formed in the second insulating film 17' and in the first insulating film 11'. The second insulating film 17' and the first insulating film 11' are collectively etched, for example, to form the contact hole CH_ge. The contact hole CH_ge includes the opening 11*ge* that is formed in the first insulating layer 11 and at least reaches the wiring line section 3*gw*, and the opening 17*ge* that is formed in the second insulating layer 17 and overlaps the opening 11*ge*. A side surface of the opening 11*ge* and a side surface of the opening 17*ge* may be aligned on a side surface of the contact hole CH_ge. The openings 11*ge* is formed to cover at least a portion of the wiring line section 7*gw* that is present on the cutting line CP when viewed from the normal direction of the mother glass substrate 1'. Here, the second insulating film 17', the first insulating film 11', and the gate insulating film 4' are etched by dry etching using a fluorine gas.

Figure 46B:
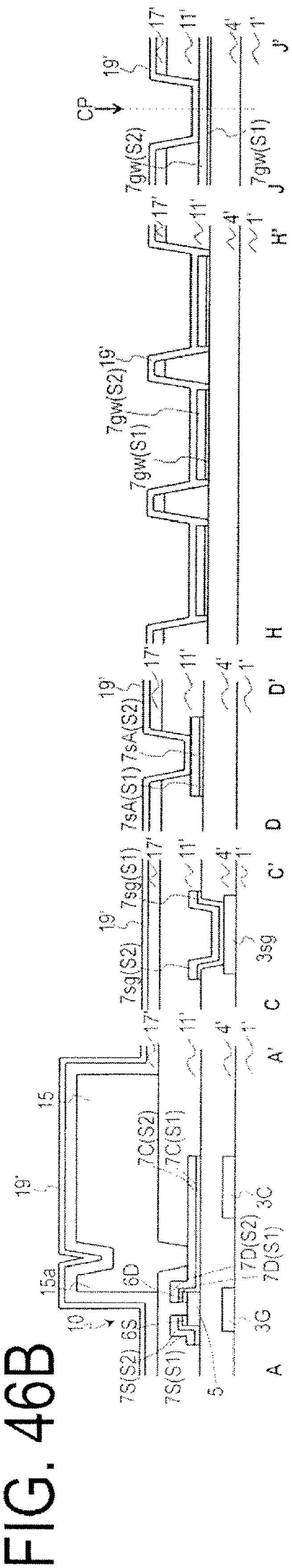

Next, as illustrated in FIG. 46B, the upper connection conductive film 19' is formed on the second insulating film 17', within the contact hole CH_s, within the contact hole CH_g, within the contact hole CH_c, within the opening 17*p*1, and within the contact hole CH_ge. The upper connection conductive film 19' is in contact with the second conductive layer S2 of the wiring line section 7*gw* within the opening 11*ge*.

Figure 46C:
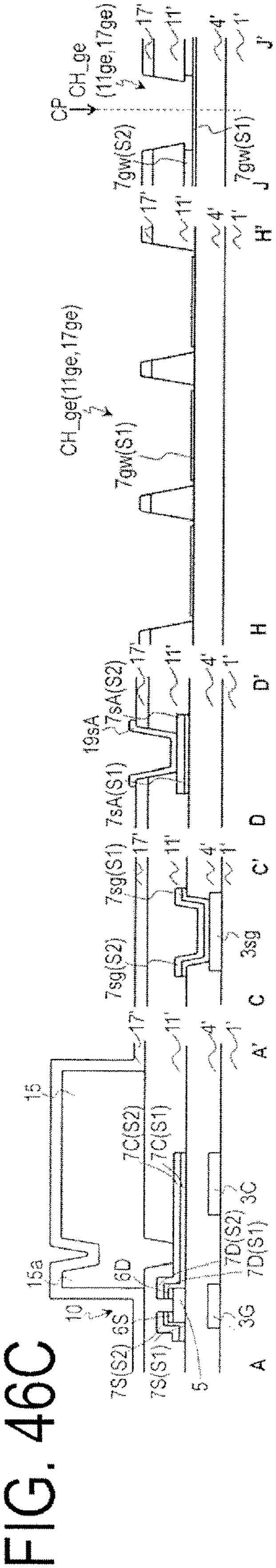

Next, as illustrated in FIG. 46C, the upper connection conductive film 19' is patterned to obtain the upper connection layer 19. At this time, the second conductive layer S2 of the wiring line section 7*gw* exposed from the first insulating film 11' within the opening 11*ge* is also patterned and removed. The second conductive layer S2 present at least on the cutting position CP is removed. The second conductive layer S2 and the upper connection conductive film 19' can be patterned using the same photomask. For example, in the case that a layer (MoN/Al) formed by layering an Al layer and a MoN layer in this order is used as the second conductive layer S2 of the source metal layer 7, the upper connection conductive film 19' (for example, an ITO film) is patterned using oxalic acid to anneal the resulting upper connection layer 19, and thereafter, the second conductive layer S2 can be patterned by wet etching using an aqueous solution containing phosphoric acid, nitric acid, and acetic acid.

This allows the mother TFT substrate 100E to be obtained.

After that, the TFT substrate 101E is obtained by cutting the mother TFT substrate 100E along the cutting line CP. At this time, since the cutting line CP does not cut the second conductive layer S2 of the source metal layer 7, the low resistance metal layer is not exposed at the cutting surface. Accordingly, the occurrence of the problem that adjacent wiring line sections are shorted can be suppressed. In addition, since the removal of the second conductive layer S2 is performed in the same process as the patterning of the upper connection conductive film 19', the TFT substrate improved in reliability is obtained while suppressing an increase in manufacturing cost (for example, the number of photomasks).

Table 1 provides examples of a layer configuration and etchant applied to the method for manufacturing the TFT substrate of each embodiment illustrated herein. Table 1 illustrates the examples in which the second conductive layer of the conductive layer including the wiring line sections of the gate terminal section GT and the source terminal section ST has a structure (MoN/Al) in which an Al layer and a MoN layer are layered in this order. However, Table 1 illustrates merely the examples, and the layer configuration and the etchant are not limited to the examples in Table 1, and may be changed as appropriate.

TABLE 1

| | | Wiring line sections of gate terminal section GT/source terminal section ST | | | | Source-gate connection section SG | | Gate terminal section GT/source terminal section ST | |
|---|---|---|---|---|---|---|---|---|---|
| | | Layer including wiring line section | Contact hole CH_ge/CH_se at least reaching wiring line section | Process of removing second conductive layer of wiring line section | First region of wiring line section | Contact hole CH sgl at least reaching source lower connection wiring line 3sg | Layer remaining in contact hole CH sgl in process of removing second conductive layer of wiring line section | Contact hole CH_g/CH_s at least reaching lower connection section | Layer remaining in contact hole CH_g/CH_s in process of removing second conductive layer of wiring line section |
| Embodiment 1-1 | Layer | Gate metal layer 3 | Gate insulating layer 4 | Process of patterning source conductive film 7' | First conductive layer L1 of gate metal layer 3 | First insulating layer 11/gate insulating layer 4 | None | Second insulating layer 17/first insulating layer 11/gate insulating layer 4 | None |
| | Layer configuration | MoN/Al/Ti | SiN | MoN/Al/MoN | Ti | SiN/SiN | — | SiN/SiN/SiN | — |
| | Etching (etchant) | — | Fluorine gas-based dry etching | Acetic acid/nitric acid/phosphoric acid | — | Fluorine gas-based dry etching | — | Fluorine gas-based dry etching | — |
| Modification example of embodiment 1-1 | Layer | Gate metal layer 3 | Gate insulating layer 4 | Process of patterning source coductive film 7' | First conductive layer L1 of gate metal layer 3 | Gate insulating layer 4 | Source metal layer 7 | Second insulating layer 17/first insulating layer 11/gate insulating layer 4 | None |
| | Layer configuration | MoN/Al/Ti | SiN | MoN/Al/MoN | Ti | SiN | MoN/Al/MoN | SiN/SiN/SiN | — |

TABLE 1-continued

| | | Wiring line sections of gate terminal section GT/source terminal section ST | | | | Source-gate connection section SG | | Gate terminal section GT/source terminal section ST | |
|---|---|---|---|---|---|---|---|---|---|
| | | Layer including wiring line section | Contact hole CH_ge/CH_se at least reaching wiring line section | Process of removing second conductive layer of wiring line section | First region of wiring line section | Contact hole CH sgl at least reaching source lower connection wiring line 3sg | Layer remaining in contact hole CH sgl in process of removing second conductive layer of wiring line section | Contact hole CH_g/CH_s at least reaching lower connection section | Layer remaining in contact hole CH_g/CH_s in process of removing second conductive layer of wiring line section |
| | Etching (etchant) | — | Fluorine gas-based dry etching | Acetic acid/nitric acid/phosphoric acid | — | Fluorine gas-based dry etching | Acetic acid/nitric acid/phosphoric acid | Fluorine gas-based dry etching | — |
| First manufacturing method in embodiment 1-2 | Layer | Gate metal layer 3 | First insulating layer 11/gate insulating layer 4 | Process of patterning lower conductive film 13' | First conductive layer L1 of gate metal layer 3 | First insulating layer 11/gate insulating layer 4 | Lower conductive layer 13 | Second insulating layer 17/first insulating layer 11/gate insulating layer 4 | None |
| | Layer configuration | MoN/Al/Ti | SiN/SiN | ITO | Ti | SiN/SiN | ITO | SiN/SiN/SiN | — |
| | Etching (etchant) | — | Fluoring gas-based dry etching | Oxalic acid + annealing + acetic acid/nitric acid/phosphoric acid | — | Fluorine gas-based dry etching | Oxalic acid + annealing + acetic acid/nitric acid/phosphoric acid | Fluorine gas-based dry etching | — |
| Second manufacturing method in embodiment 1-2 | Layer | Gate metal layer 3 | First insulating layer 11/gate insulating layer 4 | Process of patterning patch conductive film 15' | First conductive layer L1 of gate metal layer 3 | First insulating layer 11/gate insulating layer 4 | Lower conductive layer 13 | Second insulating layer 17/first insulating layer 11/gate insulating layer 4 | None |
| | Layer configuration | MoN/Al/Ti | SiN/SiN | MoN/Al/MoN | Ti | SiN/SiN | ITO | SiN/SiN/SiN | — |
| | Etching (etchant) | — | Fluorine gas-based dry etching | Acetic acid/nitric acid/phosphoric acid | — | Fluorine gas-based dry etching | Oxalic acid | Fluorine gas-based dry etching | — |
| Embodiment 1-3 | Layer | Gate metal layer 3 | Second insulating layer 17/first insulating layer 11/gate isulating layer 4 | Process of patterning upper conductive film 19' | First conductive layer L1 of gate metal layer 3 | First insulating layer 11/gate insulating layer 4 | Second insulating layer 17/lower conductive layer 13 | Second insulating layer 17/first insulating layer 11/gate insulating layer 4 | Upper conductive layer 19 |
| | Layer configuration | MoN/Al/Ti | SiN/SiN/SiN | ITO | Ti | SiN/SiN | SiN/ITO | SiN/SiN/SiN | ITO |
| | Etching (etchant) | — | Fluorine gas-based dry etching | Oxalic acid + annealing + acetic acid/nitric acid/phosphoric acid | — | Fluorine gas-based dry etching | — | Fluorine gas-based dry etching | Oxalic acid annealing + acetic acid/nitric acid/phosphoric acid |
| Embodiment 2-1 | Layer | Source metal layer 7 | First insulating layer 11 | Process of patterning lower conductive film 13' | First conductive layer S1 of source metal layer 7 | Gate insulating layer 4 | First insulating layer 11/source metal layer 7 | Second insulating layer 17/first insulating layer 11 | None |
| | Layer configuration | MoN/Al/Ti | SiN | ITO | Ti | SiN | SiN/MoN/Al/Ti | SiN/SiN | — |
| | Etching (etchant) | — | Fluorine gas-based dry etching | Oxalic acid + annealing + acetic acid/nitric acid/phosphoric acid | — | Fluorine gas-based dry etching | — | Fluorine gas-based dry etching | — |

TABLE 1-continued

| | | Wiring line sections of gate terminal section GT/source terminal section ST | | | | Source-gate connection section SG | | Gate terminal section GT/source terminal section ST | |
|---|---|---|---|---|---|---|---|---|---|
| | | Layer including wiring line section | Contact hole CH_ge/CH_se at least reaching wiring line section | Process of removing second conductive layer of wiring line section | First region of wiring line section | Contact hole CH sgl at least reaching source lower connection wiring line 3sg | Layer remaining in contact hole CH sgl in process of removing second conductive layer of wiring line section | Contact hole CH_g/CH_s at least reaching lower connection section | Layer remaining in contact hole CH_g/CH_s in process of removing second conductive layer of wiring line section |
| Modification example of embodiment 2-1 | Layer | Source metal layer 7 | First insulating layer 11 | Process of patterning patch conductive film 15' | First conductive layer S1 of source metal layer 7 | Gate insulating layer 4 | First insulating layer 11/source metal layer 7 | Second insulating layer 17/first insulating layer 11 | None |
| | Layer configuration | MoN/Al/Ti | SiN | MoN/Al/MoN | Ti | SiN | SiN/MoN/Al/Ti | SiN/SiN | — |
| | Etching (etchant) | — | Fluorine gas-based dry etching | Acetic acid/nitric acid/phosphoric acid | — | Fluorine gas-based dry etching | — | Fluorine gas-based dry etching | — |
| Embodiment 2-2 | Layer | Source metal layer 7 | Second insulating layer 17/first insulating layer 11 | Process of patterning upper conductive film 19' | First conductive layer S1 of source metal layer 7 | Gate insulating layer 4 | First insulating layer 11/source metal layer 7 | Second insulating layer 17/first insulating layer 11 | None |
| | Layer configuration | MoN/Al/Ti | SiN/SiN | ITO | Ti | SiN | SiN/MoN/Al/Ti | SiN/SiN | — |
| | Etching (etchant) | — | Fluorine gas-based dry etching | Oxalic acid + annealing + acetic acid/nitric acid/phosphoric acid | — | Fluorine gas-based dry etching | — | Fluorine gas-based dry etching | — |

The disclosure is not limited to the embodiments illustrated herein. In the illustrated embodiments, the source terminal section ST has the structure similar to the gate terminal section GT. The lower connection section of the gate terminal section GT and the lower connection section of the source terminal section ST are included in the same conductive layer. Furthermore, in the illustrated mother TFT substrate, the lower connection section of the gate terminal section GT and the lower connection section of the source terminal section ST are electrically connected to the same short circuit wiring line. The disclosure is not limited to the configuration described above, and the lower connection section of the gate terminal section GT and the lower connection section of the source terminal section ST may be included in the conductive layers different from each other, for example. Alternatively, the lower connection section of the gate terminal section GT and the lower connection section of the source terminal section ST may be electrically connected to the short circuit wiring lines different from each other. The structure of each antenna unit region of the TFT substrate is not limited to that illustrated, and may be changed as appropriate. For example, in the illustrated example, the patch electrode is formed of the conductive film different from the gate electrode and the source electrode of the TFT, but the patch electrode may be formed of the same conductive film as the gate electrode or the source electrode of the TFT.

Material and Structure of TFT 10

In the embodiments illustrated, a TFT including a semiconductor layer 5 as an active layer is used as a switching element disposed in each pixel. The semiconductor layer 5 is not limited to an amorphous silicon layer, and may be a polysilicon layer or an oxide semiconductor layer.

In a case where an oxide semiconductor layer is used, the oxide semiconductor included in the oxide semiconductor layer may be an amorphous oxide semiconductor or a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer may have a layered structure including two or more layers. In a case where the oxide semiconductor layer includes a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. In a case where the oxide semiconductor layer has a dual-layer structure including an upper layer and a lower layer, an energy gap of the oxide semiconductor included in the upper layer is preferably greater than an energy gap of the oxide semiconductor included in the lower layer. However, when a difference in the energy gap between these layers is relatively small, the energy gap of the oxide semiconductor in the lower layer may be greater than the energy gap of the oxide semiconductor in the upper layer.

Materials, structures, and film formation methods of an amorphous oxide semiconductor and the above-described crystalline oxide semiconductors, a configuration of an oxide semiconductor layer including a layered structure, and the like are described in, for example, JP 2014-007399 A. The entire contents of the disclosure of JP 2014-007399 A are incorporated herein as reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2. Such an oxide semiconductor layer can be formed of an oxide semiconductor film including an In—Ga—Zn—O-based semiconductor.

The In—Ga—Zn—O based semiconductor may be an amorphous semiconductor, or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein as reference. Since a TFT including an In—Ga—Zn—O based semiconductor layer has high mobility (more than 20 times in comparison with a-Si TFTs) and low leakage current (less than 1/100th in comparison with a-Si TFTs), such a TFT can suitably be used as a driving TFT (for example, a TFT included in a driving circuit provided in the non-transmission and/or reception region) and a TFT provided in each antenna unit region.

In place of the In—Ga—Zn—O based semiconductor, the oxide semiconductor layer may include another oxide semiconductor. For example, the oxide semiconductor layer may include an In—Sn—Zn—O based semiconductor (for example, In2O3-SnO2-ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, or a Ga—Zn—O based semiconductor.

In the example illustrated, the TFT 10 is a channel etch type TFT having a bottom gate structure. The "channel etch type TFT" does not include an etch stop layer formed on the channel region, and a lower face of an end portion of each of the source and drain electrodes, which is closer to the channel, is provided so as to be in contact with an upper face of the semiconductor layer. The channel etch type TFT is formed by, for example, forming a conductive film for a source/drain electrode on a semiconductor layer and performing source/drain separation. In the source/drain separation process, the surface portion of the channel region may be etched.

Note that the TFT 10 may be an etch stop type TFT in which an etch stop layer is formed on the channel region. In the etch stop type TFT, the lower face of an end portion of each of the source and drain electrodes, which is closer to the channel, is located, for example, on the etch stop layer. The etch stop type TFT is formed as follows; after forming an etch stop layer covering the portion that will become the channel region in a semiconductor layer, for example, a conductive film for the source and drain electrodes is formed on the semiconductor layer and the etch stop layer, and source/drain separation is performed.

In addition, although the TFT 10 has a top contact structure in which the source and drain electrodes are in contact with the upper face of the semiconductor layer, the source and drain electrodes may be disposed to be in contact with the lower face of the semiconductor layer (a bottom contact structure). Furthermore, the TFT 10 may have a bottom gate structure having a gate electrode on the dielectric substrate side of the semiconductor layer, or a top gate structure having a gate electrode above the semiconductor layer.

The embodiments according to the disclosure are applied to scanning antennas for satellite communication or satellite broadcasting that are mounted on mobile bodies (ships, aircraft, and automobiles, for example) or to the manufacture thereof.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A TFT substrate including a transmission and/or reception region and a non-transmission and/or reception region other than the transmission and/or reception region, the transmission and/or reception region including a plurality of antenna unit regions, the TFT substrate comprising:

a dielectric substrate;

the plurality of antenna unit regions, a plurality of gate bus lines, and a plurality of source bus lines supported on the dielectric substrate, each of the plurality of antenna unit regions including a TFT and a patch electrode electrically connected to a drain electrode of the TFT;

a first conductive layer including one of a gate electrode or a source electrode of the TFT;

a first insulating layer on the first conductive layer; and a plurality of terminal sections provided in the non-transmission and/or reception region, each of the plurality of terminal sections including a lower connection section electrically connected to any of the plurality of gate bus lines and the plurality of source bus lines, the lower connection section being included in the first conductive layer, and a wiring line section extending from the lower connection section and at least reaching an edge of the dielectric substrate when viewed from a normal direction of the dielectric substrate, wherein the first conductive layer includes a lower conductive layer containing at least one selected from a group consisting of Ti, Ta, W, MoNb, Nb, Ni, In—Sn—O based oxide, In—Zn—O based oxide, and In—Ga—Zn—O based oxide, and an upper conductive layer disposed on the lower conductive layer and containing at least one element selected from a group consisting of Cu, Al, Ag, and Au, the wiring line section includes a first region including a first edge side conforming to the edge of the dielectric substrate when viewed from the normal direction of the dielectric substrate, the first region including the lower conductive layer and not including the upper conductive layer, and the first insulating layer includes a first notched portion overlapping at least a portion of the first region when viewed from the normal direction of the dielectric substrate.

2. The TFT substrate according to claim 1, wherein each of the plurality of terminal sections further includes a second insulating layer on the first insulating layer, and the second insulating layer includes a second notched portion overlapping the first notched portion when viewed from the normal direction of the dielectric substrate.

3. The TFT substrate according to claim 2, wherein each of the plurality of terminal sections further includes a third insulating layer on the second insulating layer, and the third insulating layer includes a third notched portion overlapping the second notched portion when viewed from the normal direction of the dielectric substrate.

4. The TFT substrate according to claim 2, further comprising:

a second conductive layer formed between the first insulating layer and the second insulating layer, the second conductive layer including the other of the gate electrode or the source electrode of the TFT; and a third conductive layer formed on the second insulating layer, the third conductive layer including the patch electrode.

5. The TFT substrate according to claim 4, further comprising:

a fourth conductive layer formed between the second insulating layer and the third conductive layer, the fourth conductive layer including a transparent conductive layer.

6. The TFT substrate according to claim 4, wherein the upper conductive layer is formed of a material the same as the second conductive layer or the third conductive layer.

7. A manufacturing method of the TFT substrate according to claim 5, the manufacturing method comprising:

(A) forming a lower conductive film on a mother dielectric substrate, the lower conductive film containing at least one selected from the group consisting of Ti, Ta, W, MoNb, Nb, Ni, In—Sn—O based oxide, In—Zn—O based oxide, and In—Ga—Zn—O based oxide;

(B) after (A), forming an upper conductive film on the lower conductive film, the upper conductive film containing at least one element selected from the group consisting of Cu, Al, Ag, and Au;

a step (C) after (B), patterning the lower conductive film and the upper conductive film to form the lower connection sections each of which is included in each of the plurality of terminal sections, a short circuit wiring line electrically connecting the lower connection sections to each other, and a wiring formed between the lower connection sections and the short circuit wiring line;

(D) after (C), forming a first insulating film to cover at least all of the lower connection sections and a portion of the wiring;

(E) after (D), forming a first opening in the first insulating film, the first opening at least reaching the wiring;

(F) after (E), forming a second conductive film on the first insulating film and within the first opening;

(G) after (F), patterning the second conductive film and the upper conductive film to remove the upper conductive film exposed from the first insulating film within the first opening; and (H) after (G), cutting the mother dielectric substrate along a line passing through the first opening when viewed from a normal direction of the mother dielectric substrate, wherein (G) includes patterning the second conductive film to form the fourth conductive layer.

8. The TFT substrate according to claim 1, wherein each of the plurality of terminal sections further includes a second insulating layer on the first insulating layer, and the second insulating layer is formed to cover the lower conductive layer exposed from the first insulating layer within the first notched portion.

9. The TFT substrate according to claim 1, wherein the plurality of terminal sections include a gate terminal section and a source terminal section, the gate terminal section including the lower connection section electrically connected to any of the plurality of gate bus lines, the source terminal section including the lower connection section electrically connected to any of the plurality of source bus lines, and the first conductive layer includes the lower connection section of the gate terminal section and the lower connection section of the source terminal section.

10. The TFT substrate according to claim 1, wherein the first conductive layer includes the source electrode of the TFT.

11. A manufacturing method of the TFT substrate according to claim 1, the manufacturing method comprising:

(A) forming a lower conductive film on a mother dielectric substrate, the lower conductive film containing at least one selected from the group consisting of Ti, Ta, W, MoNb, Nb, Ni, In—Sn—O based oxide, In—Zn—O based oxide, and In—Ga—Zn—O based oxide;

(B) after (A), forming an upper conductive film on the lower conductive film, the upper conductive film containing at least one element selected from the group consisting of Cu, Al, Ag, and Au;

(C) after (B), patterning the lower conductive film and the upper conductive film to form the lower connection sections each of which is included in each of the plurality of terminal sections, a short circuit wiring line electrically connecting the lower connection sections to each other, and a wiring formed between the lower connection sections and the short circuit wiring line;

(D) after (C), forming a first insulating film to cover at least all of the lower connection sections and a portion of the wiring;

(E) after (D), forming a first opening in the first insulating film, the first opening at least reaching the wiring;

(F) after (E), forming a second conductive film on the first insulating film and within the first opening;

(G) after (F), patterning the second conductive film and the upper conductive film to remove the upper conductive film exposed from the first insulating film within the first opening; and (H) after (G), cutting the mother dielectric substrate along a line passing through the first opening when viewed from a normal direction of the mother dielectric substrate.

12. The manufacturing method according to claim 11, wherein (G) includes patterning the second conductive film and the upper conductive film using a same photomask.

13. The manufacturing method according to claim 11, wherein (G) includes patterning the second conductive film to form the other of the gate electrode or the source electrode of the TFT.

14. The manufacturing method according to claim 11, wherein (G) includes patterning the second conductive film to form the patch electrode.

15. The manufacturing method according to claim 11, wherein each of the plurality of terminal sections includes a second opening formed in the first insulating layer and at least reaching the lower connection section, and an upper connection section formed on the first insulating layer and within the second opening, the upper connection section being electrically connected to the lower connection section; and wherein (G) includes patterning the second conductive film to form the upper connection section.

16. A scanning antenna comprising:

the TFT substrate according to claim 1;

a slot substrate disposed to face the TFT substrate;

a liquid crystal layer provided between the TFT substrate and the slot substrate; and a reflective conductive plate disposed to face a surface of the slot substrate on a side opposite to the liquid crystal layer with a dielectric layer interposed between the reflective conductive plate and the surface, wherein the slot substrate includes another dielectric substrate and a slot electrode formed on a surface of the another dielectric substrate on a side of the liquid crystal layer, and the slot electrode includes a plurality of slots, each of the plurality of slots being arranged corresponding to the patch electrode of each of the plurality of antenna unit regions of the TFT substrate.

* * * * *